US011574923B2

(12) United States Patent
Yun et al.

(10) Patent No.: US 11,574,923 B2
(45) Date of Patent: Feb. 7, 2023

(54) THREE-DIMENSIONAL SEMICONDUCTOR DEVICE

(71) Applicant: SAMSUNG ELECTRONICS CO., LTD., Suwon-si (KR)

(72) Inventors: Jang Gn Yun, Hwaseong-si (KR); Jae Duk Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 199 days.

(21) Appl. No.: 17/152,883

(22) Filed: Jan. 20, 2021

(65) Prior Publication Data

US 2021/0143176 A1 May 13, 2021

Related U.S. Application Data

(63) Continuation of application No. 16/275,756, filed on Feb. 14, 2019, now Pat. No. 10,903,234.

(30) Foreign Application Priority Data

Jun. 5, 2018 (KR) ........................ 10-2018-0065064

(51) Int. Cl.
*H01L 27/11582* (2017.01)
*H01L 27/1157* (2017.01)
*H01L 27/11556* (2017.01)
*H01L 27/11524* (2017.01)

(52) U.S. Cl.
CPC .... *H01L 27/11582* (2013.01); *H01L 27/1157* (2013.01); *H01L 27/11524* (2013.01); *H01L 27/11556* (2013.01)

(58) Field of Classification Search
None
See application file for complete search history.

(56) References Cited

U.S. PATENT DOCUMENTS

| 8,409,977 | B2 | 4/2013 | Shim et al. |
| 9,117,923 | B2 | 8/2015 | Shim et al. |
| 9,362,298 | B2 | 6/2016 | Akutsu et al. |
| 9,711,525 | B2 | 7/2017 | Jang |
| 9,853,045 | B2 | 12/2017 | Hwang et al. |

(Continued)

FOREIGN PATENT DOCUMENTS

KR 10-2017-0142774 A 12/2017

*Primary Examiner* — Robert K Carpenter
(74) *Attorney, Agent, or Firm* — Lee IP Law, P.C.

(57) ABSTRACT

A three-dimensional semiconductor device includes a stacked structure on a lower structure, the stacked structure including a lower group including gate electrodes vertically stacked and spaced apart from each other, and an upper group including gate electrodes vertically stacked and spaced apart, the lower group and the upper group being vertically stacked, and a vertical structure passing through the stacked structure. The vertical structure may include a vertical core pattern, a vertical buffer portion therein, and a surrounding vertical semiconductor layer, the vertical structure may include a lower vertical portion passing through the lower group and an upper vertical portion passing through the upper group, an upper region of the lower vertical portion may have a width greater than that of a lower region of the upper vertical portion. The vertical buffer portion may be in the lower vertical portion and below the upper vertical portion.

20 Claims, 51 Drawing Sheets

(56) References Cited

U.S. PATENT DOCUMENTS

| | | |
|---|---|---|
| 10,903,234 B2 * | 1/2021 | Yun .................. H01L 27/11524 |
| 2013/0277731 A1 | 10/2013 | Goda et al. |
| 2017/0062454 A1 | 3/2017 | Lu et al. |
| 2017/0110473 A1 | 4/2017 | Lee |
| 2017/0236831 A1 | 8/2017 | Kim |
| 2017/0338238 A1 | 11/2017 | Zhang |
| 2017/0365616 A1 | 12/2017 | Kang et al. |
| 2018/0175050 A1 | 6/2018 | Son et al. |

* cited by examiner

THREE-DIMENSIONAL SEMICONDUCTOR DEVICE

CROSS-REFERENCE TO RELATED APPLICATIONS

This is a continuation application based on pending application Ser. No. 16/275,756, filed on Feb. 14, 2019, the entire contents of which is hereby incorporated by reference.

Korean Patent Application No. 10-2018-0065064 filed on Jun. 5, 2018 in the Korean Intellectual Property Office, and entitled "Three-Dimensional Semiconductor Device," is incorporated by reference herein in its entirety.

BACKGROUND

1. Field

Embodiments relate to a semiconductor device.

2. Description of the Related Art

A semiconductor device may include gate electrodes stacked in a direction perpendicular to a surface of a semiconductor substrate.

SUMMARY

Embodiments are directed to a three-dimensional semiconductor device, including a lower structure, a stacked structure on the lower structure, the stacked structure including a lower group including gate electrodes stacked and spaced apart from each other in a vertical direction, the vertical direction being a direction perpendicular to an upper surface of the lower structure, and an upper group including gate electrodes stacked and spaced apart from each other in the vertical direction, the lower group and the upper group being stacked in the vertical direction, and a vertical structure passing through the stacked structure. The vertical structure may include a vertical core pattern, a vertical buffer portion in the vertical core pattern, and a vertical semiconductor layer surrounding an outer side surface of the vertical core pattern, the vertical structure may include a lower vertical portion passing through the lower group and an upper vertical portion passing through the upper group, an upper region of the lower vertical portion may have a width greater than a width of a lower region of the upper vertical portion, and the vertical buffer portion may be in the lower vertical portion and below the upper vertical portion.

Embodiments are also directed to a three-dimensional semiconductor device, including a lower structure, a stacked structure on the lower structure, the stacked structure including a lower group including gate electrodes stacked and spaced apart from each other in a vertical direction, the vertical direction being a direction perpendicular to an upper surface of the lower structure, and an upper group including gate electrodes stacked and spaced apart from each other in the vertical direction, the lower group and the upper group being stacked in the vertical direction, separation structures passing through the stacked structure, a vertical structure between the separation structures and passing through the stacked structure, and a horizontal structure on the lower structure and disposed below the stacked structure, and connected to the vertical structure and the separation structures. The vertical structure may include a lower vertical portion passing through the lower group and an upper vertical portion passing through the upper group, each of the separation structures may include a lower separation portion passing through the lower group and an upper separation portion passing through the upper group, an upper region of the lower vertical portion may have a width greater than a width of a lower region of the upper vertical portion, and an upper region of the lower separation portion may have a width greater than a width of a lower region of the upper separation portion.

Embodiments are also directed to a three-dimensional semiconductor device, including a lower structure, a horizontal structure on the lower structure, a stacked structure on the horizontal structure, the stacked structure including a plurality of groups stacked in a vertical direction, each of the plurality of groups including gate electrodes stacked and spaced apart from each other in the vertical direction, the vertical direction being a direction perpendicular to an upper surface of the lower structure, separation structures passing through the stacked structure and the horizontal structure, and a vertical structure between the separation structures and passing through the stacked structure and the horizontal structure. The horizontal structure may include a lower horizontal pattern and an upper horizontal pattern on the lower horizontal pattern, and one of the lower horizontal pattern and the upper horizontal pattern may include a conductive material the same as a material of the gate electrodes, and the other may include a conductive material different from a material of the gate electrodes.

BRIEF DESCRIPTION OF THE DRAWINGS

Features will become apparent to those of skill in the art by describing in detail example embodiments with reference to the attached drawings in which.

Figure 42:
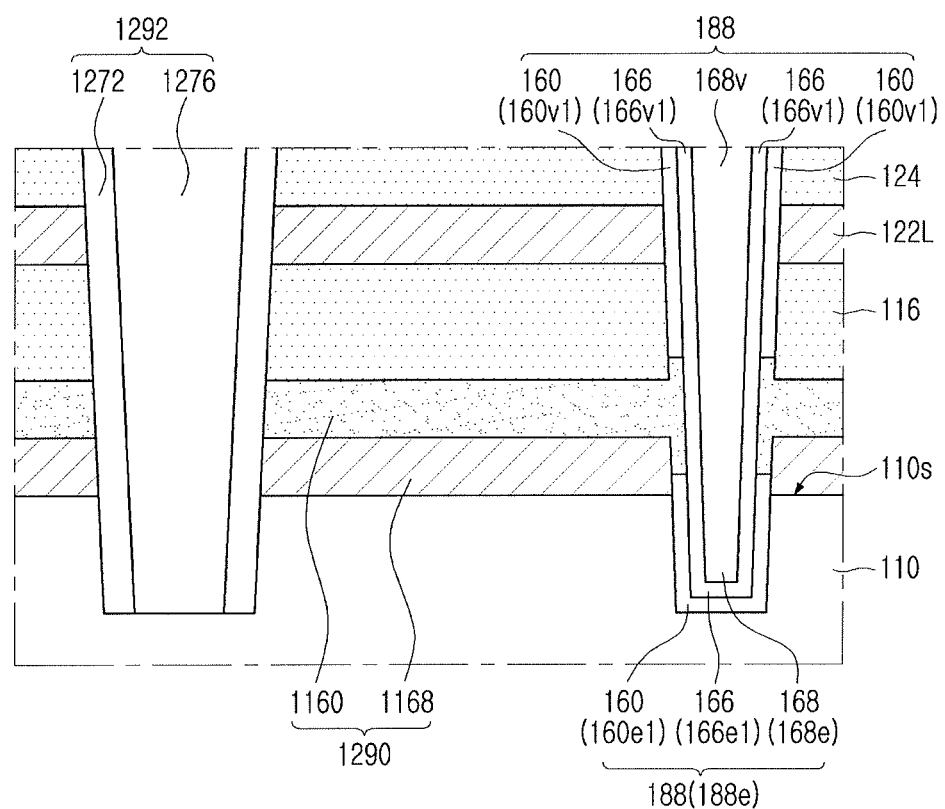
Figure 43:
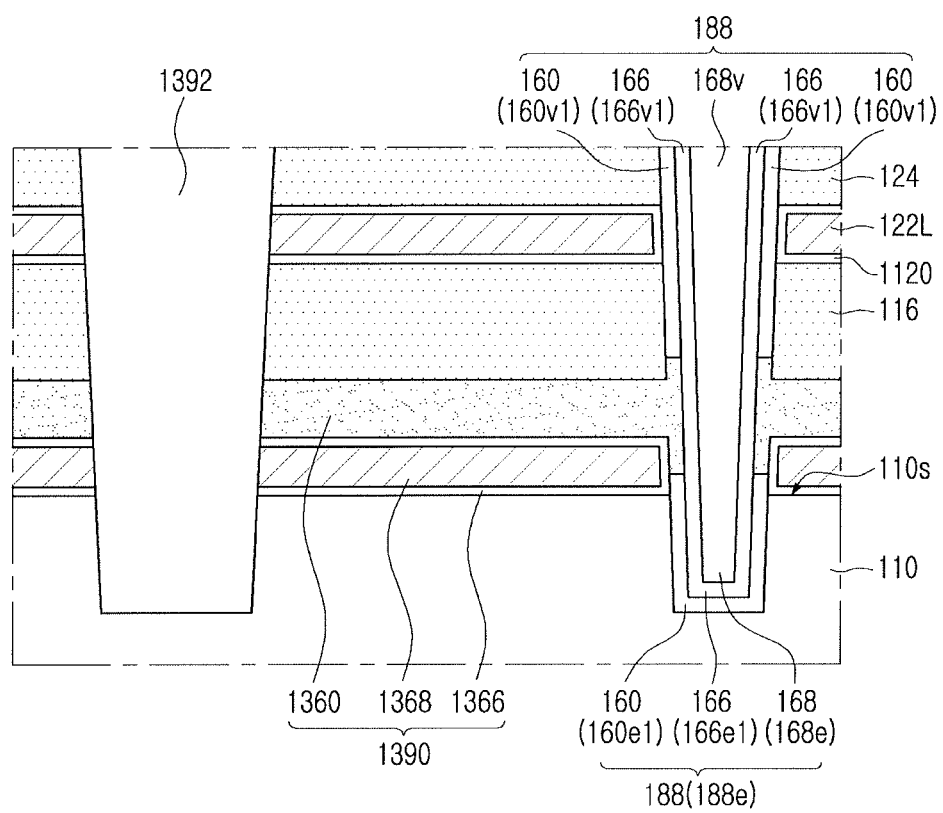
Figure 44A:
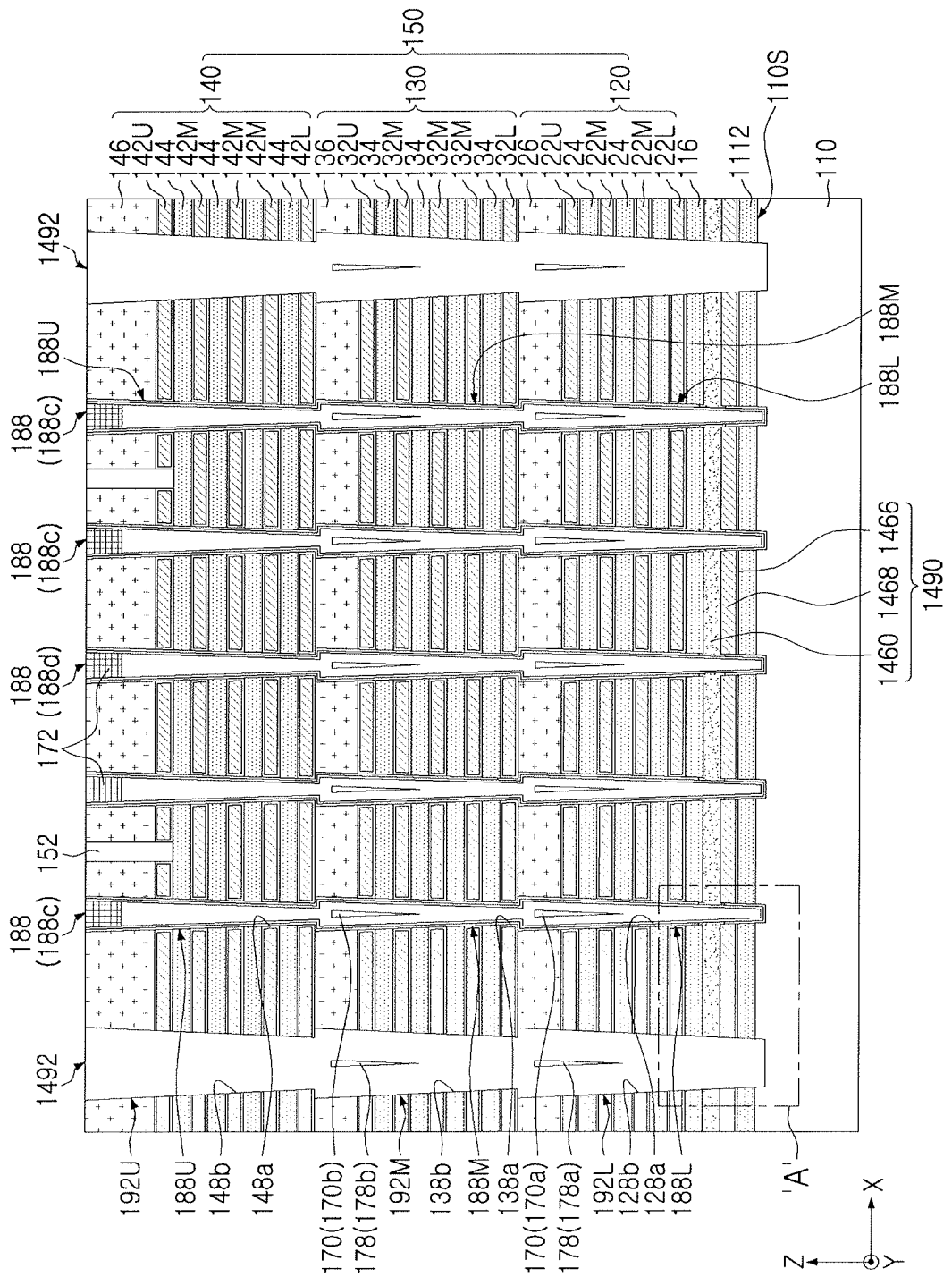
Figure 44B:
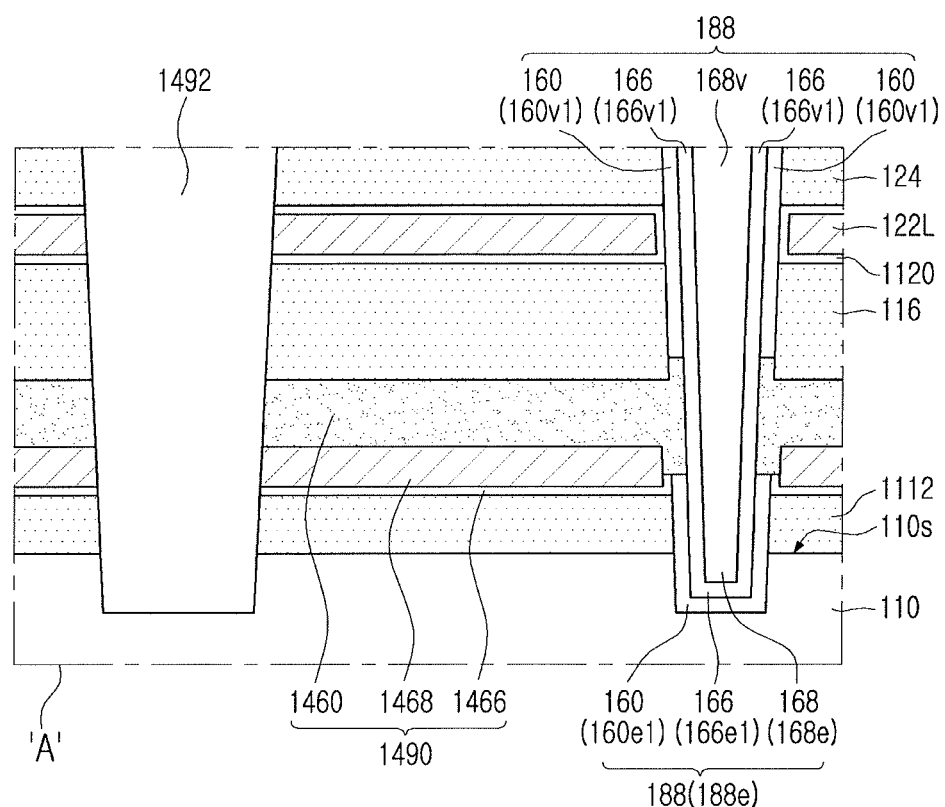
Figure 44C:
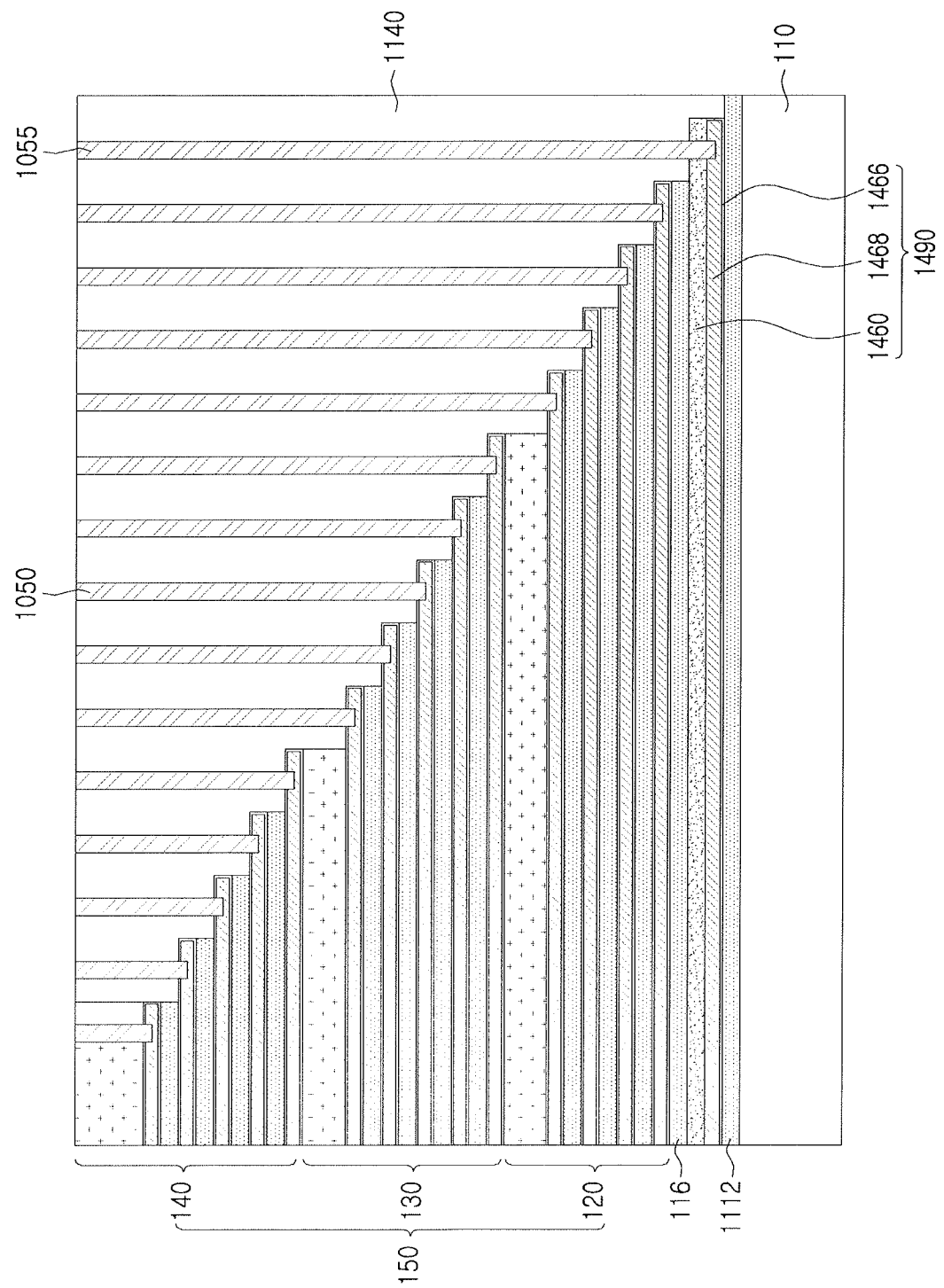
Figure 45:
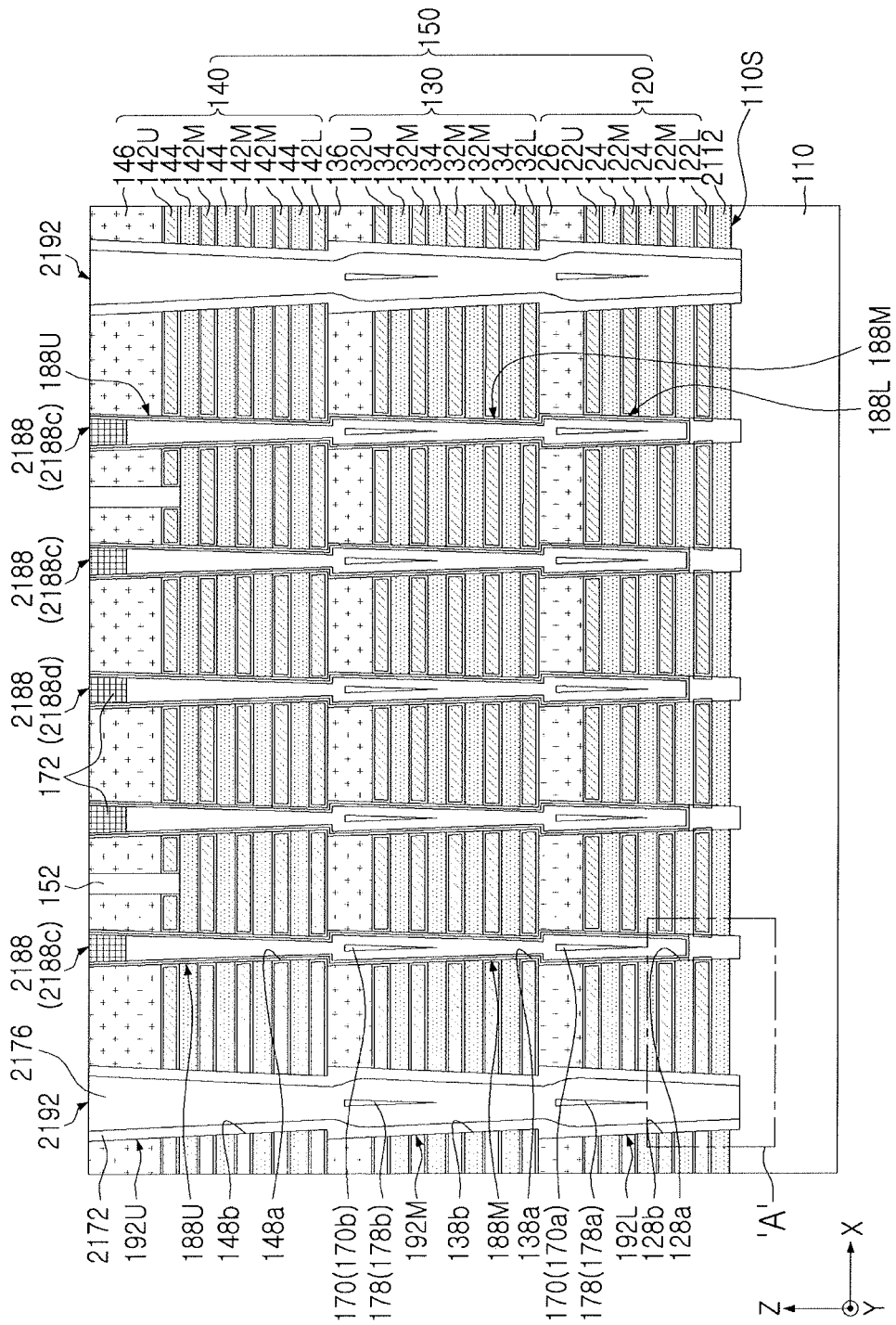
Figure 46:
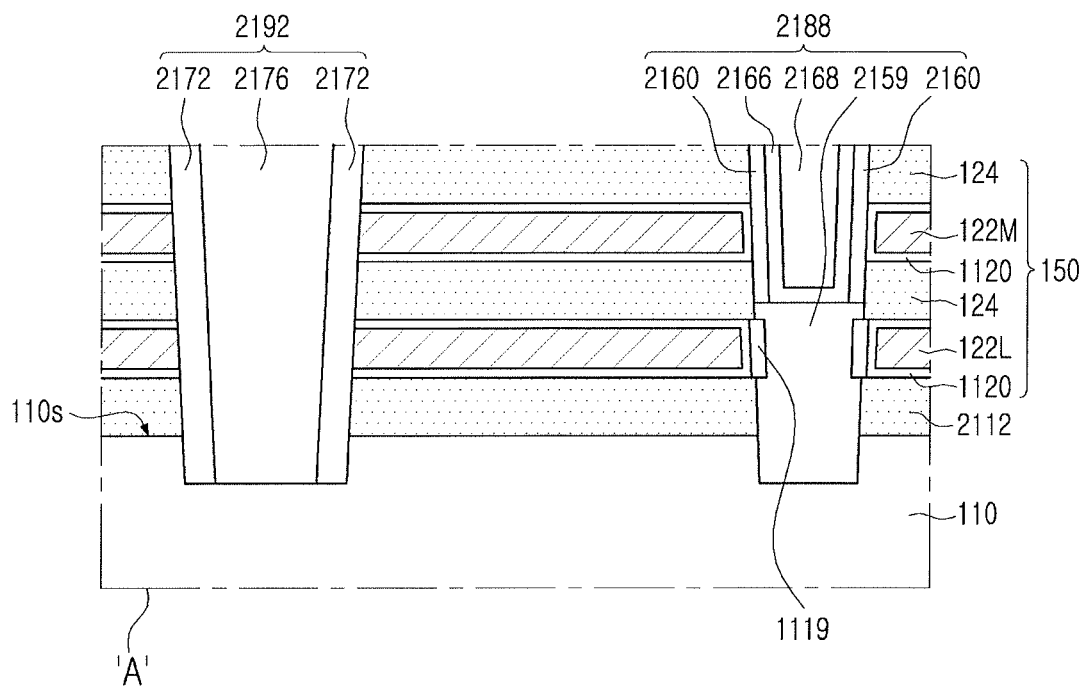
Figure 47:
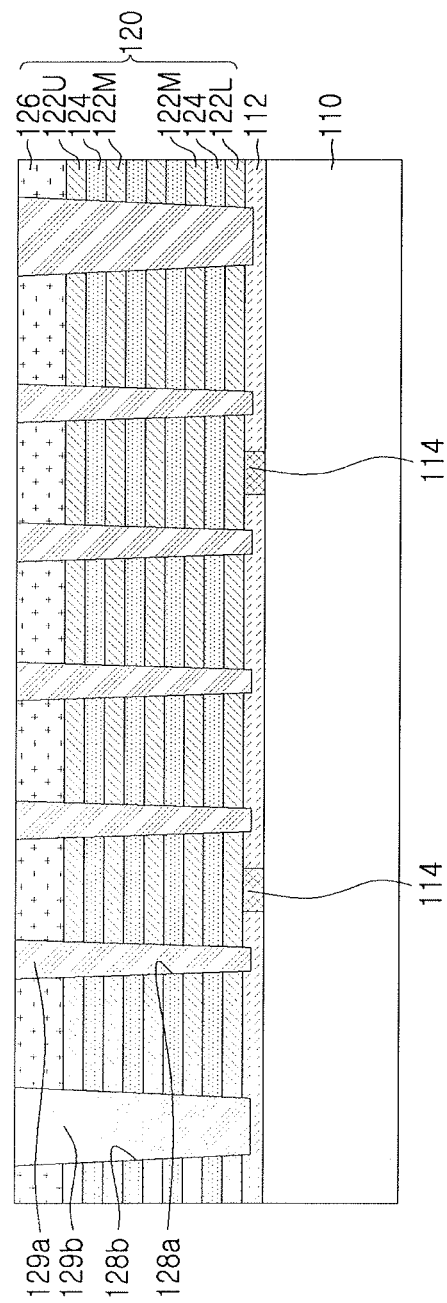
Figure 48:
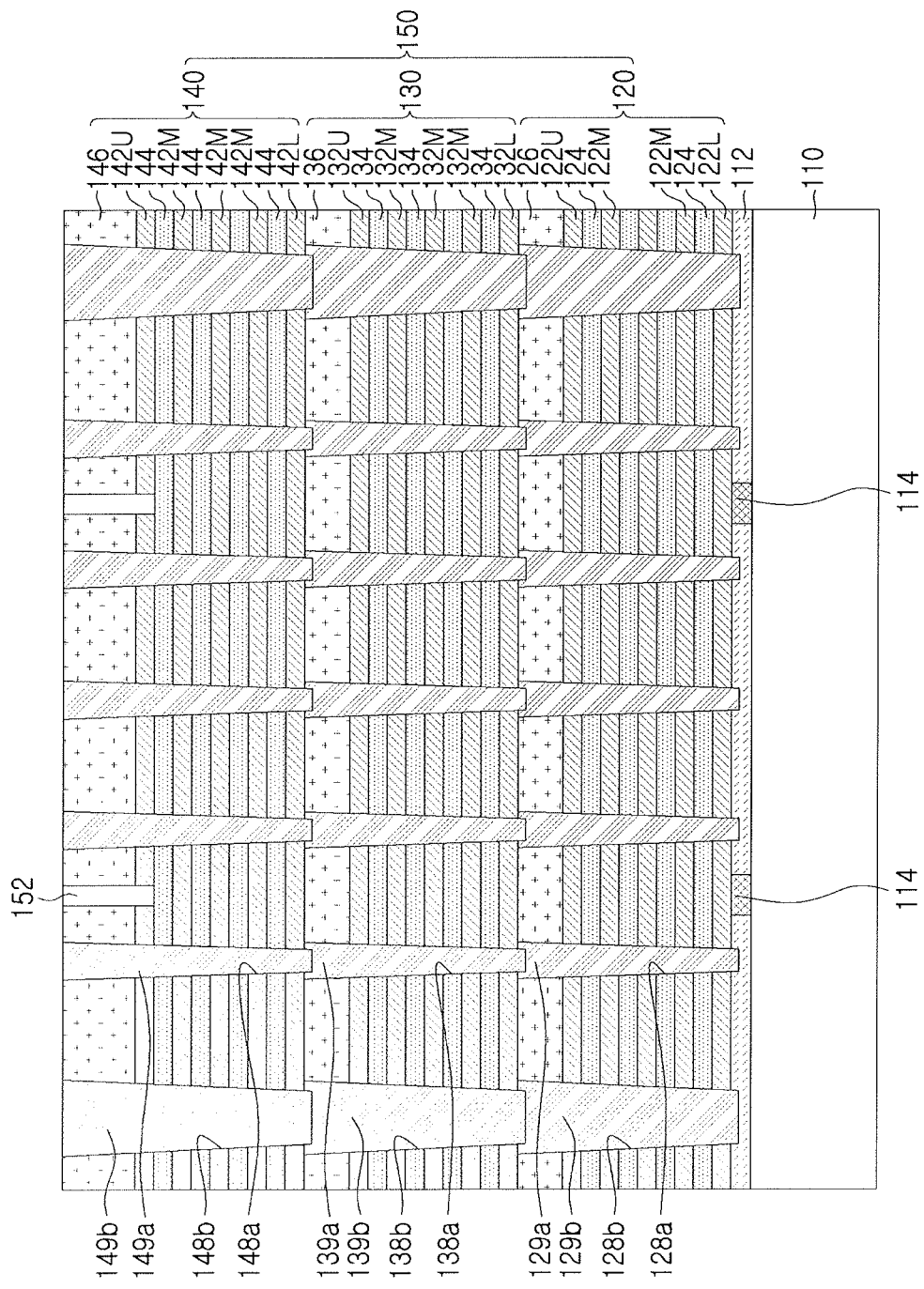
Figure 49:
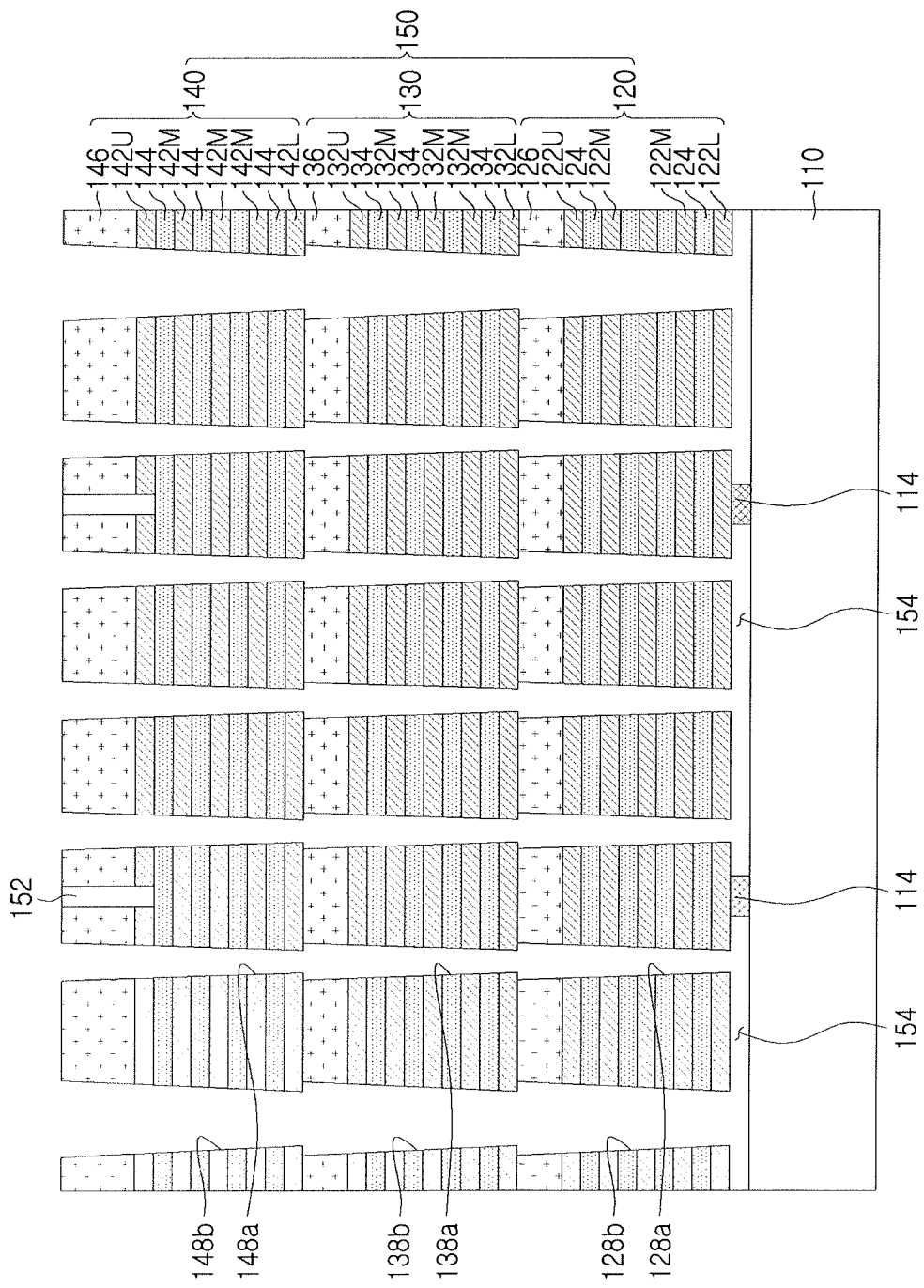
Figure 50:
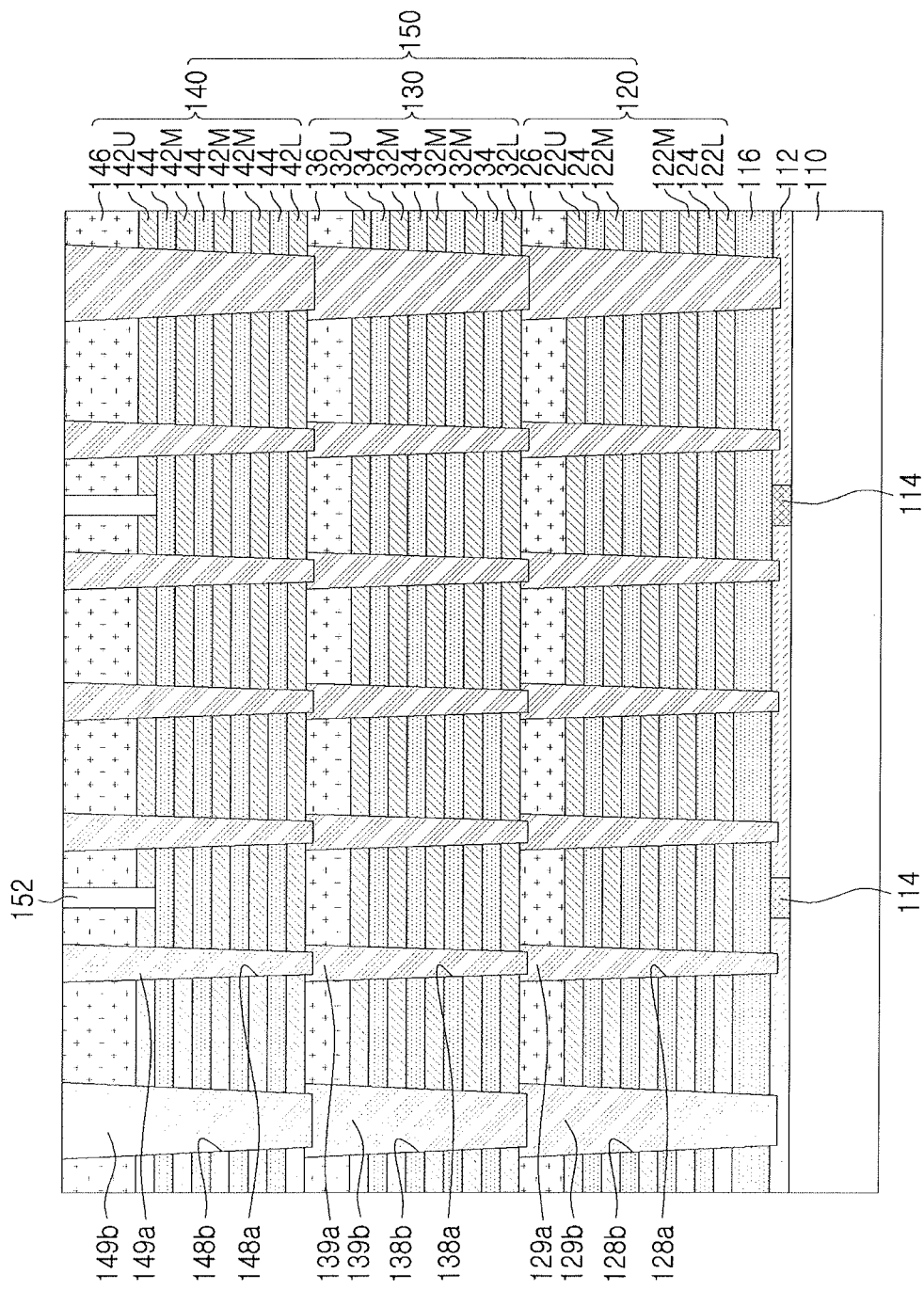
Figure 51:
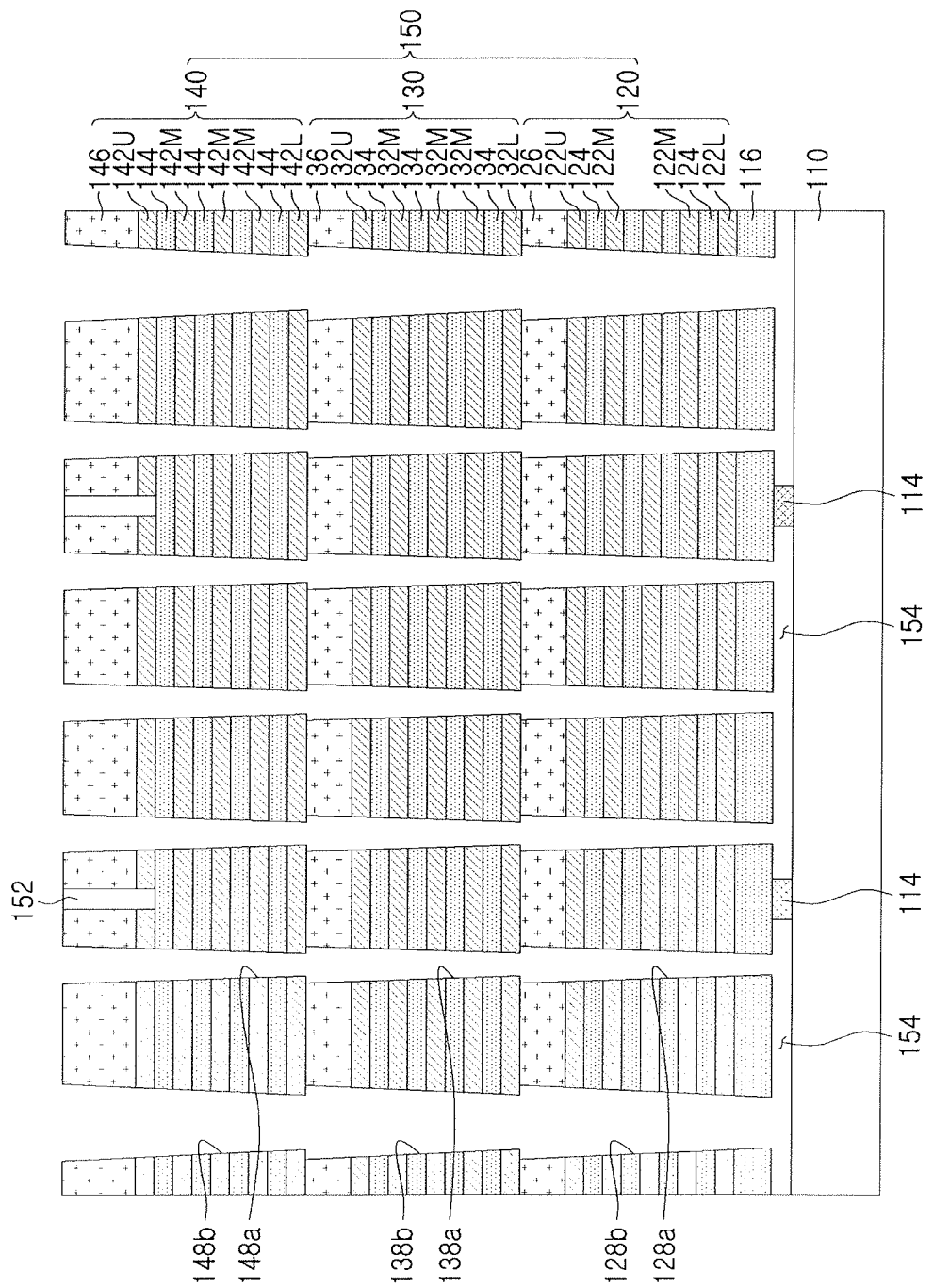
Figure 52:
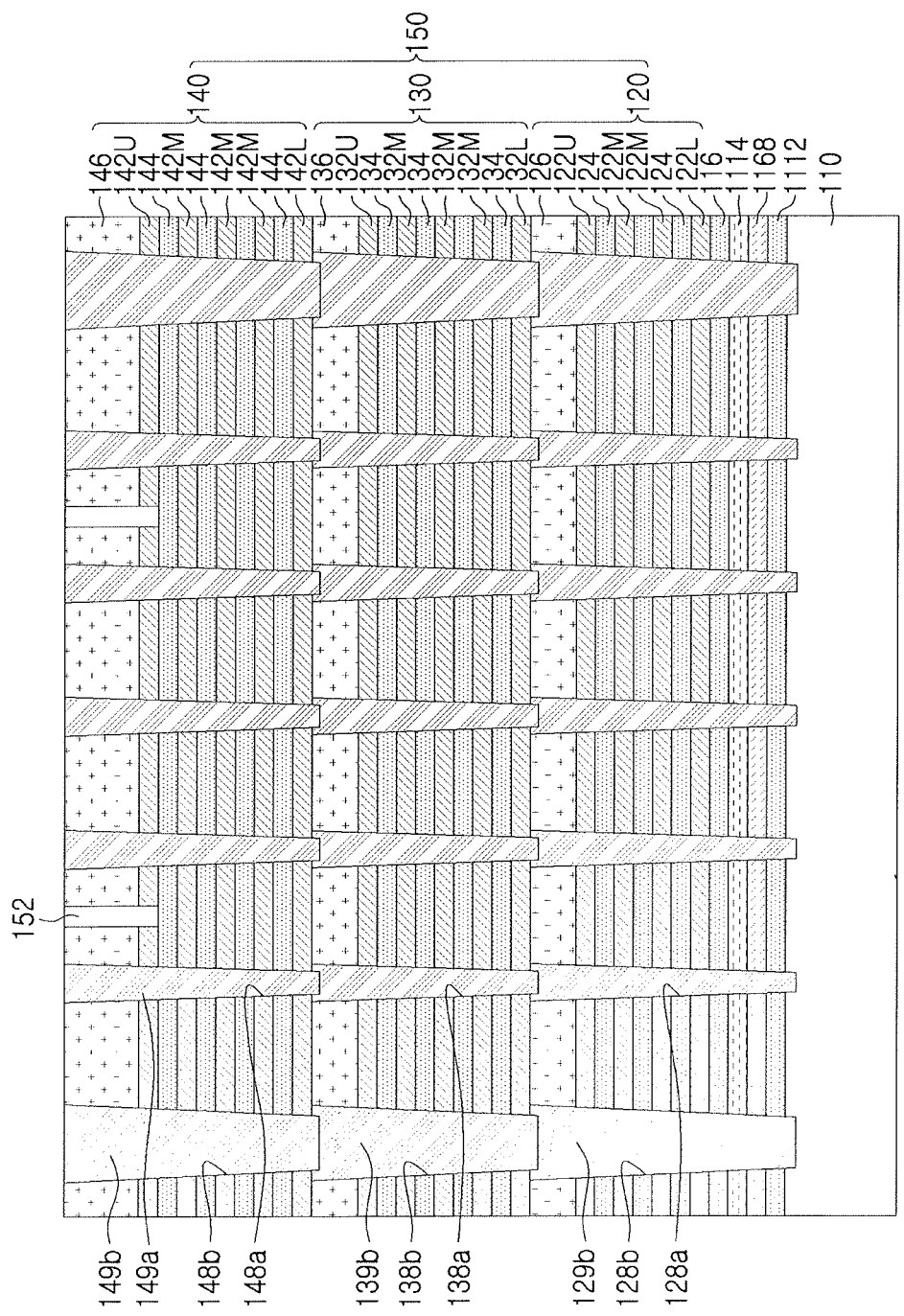
Figure 53:
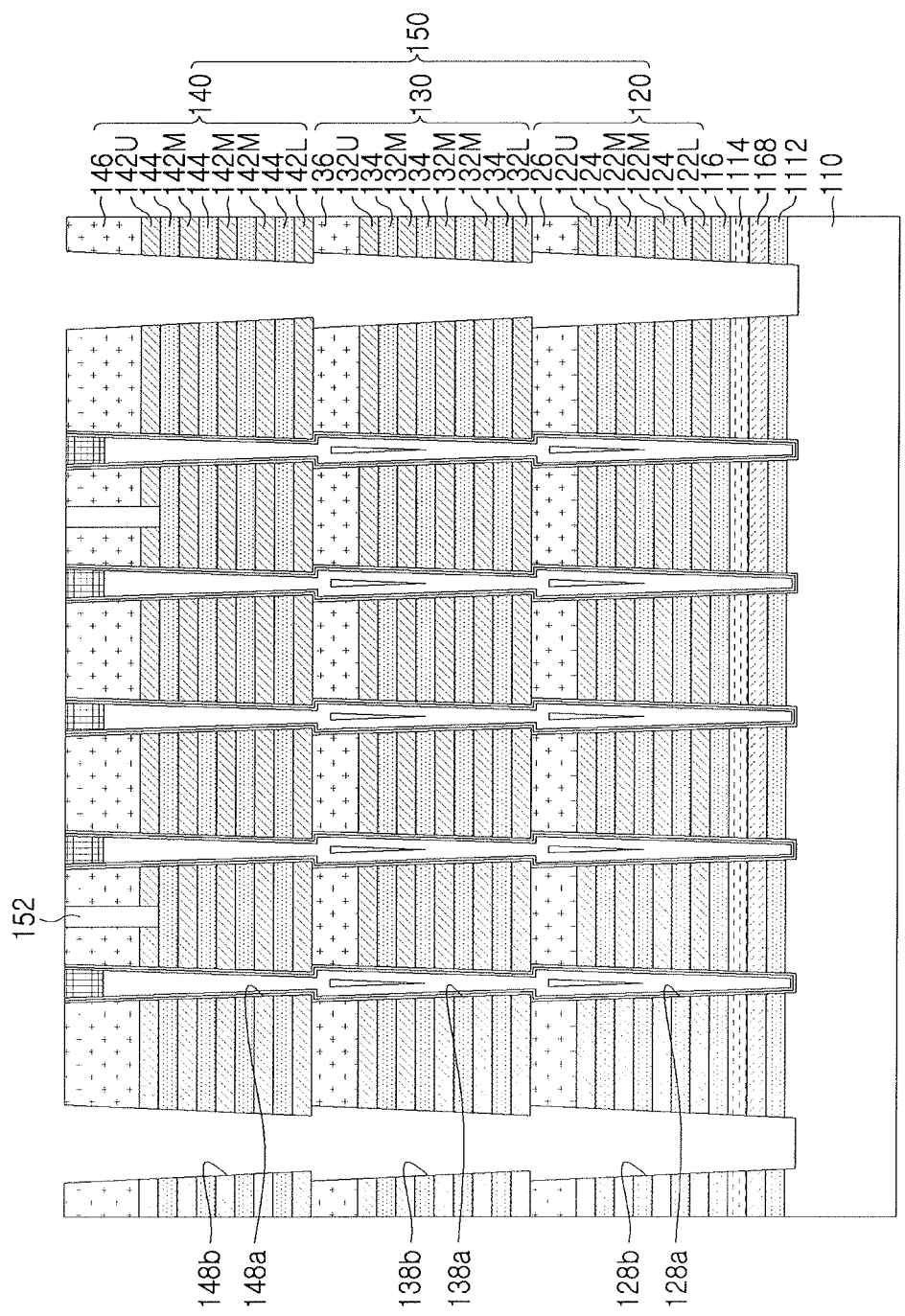

Each of FIGS. 42 and 43 illustrate a partially enlarged view illustrating a modified example of a three-dimensional semiconductor device according to an example embodiment;

FIGS. 44A and 44C illustrate cross-sectional views of a modified example of a three-dimensional semiconductor device according to an example embodiment;

FIG. 44B illustrates a partially enlarged view enlarging the portion of FIG. 44A;

FIG. 45 illustrates a cross-sectional view of a modified example of a three-dimensional semiconductor device according to an example embodiment;

FIG. 46 illustrates a partially enlarged view enlarging the portion of FIG. 45;

FIGS. 47 to 49 illustrate cross-sectional views of an example of a method of forming a three-dimensional semiconductor device according to an example embodiment;

FIGS. 50 and 51 illustrate cross-sectional views of a modified example of a method of forming a three-dimensional semiconductor device according to an example embodiment; and FIGS. 52 and 53 illustrate cross-sectional views of a modified example of a method of forming a three-dimensional semiconductor device according to an example embodiment.

DETAILED DESCRIPTION

Among the drawings, a plan view and a cross-sectional view may illustrate some components to describe a semiconductor device according to an example embodiment. The plan view may illustrate some components among the components illustrated in the cross-sectional view.

Figure 1:
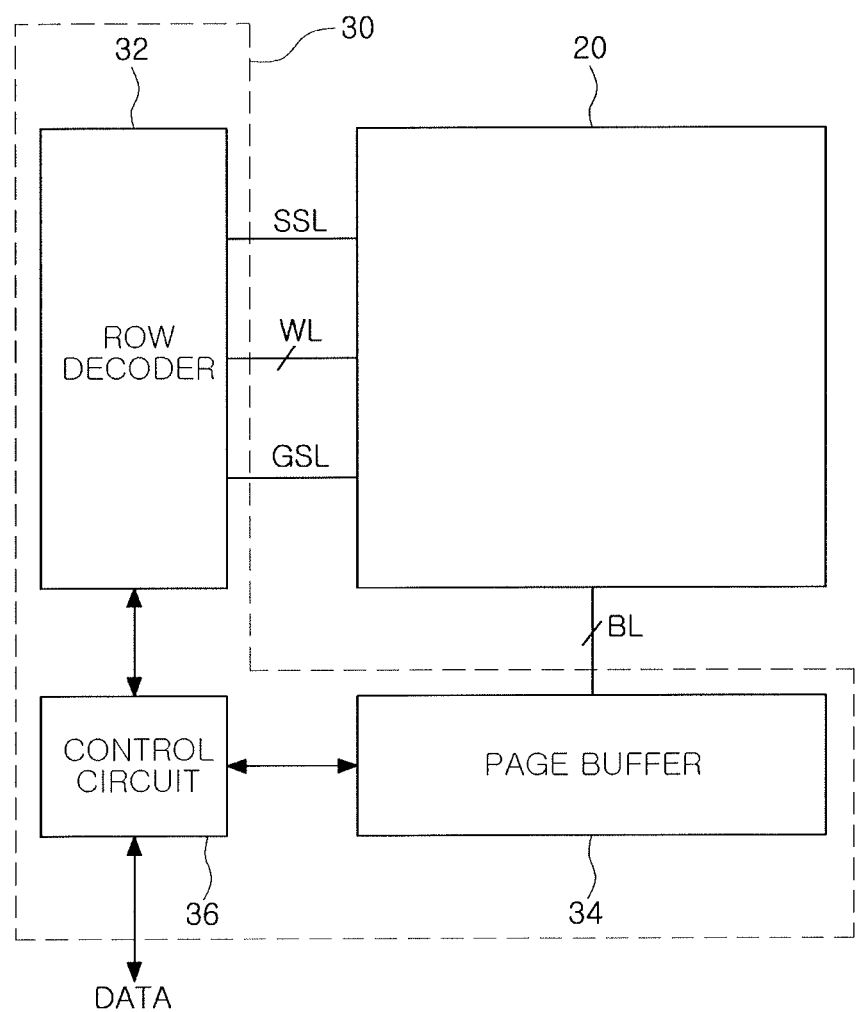
FIG. 1 illustrates a schematic block diagram of a three-dimensional semiconductor device according to an example embodiment.

FIG. 1 illustrates a schematic block diagram of a three-dimensional semiconductor device according to an example embodiment.

Referring to FIG. 1, a three-dimensional semiconductor device 10 according to an example embodiment may include a memory cell array region 20 and a peripheral circuit region 30. The memory cell array region 20 may include a plurality of memory cells. The peripheral circuit region 30 may include, e.g., a row decoder 32, a page buffer 34, and a control circuit 36.

The plurality of memory cells in the memory cell array region 20 may be connected to the row decoder 32 through, e.g., a string selection line SSL, a word line WL, and a ground selection line GSL, and may be connected to the page buffer 34 through a bit line BL.

In an example embodiment, a plurality of memory cells, arranged on the same row, may be commonly connected to a word line WL, and a plurality of memory cells, arranged in the same column, may be commonly connected to a bit line BL.

The row decoder 32 may decode an address, having been input, and may thus generate and transmit driving signals of the word line WL. The row decoder 32 may provide a word line voltage, generated from a voltage generating circuit in the control circuit 36, to a selected word line of word lines among the word lines WL and a non-selected word line of word lines among the word lines WL in response to the control of the control circuit 36.

The page buffer 34 is connected to the memory cell array region 20 through the bit line BL, and thus may read information stored in the memory cell. The page buffer 34 may temporarily store data to be stored in the memory cell, or sense data stored in the memory cell according to a mode of operation. The page buffer 34 may include, e.g., a column decoder and a sense amplifier.

The column decoder may selectively activate a bit line BL of the memory cell array region 20, and the sense amplifier may sense a voltage of a bit line BL, selected by the column decoder, and may thus read data, stored in a memory cell, having been selected. The control circuit 36 may control operations of the row decoder 32 and the page buffer 34. The control circuit 36 may receive a control signal and an external voltage, transmitted from an external source, and may be operated according to a control signal, having been received. The control circuit 36 may include, e.g., a voltage generating circuit generating voltages required for an internal operation using an external voltage, e.g., a programming voltage, a reading voltage, an erasing voltage, and the like. The control circuit 36 may control reading, writing, and/or erasing operations in response to the control signals. In addition, the control circuit 36 may include an input and output circuit. The input and output circuit may receive data DATA and transfer the data to the page buffer 34 during a programming operations, and may output the data DATA, transferred from the page buffer 34, externally, during a reading operation.

Figure 2:
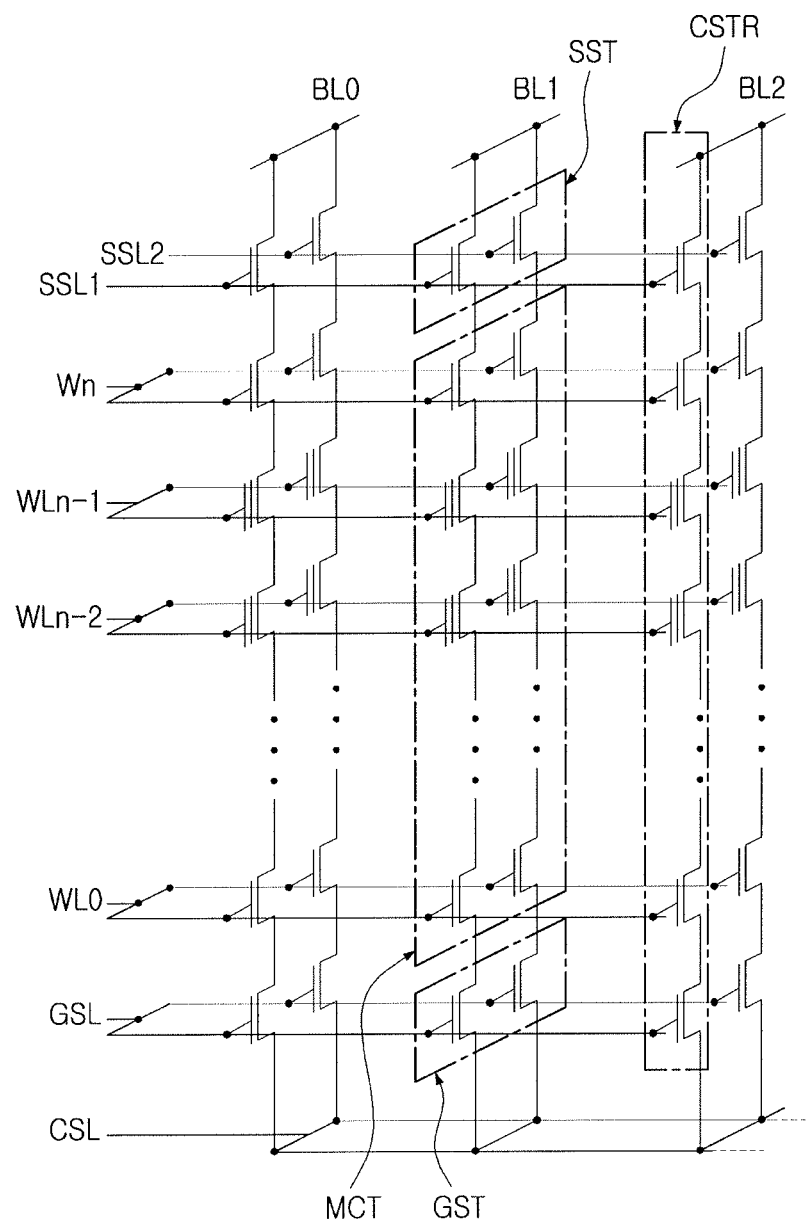
FIG. 2 illustrates a schematic circuit diagram of an example of a three-dimensional semiconductor device according to an example embodiment.

FIG. 2 illustrates a schematic circuit diagram of the memory cell array region 20 of FIG. 1.

Referring to FIG. 2, a three-dimensional semiconductor device according to an example embodiment may include, e.g., a common source line CSL, bit lines BL0 to BL2, and a plurality of cell strings CSTR between the common source line CSL and the bit lines BL0 to BL2. The plurality of cell strings CSTR may be connected to each of the bit lines BL0 to BL2 in parallel. The plurality of cell strings CSTR may be commonly connected to the common source line CSL. Each of the plurality of cell strings CSTR may include a lower selection transistor GST, memory cells MCT, and an upper selection transistor SST, which may be connected in series.

The memory cells MCT may be connected in series between the lower selection transistor GST and the upper selection transistor SST. Each of the memory cells MCT may include data storage elements capable of storing data.

The upper selection transistor SST may be electrically connected to the bit lines BL0 to BL2, and the lower selection transistor GST may be electrically connected to the common source line CSL.

The upper selection transistor SST may be provided as a plurality of upper selection transistors, and may be controlled by string selection lines SSL1 to SSL2. The memory cells MCT may be controlled by a plurality of word lines WL0 to WLn.

The lower selection transistor GST may be controlled by a ground selection line GSL. The common source line CSL may be commonly connected to a source of the ground selection transistor GST.

In an example embodiment, the upper selection transistor SST may be a string selection transistor, and the lower selection transistor GST may be a ground selection transistor.

Figure 3:
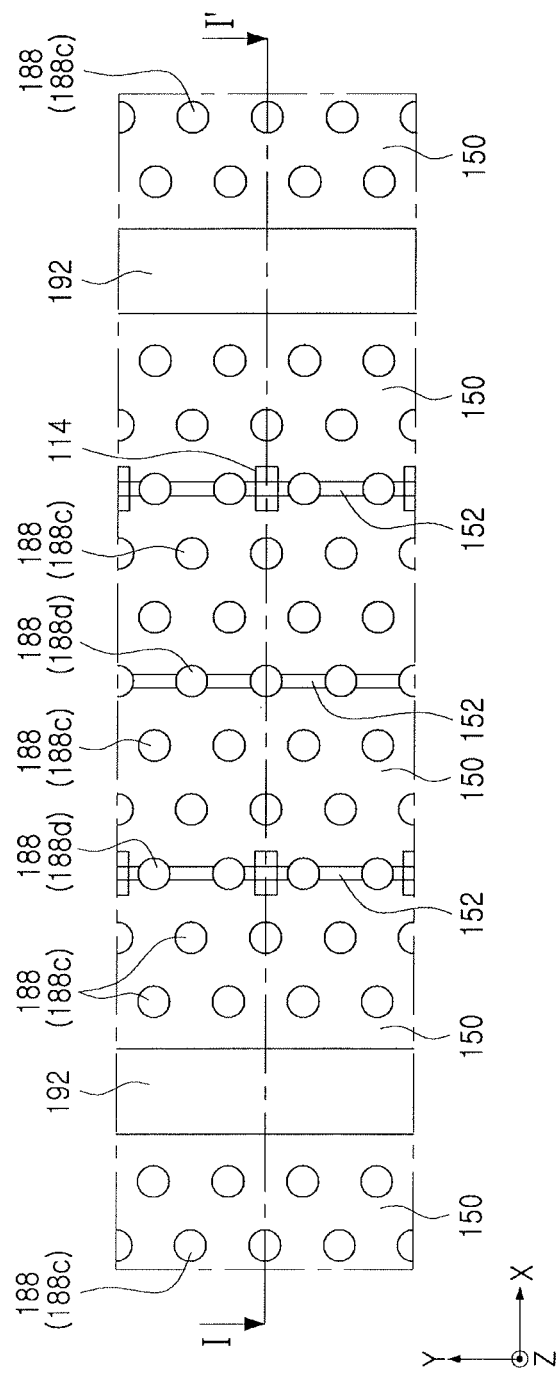
FIG. 3 illustrates a plan view illustrating an example of a three-dimensional semiconductor device according to an example embodiment.
Figure 4:
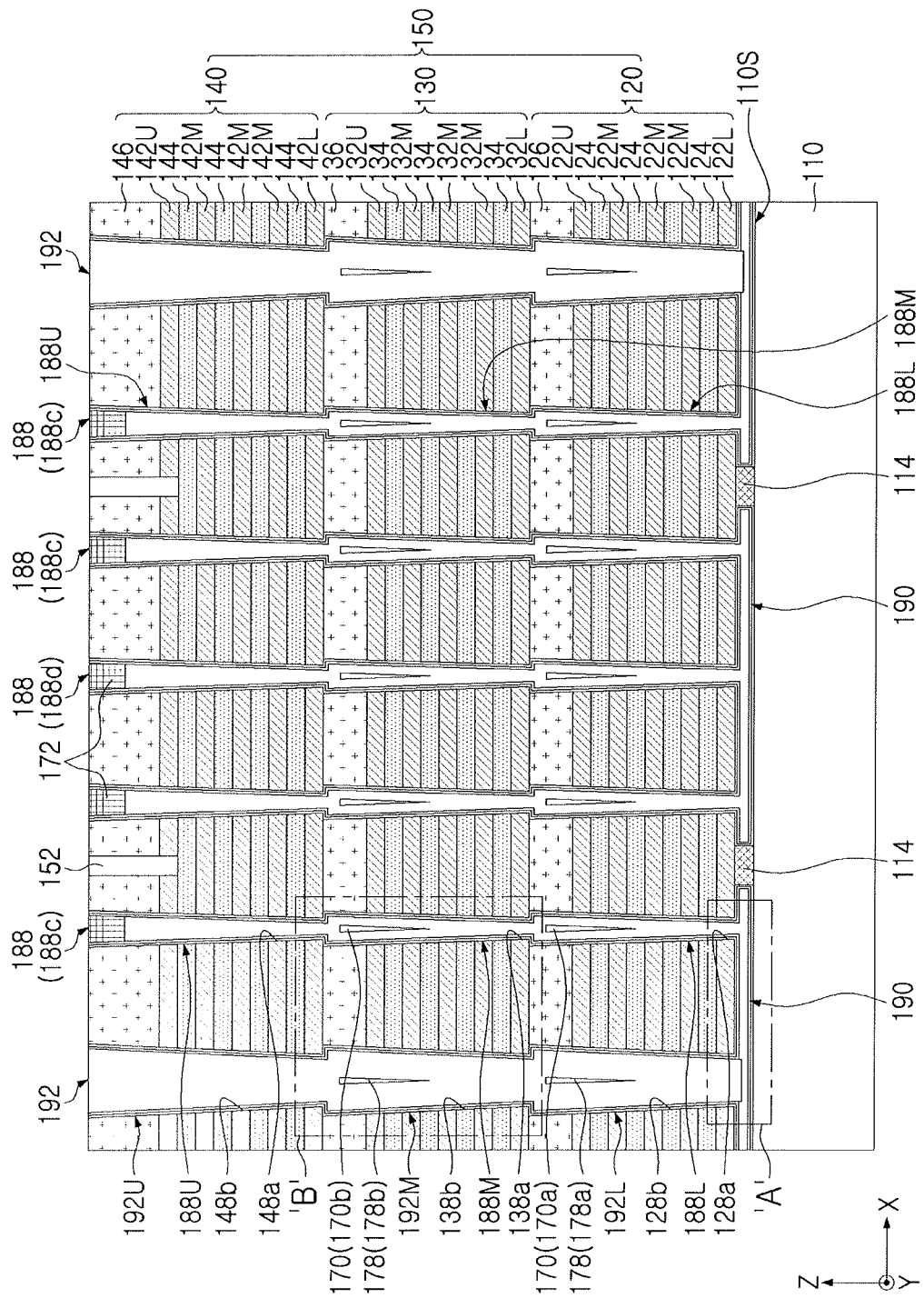
FIG. 4 illustrates a cross-sectional view of a region taken along line I-I' of FIG. 3.
Figure 5A:
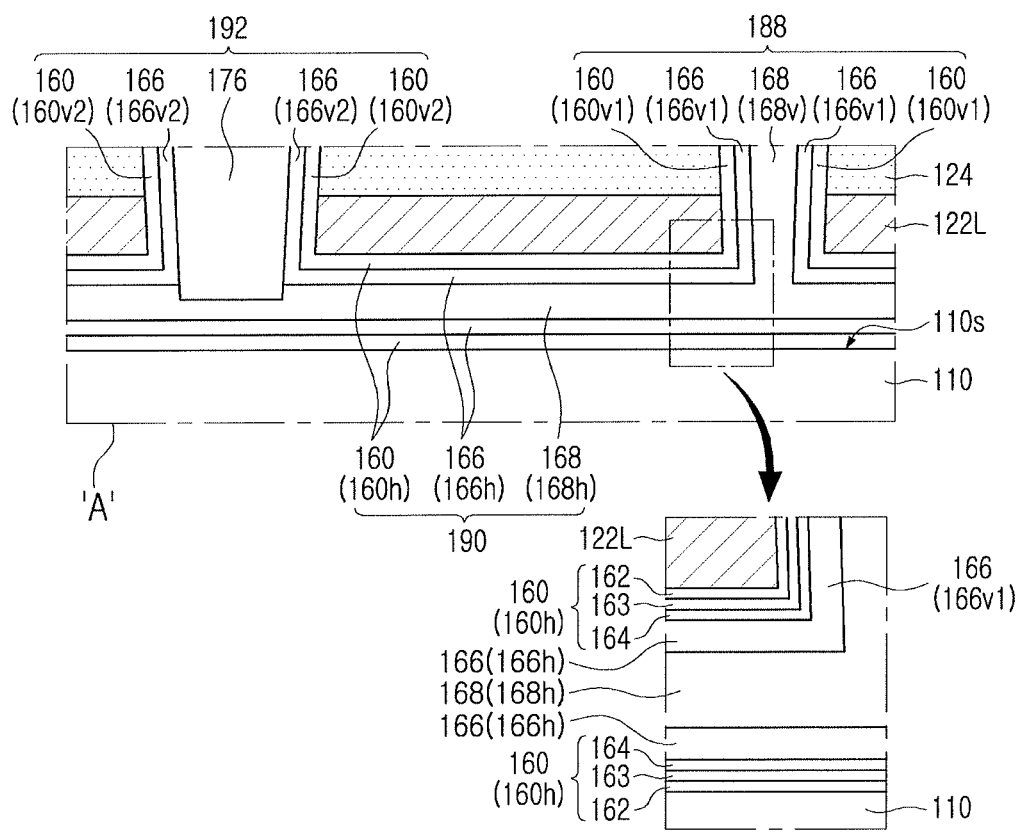
FIGS. 5A and 5B illustrate partially enlarged views enlarging the portion of FIG. 4.
Figure 5B:
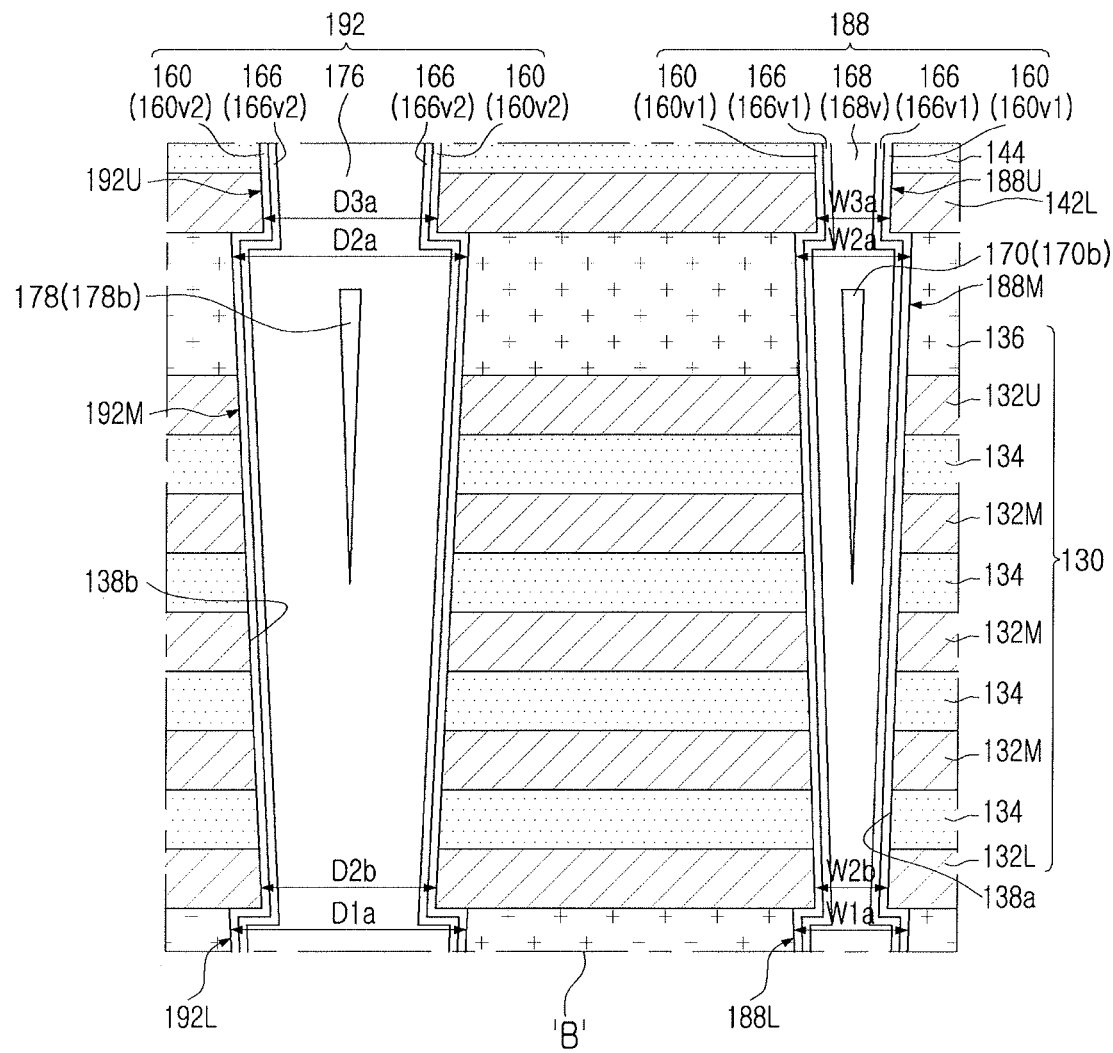

FIG. 3 illustrates a plan view of a three-dimensional semiconductor device according to an example embodiment, FIG. 4 illustrates a cross-sectional view of a region taken along line I-I' of FIG. 3, FIG. 5A illustrates a partially enlarged view of a portion indicated by 'A' of FIG. 4, and FIG. 5B illustrates a partially enlarged view of a portion indicated by 'B' of FIG. 4.

Referring to FIGS. 3, 4, 5A, and 5B, a stacked structure 150 may be disposed on a lower structure 110. In an example embodiment, the lower structure 110 may be a semiconductor substrate formed of a semiconductor material such as silicon (e.g., polysilicon or single crystal silicon), or the like.

The stacked structure 150 may include a plurality of groups stacked in a vertical direction Z. The vertical direction Z may be a direction perpendicular to an upper surface 110s of the lower structure 110. The stacked structure 150 may include a plurality of groups, which are described in detail below.

The plurality of groups of the stacked structure 150 may include a lower group 120 and may include an upper group 140 on the lower group 120.

In an example embodiment, the stacked structure 150 may include one or a plurality of intermediate groups 130, disposed between the lower group 120 and the upper group 140.

Figure 12A:
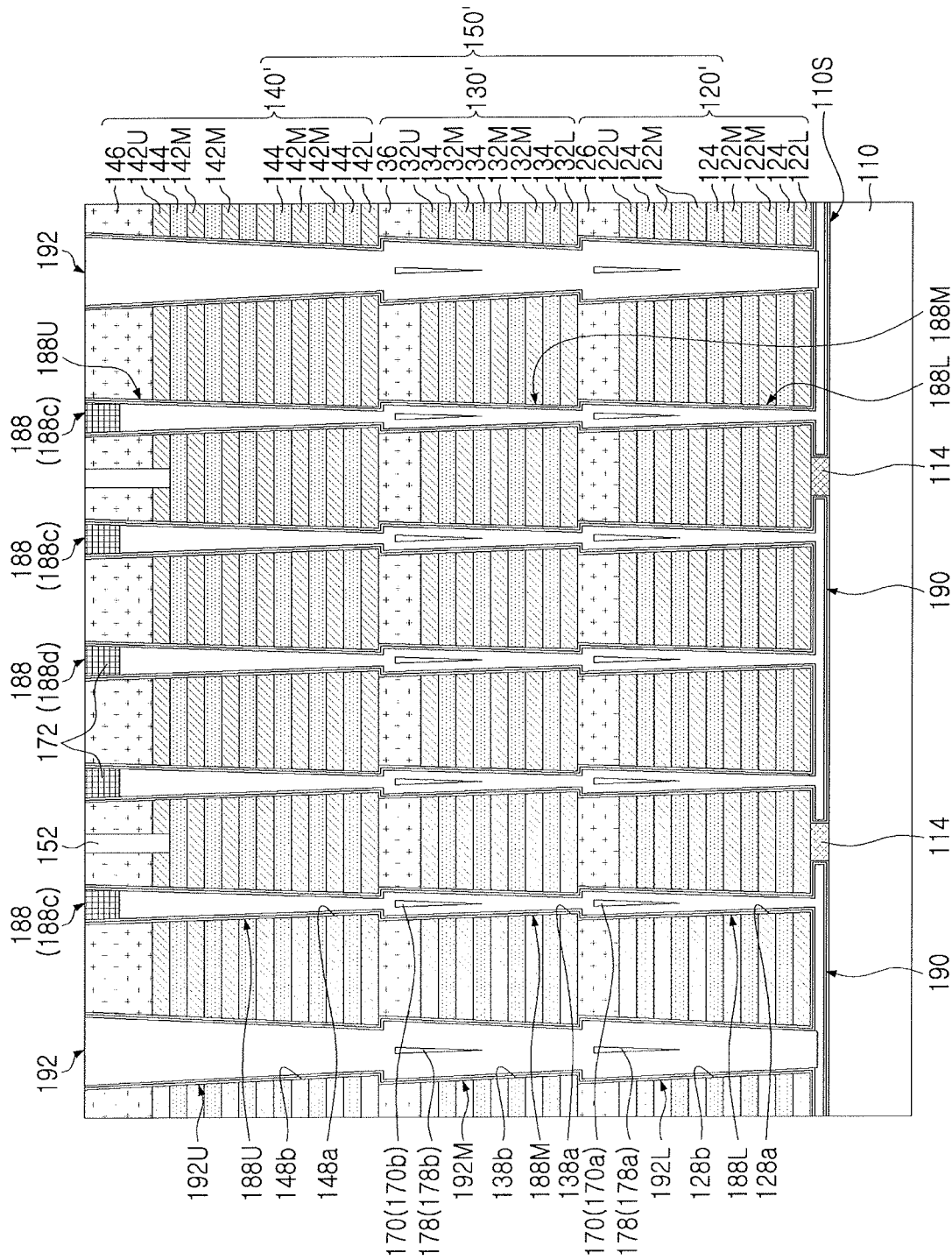
FIG. 12A illustrates a cross-sectional view of a modified example of a three-dimensional semiconductor device according to an example embodiment.
Figure 12B:
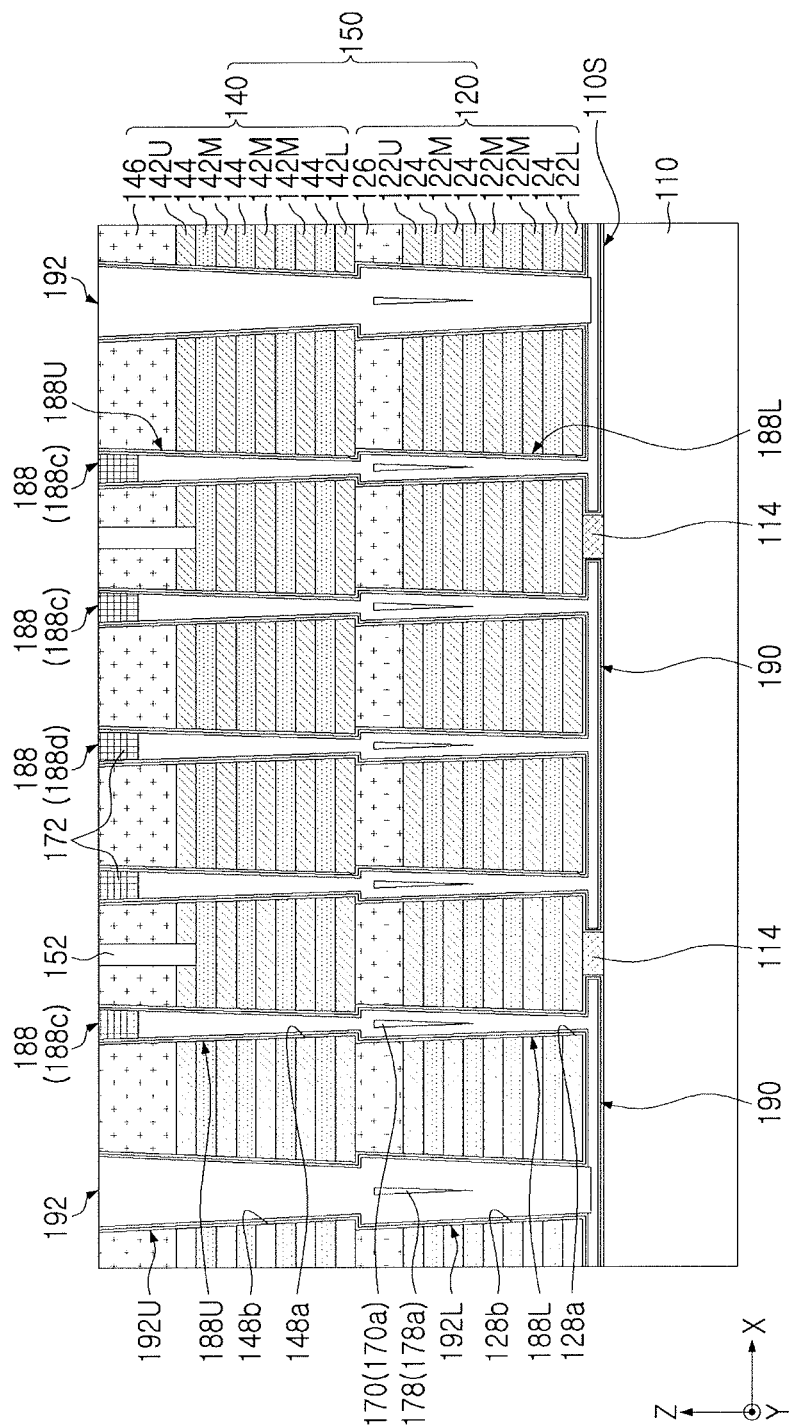
FIG. 12B illustrates a cross-sectional view of a modified example of a three-dimensional semiconductor device according to an example embodiment.

In an example embodiment, in the stacked structure 150, as illustrated in FIG. 12B, one or the plurality of intermediate groups 130 may be omitted, and the lower group 120 and the upper group 140 may be directly in contact with each other.

Figure 12C:
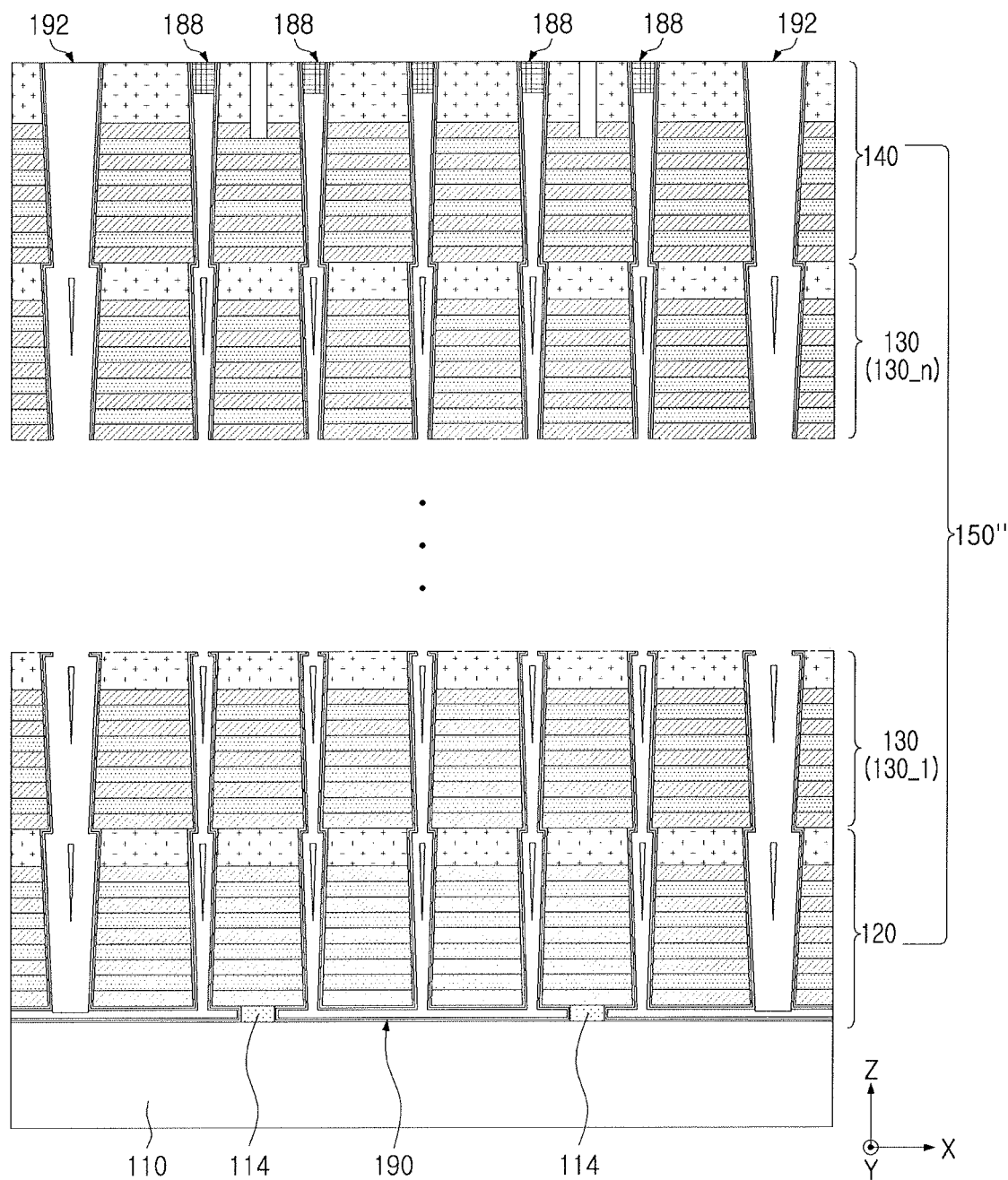
FIG. 12C illustrates a cross-sectional view of a modified example of a three-dimensional semiconductor device according to an example embodiment.

In an example embodiment, when one or the plurality of intermediate groups 130 is a plurality of intermediate groups, as illustrated in FIG. 12C, the intermediate groups may be repeatedly stacked in the vertical direction Z to form one intermediate group 130. Hereinafter, for convenience of explanation, the description will be made with reference to the case in which one or the plurality of intermediate groups 130 are provided as one as illustrated in FIGS. 4 and 5B. Thus, even if one or the plurality of intermediate groups 130 are described as being one intermediate group in the following example embodiments, embodiments also encompass the case in which one or the plurality of intermediate groups 130 are provided as a plurality of intermediate groups or one or the plurality of intermediate groups 130 are omitted.

Each of the plurality of groups of the stacked structure 150 may include gate electrodes, stacked and spaced apart from each other in the vertical direction Z. For example, the lower group 120 may include lower gate electrodes 122L, 122M, and 122U, stacked and spaced apart from each other in the vertical direction Z. The lower group 120 may include lower interlayer insulating layers 124, disposed between the lower gate electrodes 122L, 122M, and 122U. The lower group 120 may include a lower capping layer 126. The lower gate electrodes 122L, 122M, and 122U, as well as the lower interlayer insulating layers 124, may be below the lower capping layer 126.

In an example embodiment, the lower capping layer 126 may have a thickness greater than a thickness of each of the lower gate electrodes 122L, 122M, and 122U, as well as a thickness greater than each of the lower interlayer insulating layers 124.

The intermediate group 130 may include intermediate gate electrodes 132L, 132M, and 132U, stacked and spaced apart from each other in the vertical direction Z. The intermediate group 130 may include intermediate interlayer insulating layers 134, disposed between the intermediate gate electrodes 132L, 132M, and 132U. The intermediate group 130 may include an intermediate capping layer 136. The intermediate gate electrodes 132L, 132M, and 132U, as well as the intermediate interlayer insulating layers 134, may be below the intermediate capping layer 136.

In an example embodiment, the intermediate capping layer 136 may have a thickness greater than a thickness of each of the intermediate gate electrodes 132L, 132M, and 132U, and greater than a thickness of each of the intermediate interlayer insulating layers 134.

The upper group 140 may include upper gate electrodes 142L, 142M, and 142U, stacked and spaced apart from each other in the vertical direction Z. The upper group 140 may include upper interlayer insulating layers 144, disposed between the upper gate electrodes 142L, 142M, and 142U.

The upper group 140 may include an upper capping layer 146. The upper gate electrodes 142L, 142M, and 142U, as well as the upper interlayer insulating layers 144, may be below the upper capping layer 146.

In an example embodiment, the upper capping layer 146 may have a thickness greater than a thickness of each of the upper gate electrodes 142L, 142M, and 142U, as well as greater than a thickness of each of the upper interlayer insulating layers 144.

In an example embodiment, the upper capping layer 146 may have a thickness greater than a thickness of the intermediate capping layer 136 and greater than a thickness of the lower capping layer 126.

In an example embodiment, a portion of the lower gate electrodes 122L, 122M, and 122U of the lower group 120 may be a ground selection line (GSL of FIGS. 1 and 2), and a portion of the upper gate electrodes 142L, 142M, and 142U of the upper group 140 may be a string selection line (SSL of FIGS. 1 and 2). For example, a lowermost gate electrode 122L among the lower gate electrodes 122L, 122M, and 122U may be the ground selection line (GSL of FIGS. 1 and 2), and an uppermost gate electrode 144U among the upper gate electrodes 142L, 142M, and 142U may be the string selection line (SSL of FIGS. 1 and 2). In an example embodiment, the ground selection line (GSL of FIGS. 1 and 2 may be a lowermost gate electrode and/or a gate electrode, directly above the lowermost gate electrode, among the lower gate electrodes 122L, 122M, and 122U, and the string selection line (SSL of FIGS. 1 and 2) may be an uppermost gate electrode and a gate electrode, directly below the uppermost gate electrode, among the upper gate electrodes 142L, 142M, and 142U.

Among the lower, intermediate, and upper gate electrodes 122L, 122M, 122U, 132L, 132M, 132U, 142L, 142M, and 142U, except for gate electrodes used as the ground selection line (GSL of FIGS. 1 and 2) and the string selection line (SSL of FIGS. 1 and 2), a portion of the remaining gate electrodes may be dummy gate electrodes, and the remaining gate electrodes may be used as the word lines WL, of FIGS. 1 and 2. The dummy gate electrodes may be gate electrodes, adjacent to the ground selection line (GSL of FIGS. 1 and 2) and the string selection line (SSL of FIGS. 1 and 2) and/or gate electrodes, adjacent to the lower and intermediate capping layers 126 and 136, among the lower, intermediate, and upper gate electrodes 122L, 122M, 122U, 132L, 132M, 132U, 142L, 142M, and 142U. For example, the gate electrodes 122U, 132L, 132U, and 142L, adjacent to the lower and intermediate capping layers 126 and 136, may be dummy gate electrodes. In an example embodiment, the lower, intermediate, and upper gate electrodes 122L, 122M, 122U, 132L, 132M, 132U, 142L, 142M, and 142U may be formed of, e.g., a conductive material (e.g., doped polysilicon, or the like).

A horizontal structure 190 may be on the lower structure 110. The horizontal structure 190 may be below the stacked structure 150. Supporting patterns 114, passing through the horizontal structure 190 and disposed between the lower structure 110 and the stacked structure 150, may be provided. In an example embodiment, the supporting patterns 114 may be formed of, e.g., silicon, silicon-germanium, or other materials.

Separation structures 192, passing through the stacked structure 150, may be on the lower structure 110. A vertical structure 188, disposed between the separation structures 192 and passing through the stacked structure 150, may be on the lower structure 110. The vertical structure 188 may be provided as a plurality of vertical structures.

Insulating patterns 152, located above gate electrodes 142M, used as word lines (WL of FIG. 1), among the upper gate electrodes 142L, 142M, and 142U, and allowing gate electrodes 142U, used as a string selection line (SSL of FIGS. 1 and 2), among the upper gate electrodes 142L, 142M, and 142U, to be separated or spaced apart from each other in a horizontal direction, may be provided. The insulating patterns 152 may pass through the upper capping layer 146.

The vertical structure 188 may be provided as a plurality of vertical structures. For example, a plurality of vertical structures 188 may include a dummy vertical structure 188d, disposed between the separation structures 192 and passing between the insulating patterns 152, and a memory cell vertical structure 188c, disposed between the separation structures 192 and spaced apart from the insulating patterns 152. The dummy vertical structure 188d and the memory cell vertical structure 188c may have a substantially the same structure. The vertical structure 188 may be connected to the horizontal structure 190. For example, the dummy vertical structure 188d and the memory cell vertical structure 188c may be connected to the horizontal structure 190.

The vertical structure 188 may include vertical portions 188L, 188M, and 188U, arranged in one-to-one correspondence to the plurality of groups 120, 130, and 140 and passing through the plurality of groups 120, 130, and 140. For example, the vertical portions 188L, 188M, and 188U of the vertical structure 188 may include a lower vertical portion 188L passing through the lower group 120, an intermediate vertical portion 188M passing through the intermediate group 130, and an upper vertical portion 188U passing through the upper group 140.

The lower vertical portion 188L of the vertical structure 188 may be disposed in a lower through hole 128a passing through the lower group 120, the intermediate vertical portion 188M of the vertical structure 188 may be disposed in an intermediate through hole 138a passing through the intermediate group 130, and the upper vertical portion 188U of the vertical structure 188 may be disposed in an upper through hole 148a passing through the upper group 140.

In each of the lower, intermediate, and upper vertical portions 188L, 188M, and 188U, a width of an upper region may be greater than a width of a lower region thereof. A width of an upper region of a vertical portion among the lower, intermediate, and upper vertical portions 188L, 188M, and 188U may be greater than a width of a lower region of a vertical portion thereof. For example, referring to, e.g., FIG. 5B, a width W2a of an upper region of the intermediate vertical portion 188M may be greater than a width W2b of a lower region of the intermediate vertical portion 188M, and the width W2a of the upper region of the intermediate vertical portion 188M may be greater than a width W3a of a lower region of the upper vertical portion 188U. Similarly, the width W2b of the lower region of the intermediate vertical portion 188M may be narrower than a width W1a of an upper region of the lower vertical portion 188L. Moreover, the width W1a of the upper region of the lower vertical portion 188L may be greater than the width W3a of the lower region of the upper vertical portion 188U.

Each of the separation structures 192 may have a width greater than a width of the vertical structure 188. Each of the separation structures 192 may include separation portions 192L, 192M, and 192U, arranged in one-to-one correspondence to the plurality of groups 120, 130, and 140 and passing through the plurality of groups 120, 130, and 140. For example, the separation portions 192L, 192M, and 192U of the separation structures 192 may include a lower separation portion 192L passing through the lower group 120, an intermediate separation portion 192M passing through the intermediate group 130, and an upper separation portion 192U passing through the upper group 140. The lower separation portion 192L may be disposed in a lower separation trench 128b passing through the lower group 120, the intermediate separation portion 192M may be disposed in an intermediate separation trench 138b passing through the intermediate group 130, and the upper separation portion 192U may be disposed in an upper separation trench 148b passing through the upper group 140.

In each of the lower, intermediate, and upper separation portions 192L, 192M, and 192U, a width of an upper region may be greater than a width of a lower region, and a width of an upper region of a separation portion among the lower, intermediate, and upper separation portions 192L, 192M, and 192U may be greater than a width of a lower region of a separation portion. For example, a width D2a of an upper region of the intermediate separation portion 192M may be greater than a width D2b of a lower region of the intermediate separation portion 192M, and the width D2a of the upper region of the intermediate separation portion 192M may be greater than a width D3a of a lower region of the upper separation portion 192U. Similarly, the width D2b of the lower region of the intermediate separation portion 192M may be narrower than a width D1a of an upper region of the lower separation portion 192L. Moreover, the width D1a of the upper region of the lower separation portion 192L may be greater than the width D3a of the lower region of the upper separation portion 192U.

In an example embodiment, the vertical structure 188 may include a vertical core pattern 168v, a vertical buffer portion 170 in the vertical core pattern 168v, and a vertical semiconductor layer 166v1 surrounding an outer side surface of the vertical core pattern 168v. Each of the vertical core pattern 168v and the vertical semiconductor layer 166v1 may pass through the lower group 120 and one or the plurality of intermediate groups 130 to extend into the upper group 140. Thus, the vertical core pattern 168v may pass from an interior of the lower vertical portion 188L through the intermediate vertical portion 188M and continuously extend to the upper vertical portion 188U to be integrally provided, and the vertical semiconductor layer 166v1 may pass from an interior of the lower vertical portion 188L through the intermediate vertical portion 188M and continuously extend to the upper vertical portion 188U to be integrally provided.

In an example embodiment, the vertical structure 188 may further include a vertical gate dielectric 160v1 surrounding an outer side surface of the vertical semiconductor layer 166v1.

In an example embodiment, the vertical structure 188 may further include a pad pattern 172 on the vertical core pattern 168v and connected to the vertical semiconductor layer 166v1.

The vertical gate dielectric 160v1 may oppose the lower, intermediate, and upper gate electrodes 122L, 122M, 122U, 132L, 132M, 132U, 142L, 142M, and 142U.

The vertical buffer portion 170 may include a lower vertical buffer portion 170a disposed in the lower vertical portion 188L and disposed below the intermediate and upper vertical portions 188M and 188U, and an intermediate vertical buffer portion 170b in the intermediate vertical portion 188M and disposed below the upper vertical portion 188U. The lower vertical buffer portion 170a and the intermediate vertical buffer portion 170b may be spaced apart from each other in the vertical direction Z.

The vertical core pattern 168v may be formed of, e.g., an insulating material, e.g., silicon oxide, and the vertical buffer portion 170 may be, e.g., a void. The vertical semiconductor layer 166v1 may be formed of a semiconductor material such as silicon. The pad pattern 172 may be formed of, e.g., polysilicon having N-type conductivity.

The horizontal structure 190 may include a horizontal gate dielectric 160h extending from the vertical gate dielectric 160v1 and disposed below the stacked structure 150. The horizontal structure 190 may include a horizontal semiconductor layer 166h extending from the vertical semiconductor layer 166v1 and disposed below the stacked structure 150, and a horizontal core pattern 168h extending from the vertical core pattern 168v and disposed below the stacked structure 150. The horizontal gate dielectric 160h and the horizontal semiconductor layer 166h may extend from the vertical gate dielectric 160v1 and the vertical semiconductor layer 166v1 along a lower surface of the stacked structure 150, a side surface of the supporting pattern 114, and an upper surface 110s of the lower structure 110. The horizontal core pattern 168h may fill a gap between a portion of the horizontal semiconductor layer 166h located on a lower surface of the stacked structure 150, and a portion of the horizontal semiconductor layer 166h located on an upper surface 110s of the lower structure 110.

Each of the separation structures 192 may include a separation dielectric 160v2, a separation semiconductor layer 166v2, a separation core pattern 176, and a separation buffer portion 178 in the separation core pattern 176. The separation semiconductor layer 166v2 may be between a side surface of the separation core pattern 176 and the stacked structure 150. The separation dielectric 160v2 may be between the separation semiconductor layer 166v2 and the stacked structure 150. The separation dielectric 160v2 may extend from the horizontal gate dielectric 160h, and the separation semiconductor layer 166v2 may extend from the horizontal semiconductor layer 166h. The separation core pattern 176 may extend downwardly, and may be in contact with the horizontal core pattern 168h of the horizontal structure 190.

The separation buffer portion 178 may include a lower separation buffer portion 178a in the lower separation portion 192L and disposed below the intermediate and upper separation portions 192M and 192U, and an intermediate separation buffer portion 178b disposed in the intermediate separation portion 192M and disposed below the upper separation portion 192U. The lower separation buffer portion 178a and the intermediate separation buffer portion 178b may be spaced apart from each other in the vertical direction Z.

The separation core pattern 176 may be formed of, e.g., a conductive material such as doped polysilicon, a metal nitride, metal, or the like, and the separation buffer portion 178 may be, e.g., a void. Hereinafter, the vertical buffer portion 170 and the separation buffer portion 178 may be understood as being a void, for example.

In an example embodiment, the vertical core pattern 168v and the horizontal core pattern 168h may be a core pattern 168 continuously connected to be integral. The core pattern 168 may be formed of, e.g., an insulating material such as a silicon oxide, or the like. The vertical semiconductor layer 166v1, the horizontal semiconductor layer 166h, and the separation semiconductor layer 166v2 may be an integral semiconductor layer 166. The semiconductor layer 166 may be formed of a semiconductor material such as silicon. The vertical gate dielectric 160v1, the horizontal gate dielectric 160h, and the separation dielectric 160v2 may be an integral gate dielectric 160.

The gate dielectric 160 may include a layer capable of storing data. For example, the gate dielectric 160 may include a tunnel dielectric 164, a data storage layer 163, and a blocking dielectric 162. The data storage layer 163 may be between the tunnel dielectric 164 and the blocking dielectric 162. The blocking dielectric 162 may be between the data storage layer 163 and the stacked structure 150. The tunnel dielectric 164 may be between the data storage layer 163 and the semiconductor layer 166. The tunnel dielectric 164 may include silicon oxide and/or impurity-doped silicon oxide. The blocking dielectric 162 may include silicon oxide and/or high dielectric. The data storage layer 163 may be a layer for storing data, between the semiconductor layer 166 and gate electrodes, which may be word lines. For example, the data storage layer 163 may be formed of a material capable of trapping and retaining electrons injected through the tunnel dielectric 164 from the semiconductor layer 166, or erasing electrons trapped in the data storage layer 163, e.g., silicon nitride, depending on the operating conditions of a non-volatile memory device such as a flash memory device, or the like.

The example embodiments described above with reference to FIGS. 3, 4, 5A, and 5B, may be variously modified. Hereinafter, various modified examples will be of FIGS. 6A to 46.

Hereinafter, when various modified examples are of one or a plurality of drawings of FIGS. 6A to 46, the components described in the foregoing example embodiments may be directly cited without any further mention or explanation. Moreover, hereinafter, when various modified examples are of one or a plurality of drawings of FIGS. 6A to 46, the semiconductor device according to a modified example may be understood to include the components described in the foregoing example embodiments without any further mention. Thus, hereinafter, when various modified examples are of one or a plurality of drawings of FIGS. 6A to 46, overlapping contents or contents mentioned in the previous example embodiments may be omitted and a modified portion may be mainly described.

Figure 6A:
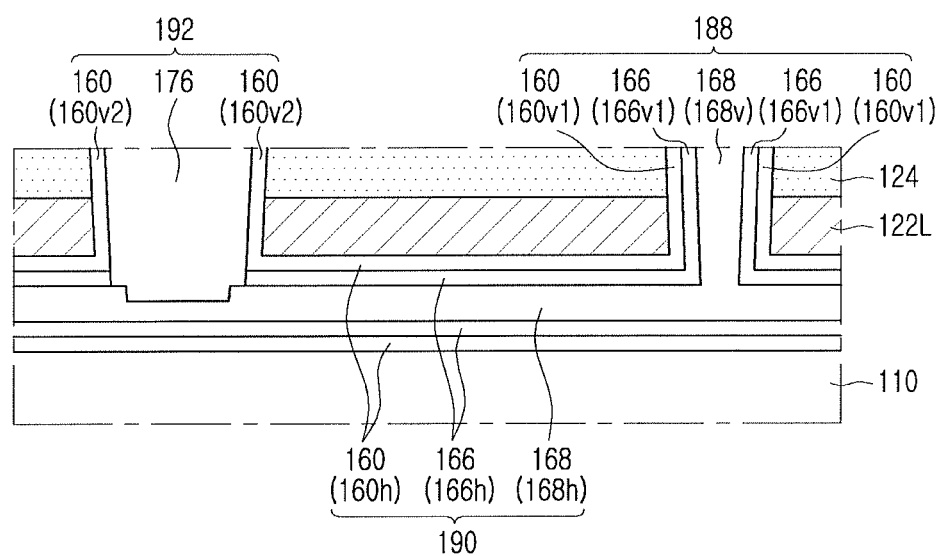
FIGS. 6A and 6B illustrate partially enlarged views illustrating a modified example of a three-dimensional semiconductor device according to an example embodiment.
Figure 6B:
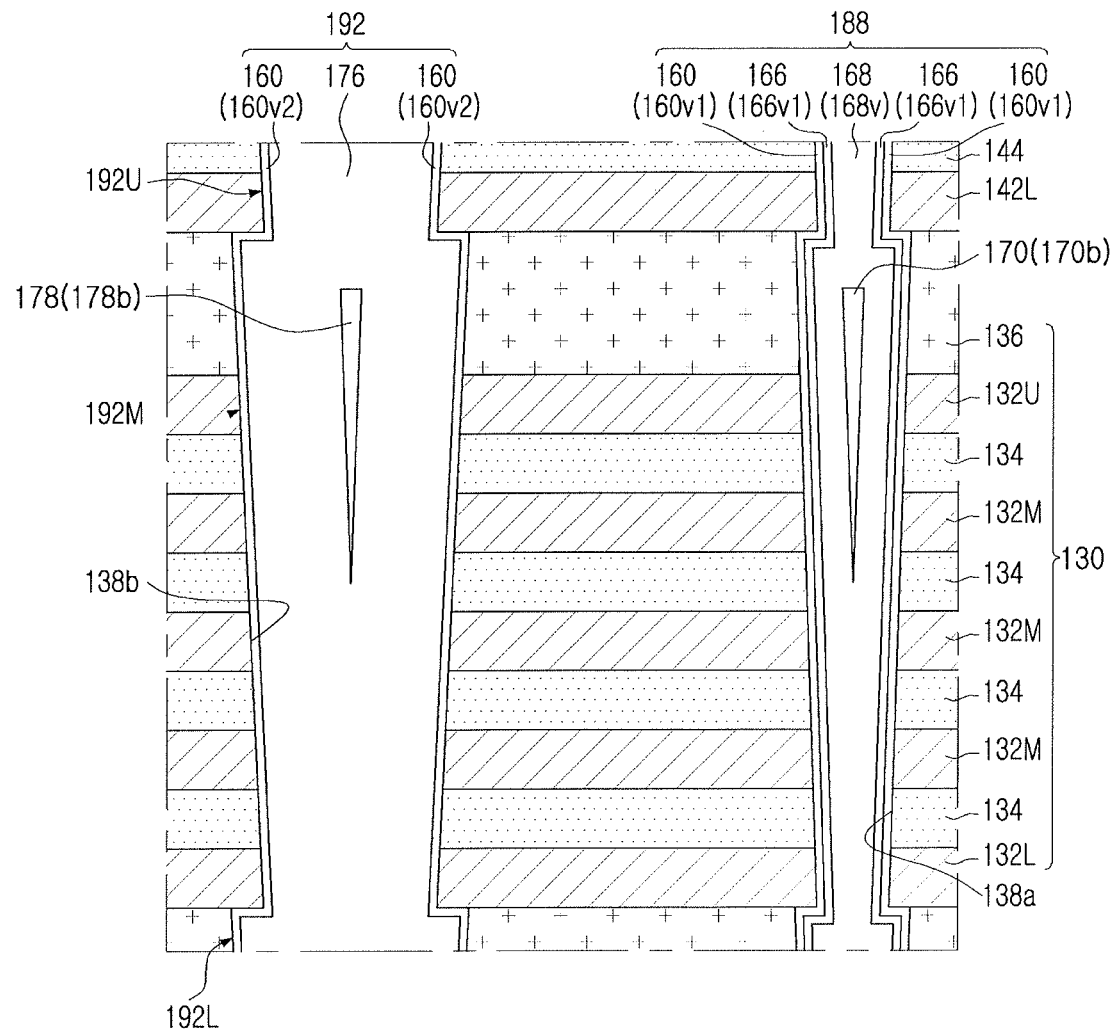
Figure 7:
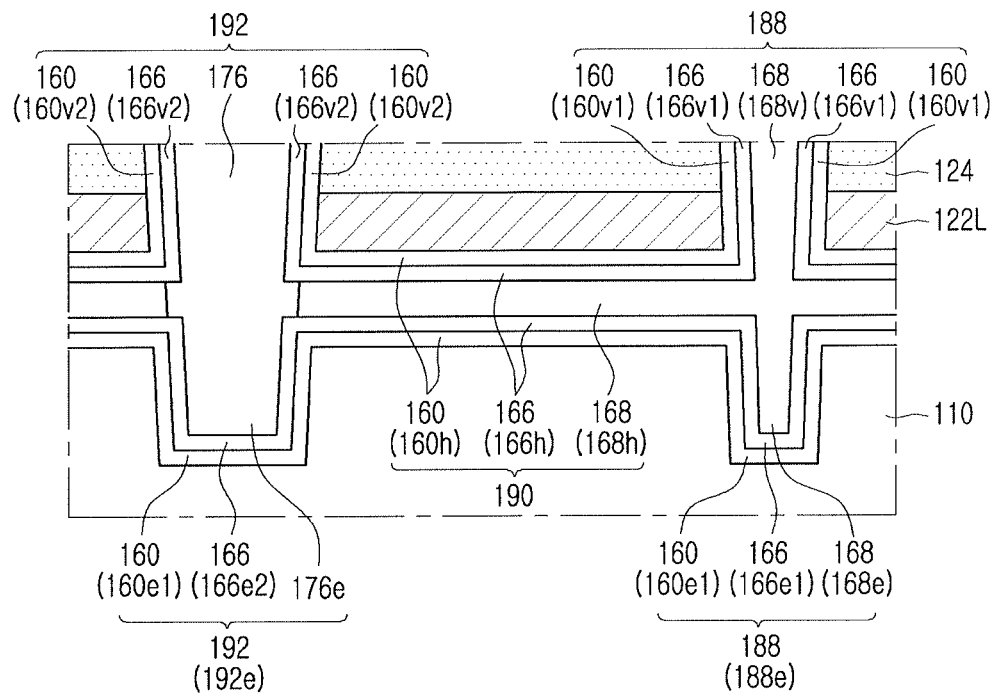
FIG. 7 illustrates a partially enlarged view illustrating a modified example of a three-dimensional semiconductor device according to an example embodiment.
Figure 8:
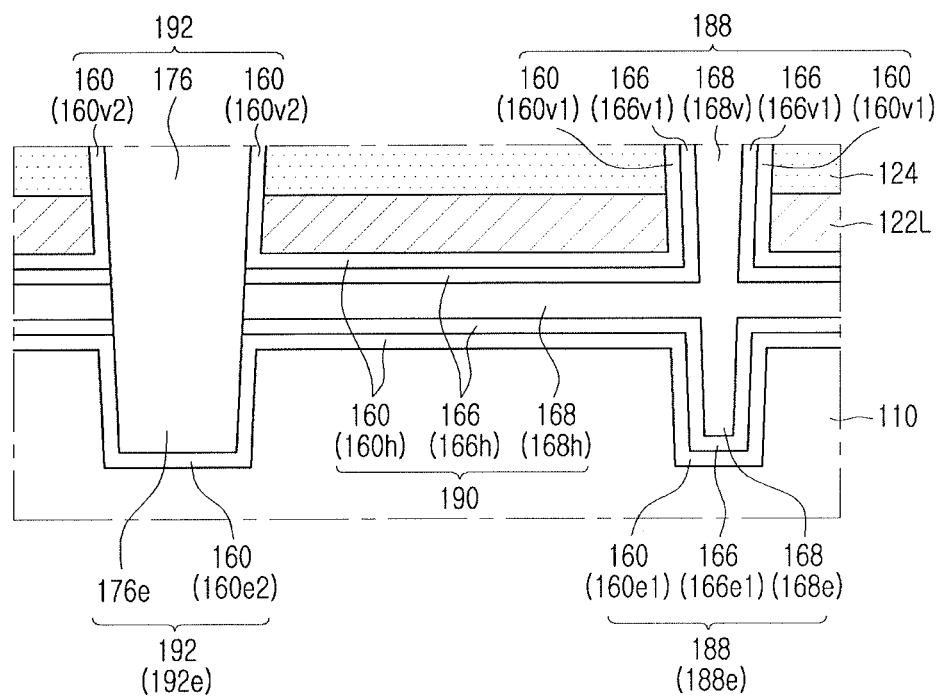
FIG. 8 illustrates a partially enlarged view illustrating a modified example of a three-dimensional semiconductor device according to an example embodiment.
Figure 9:
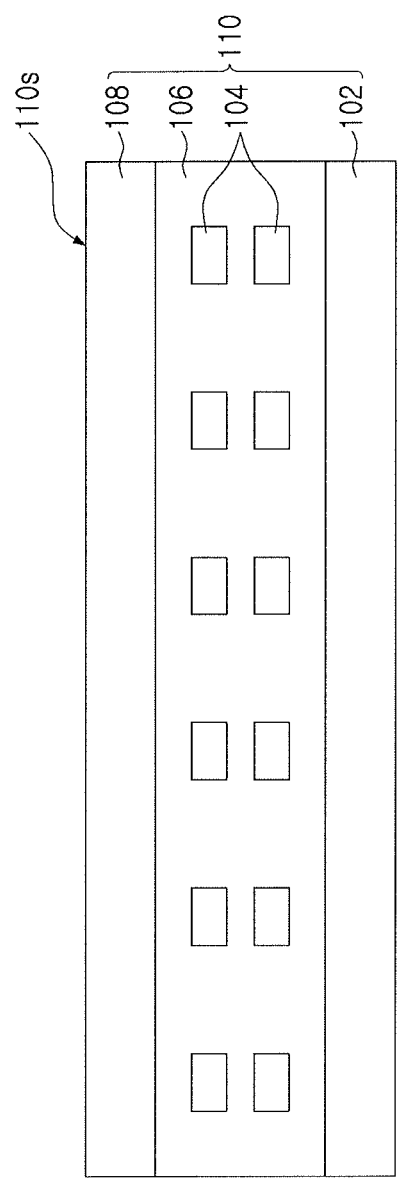
FIG. 9 illustrates a partially enlarged view illustrating a modified example of a three-dimensional semiconductor device according to an example embodiment.
Figure 13:
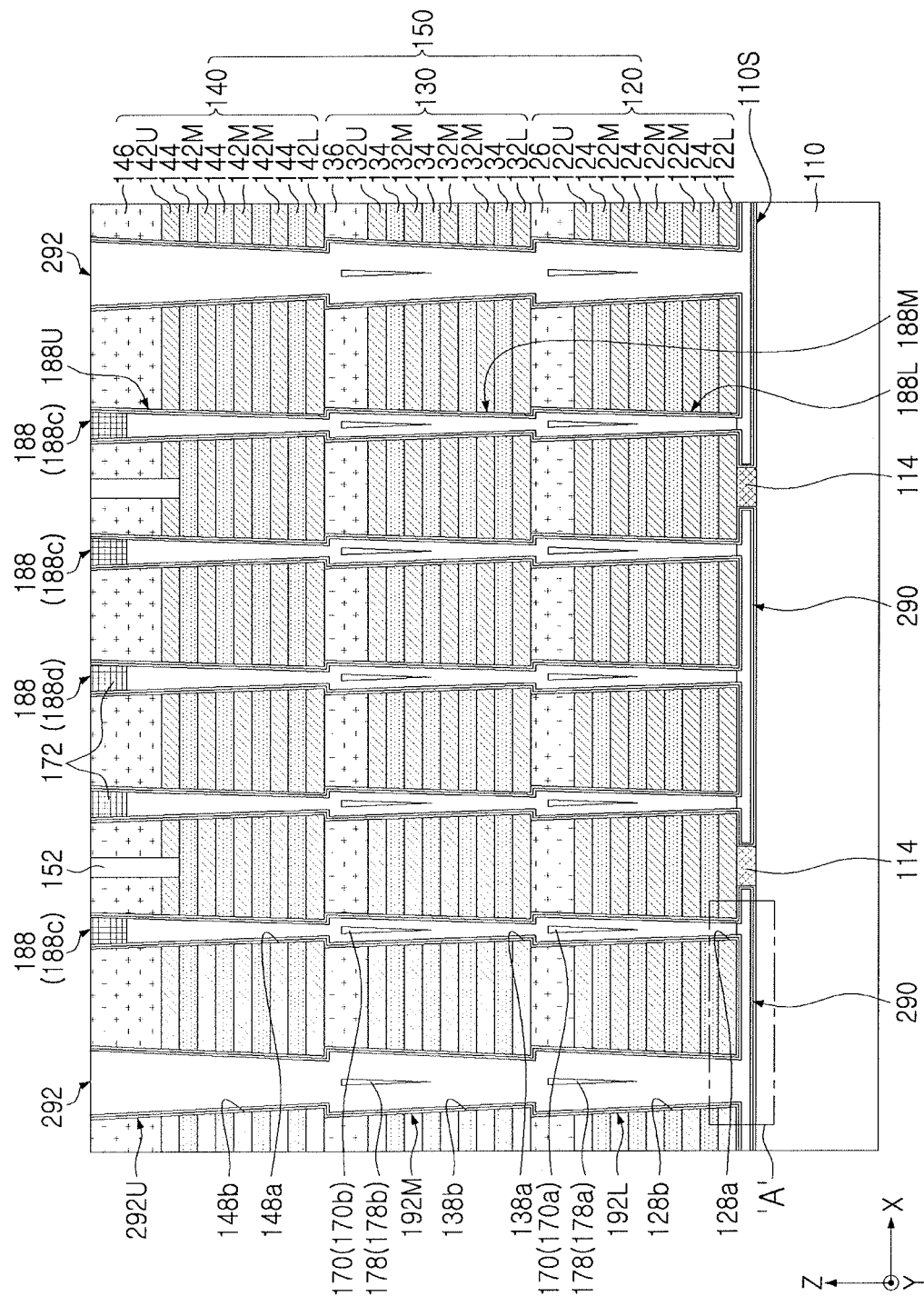
FIG. 13 illustrates a cross-sectional view of a modified example of a three-dimensional semiconductor device according to an example embodiment.
Figure 14:
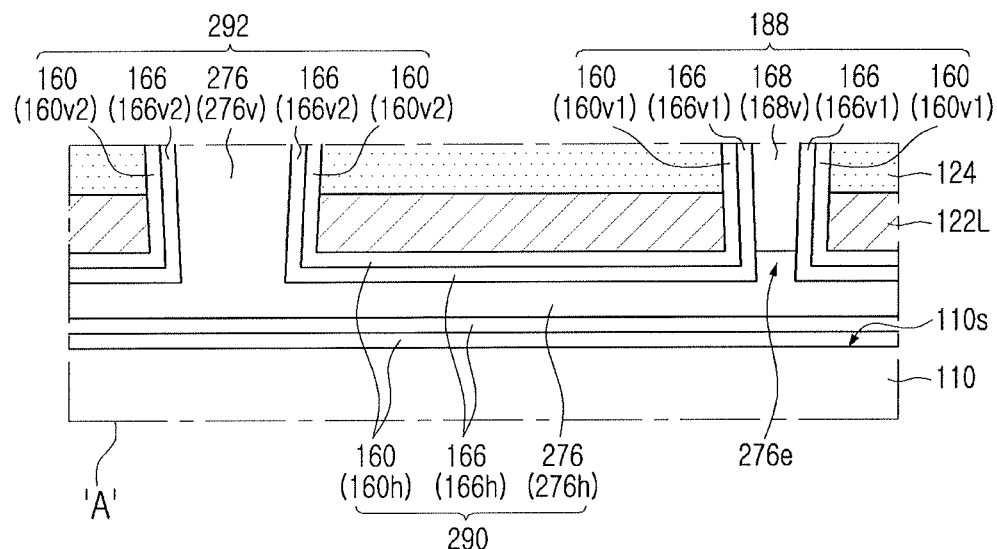
FIG. 14 illustrates a partially enlarged view enlarging the portion of FIG. 13.
Figure 15:
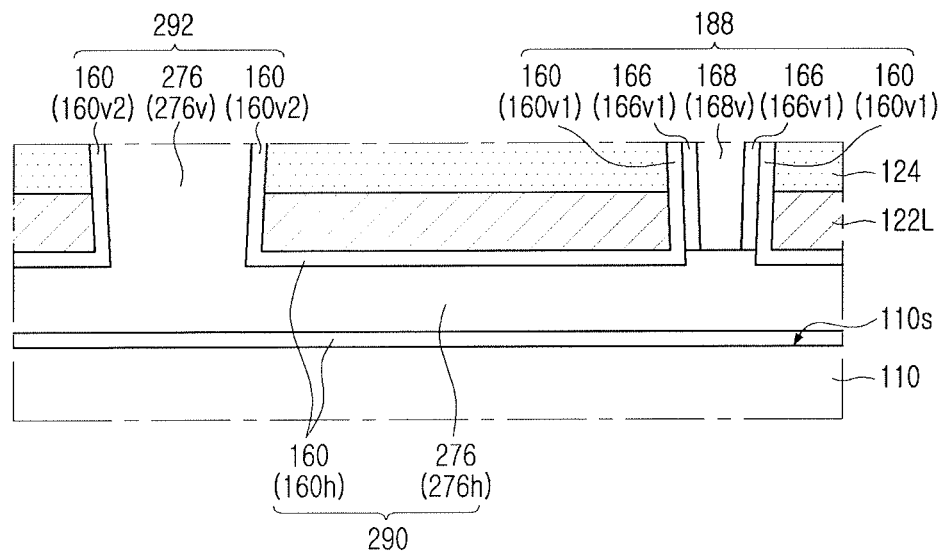
FIG. 15 illustrates a partially enlarged view illustrating a modified example of a three-dimensional semiconductor device according to an example embodiment.
Figure 16:
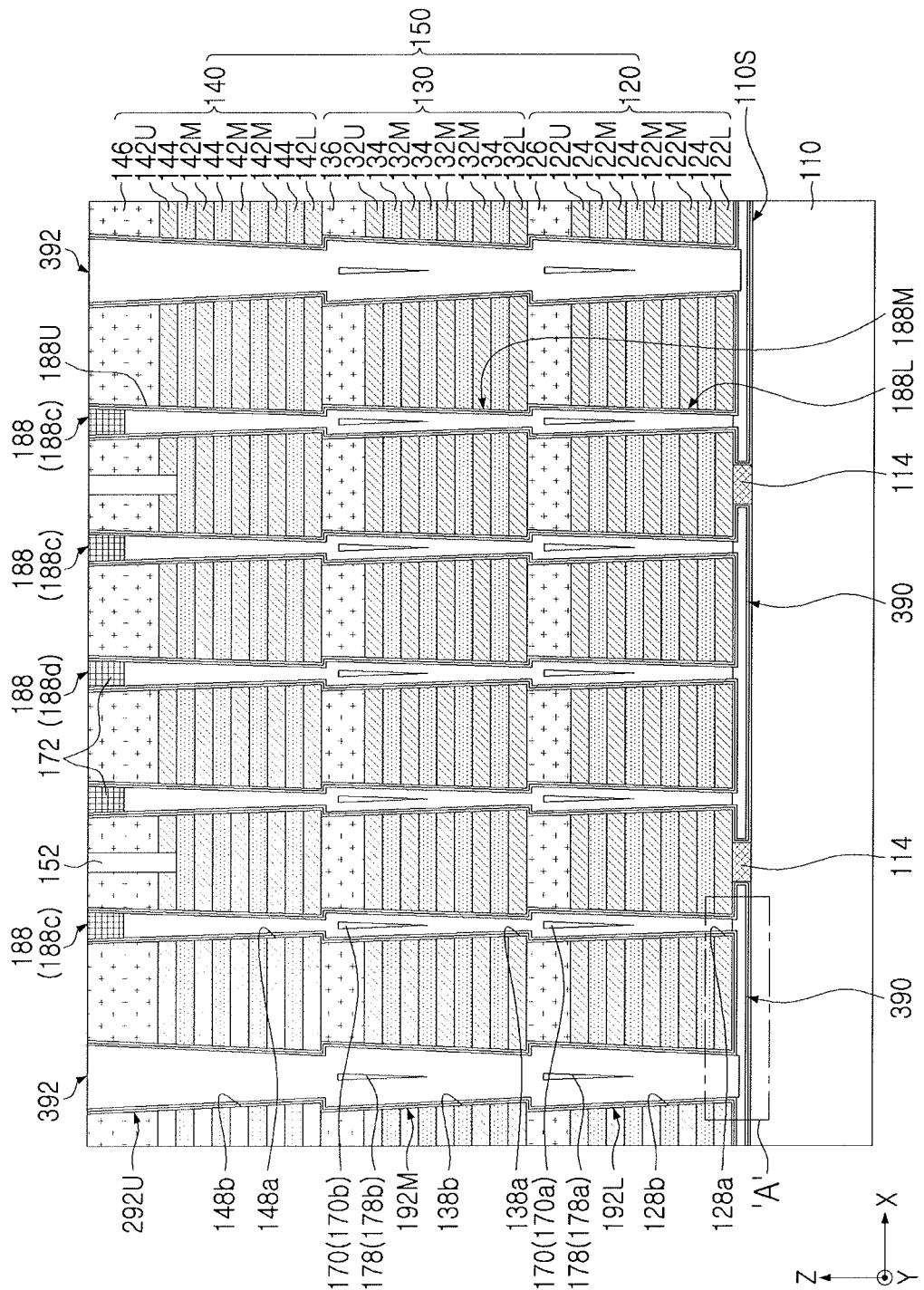
FIG. 16 illustrates a cross-sectional view of a modified example of a three-dimensional semiconductor device according to an example embodiment.
Figure 17:
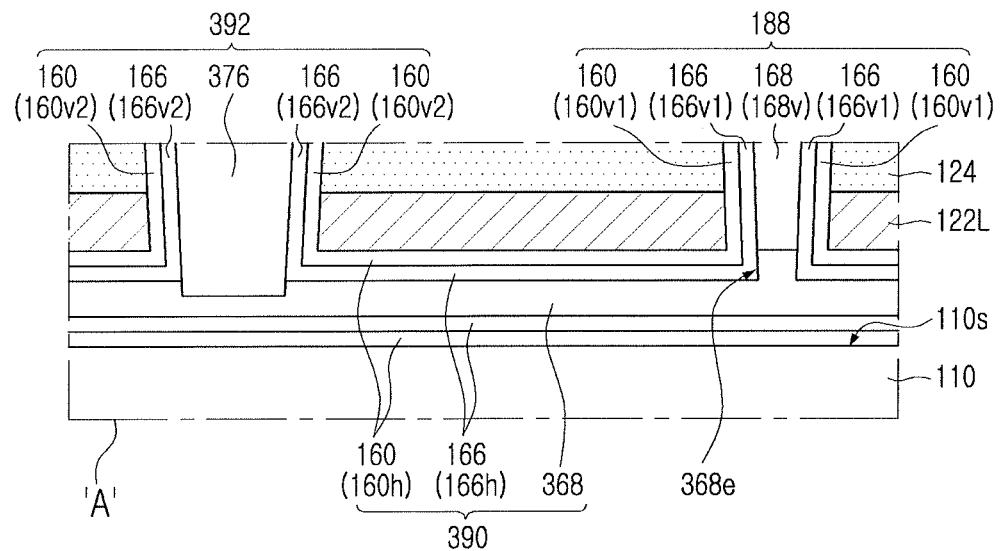
FIG. 17 illustrates a partially enlarged view enlarging the portion of FIG. 16.
Figure 18:
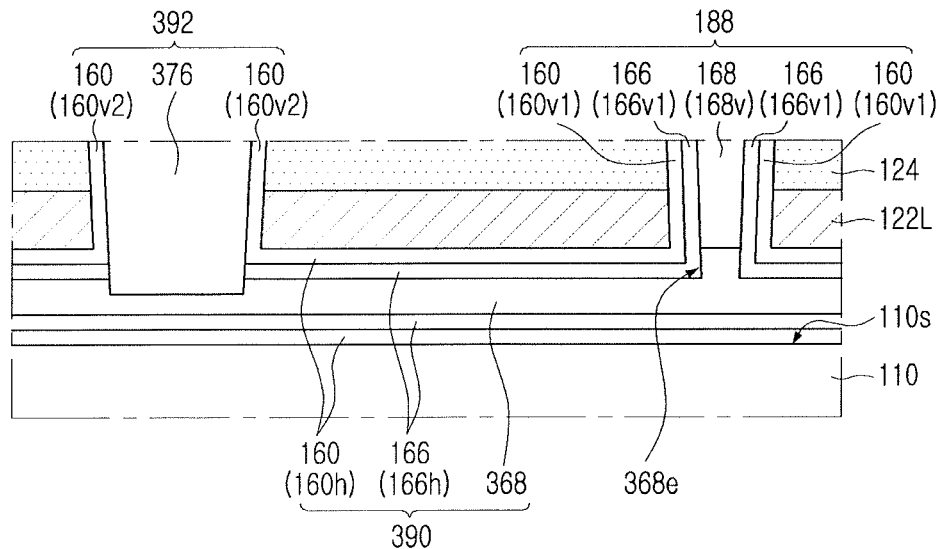
FIGS. 18 and 19 each illustrate a partially enlarged view illustrating a modified example of a three-dimensional semiconductor device according to an example embodiment.
Figure 19:
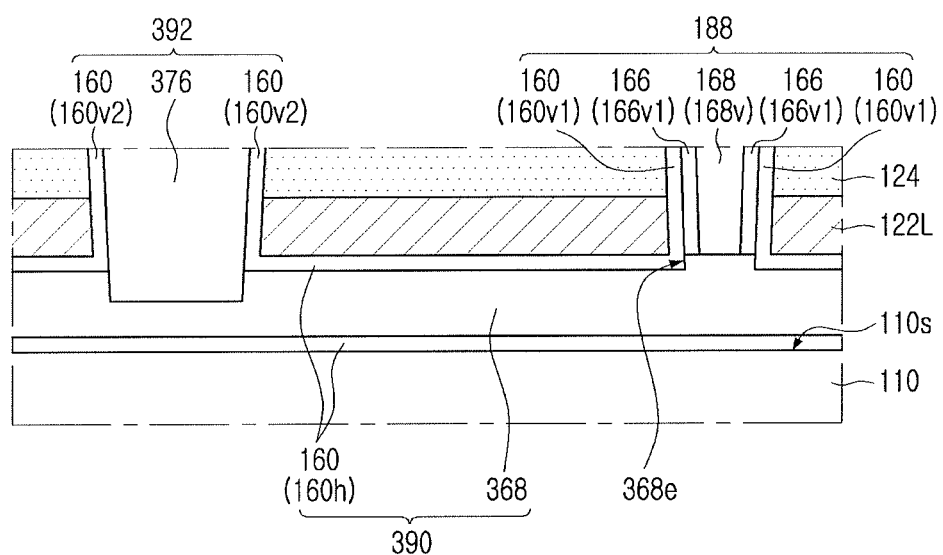
Figure 20:
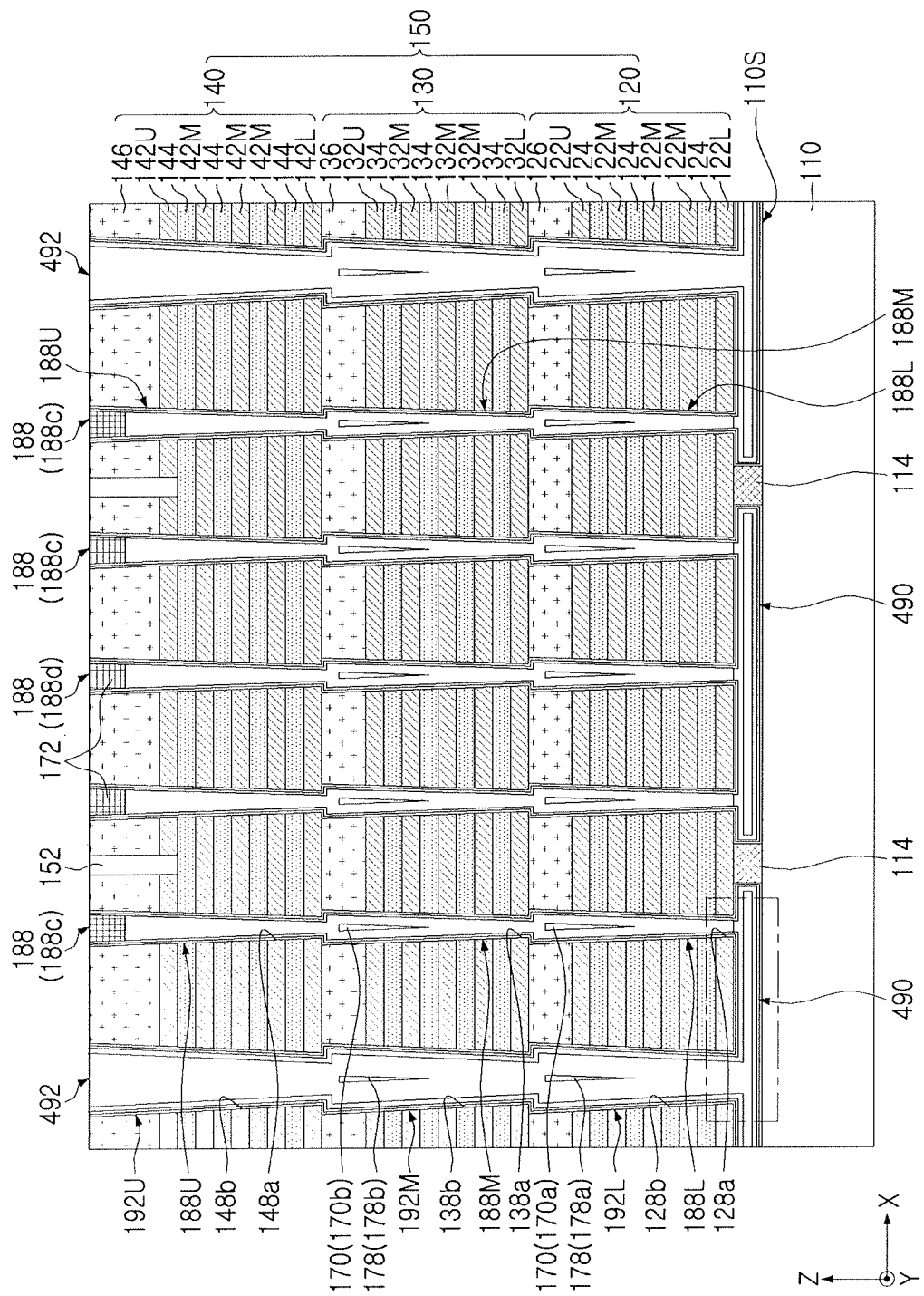
FIG. 20 illustrates a cross-sectional view of a modified example of a three-dimensional semiconductor device according to an example embodiment.
Figure 21:
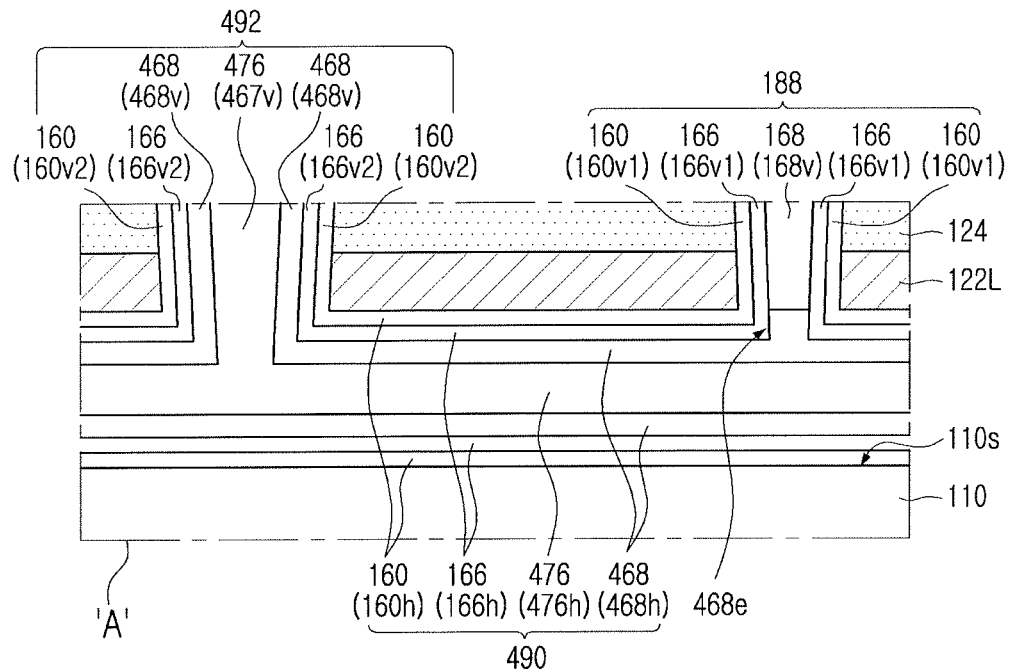
FIG. 21 illustrates a partially enlarged view enlarging the portion of FIG. 20.
Figure 22:
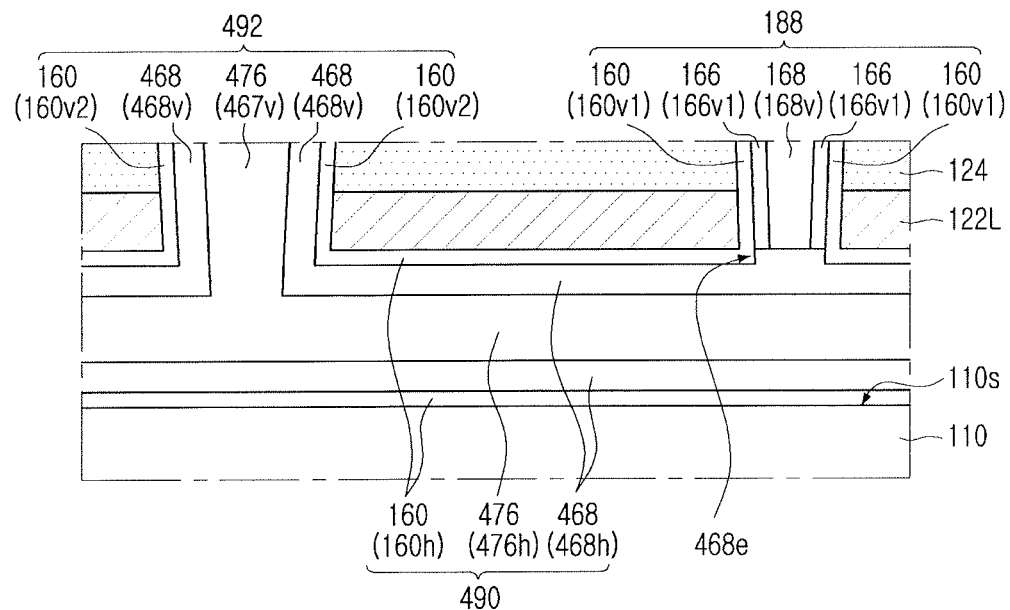
FIGS. 22 to 24 each illustrate a partially enlarged view illustrating a modified example of a three-dimensional semiconductor device according to an example embodiment.
Figure 23:
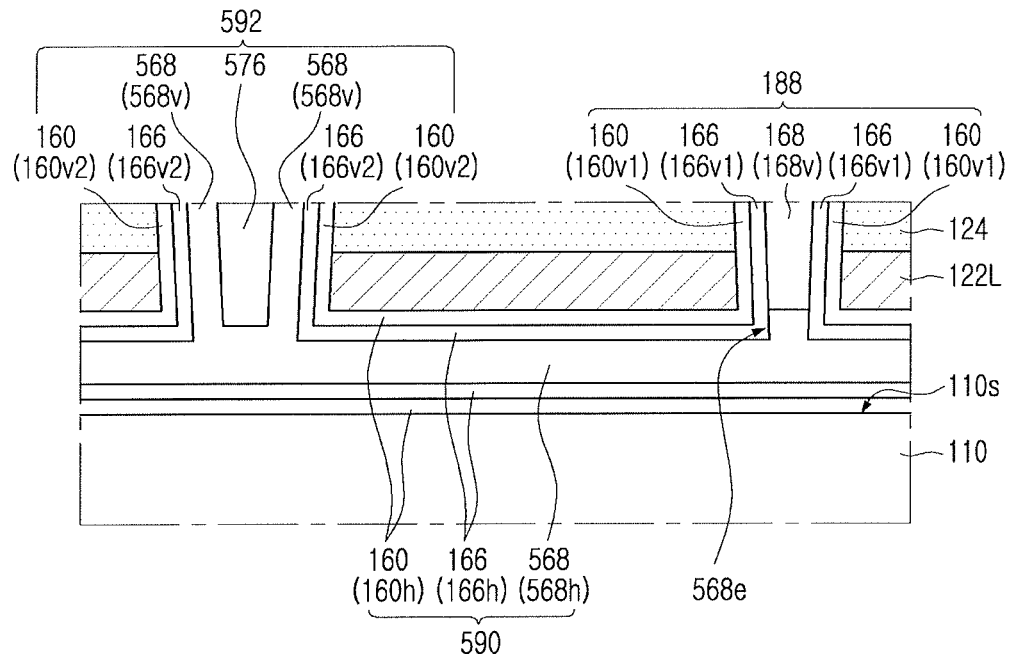
Figure 24:
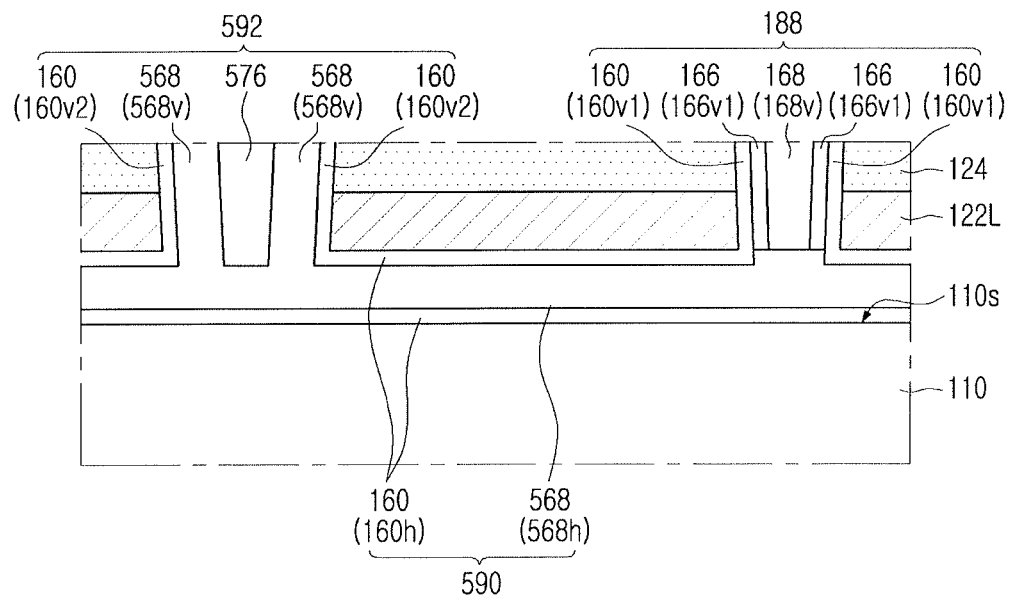
Figure 25:
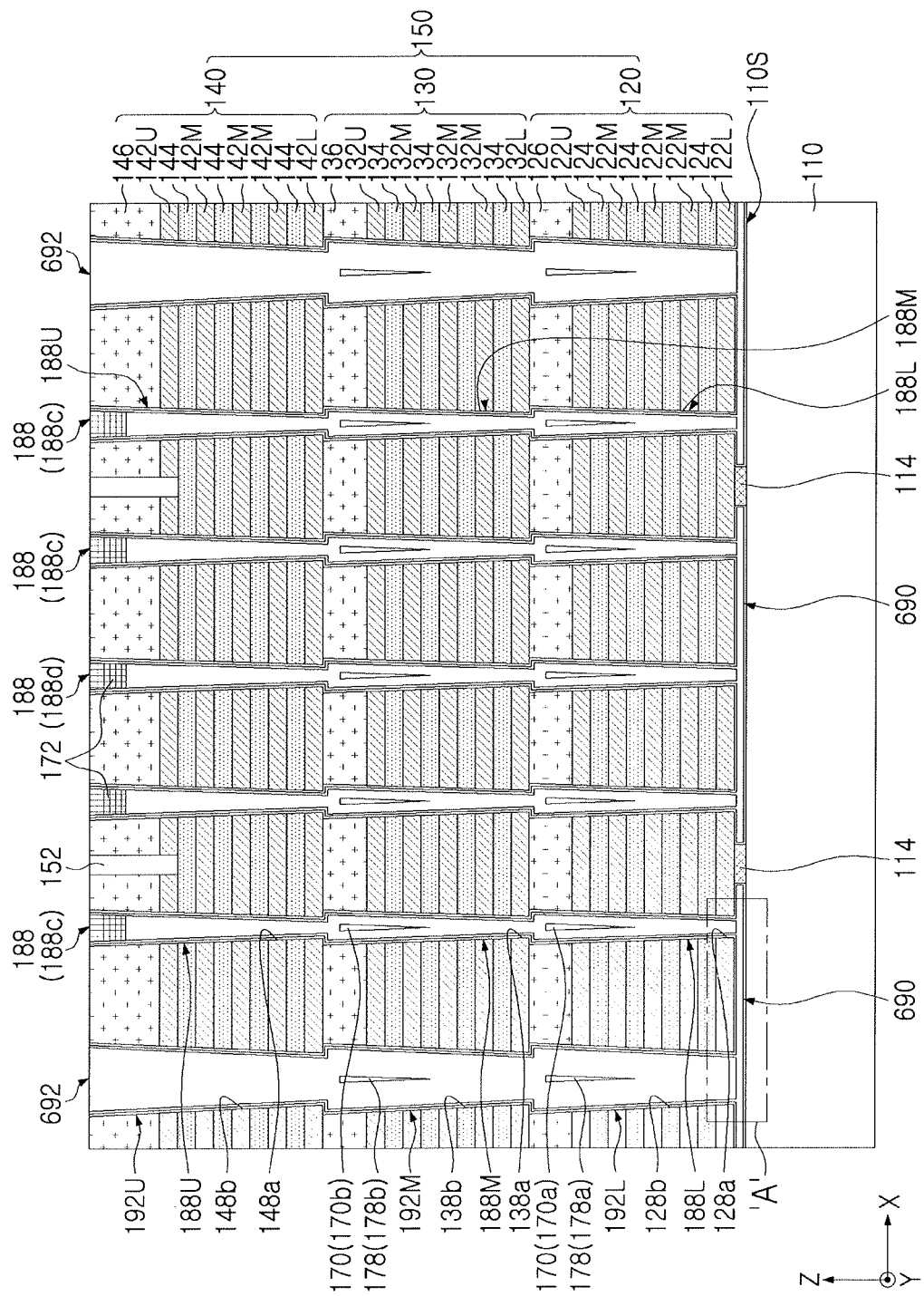
FIG. 25 illustrates a cross-sectional view of a modified example of a three-dimensional semiconductor device according to an example embodiment.
Figure 26:
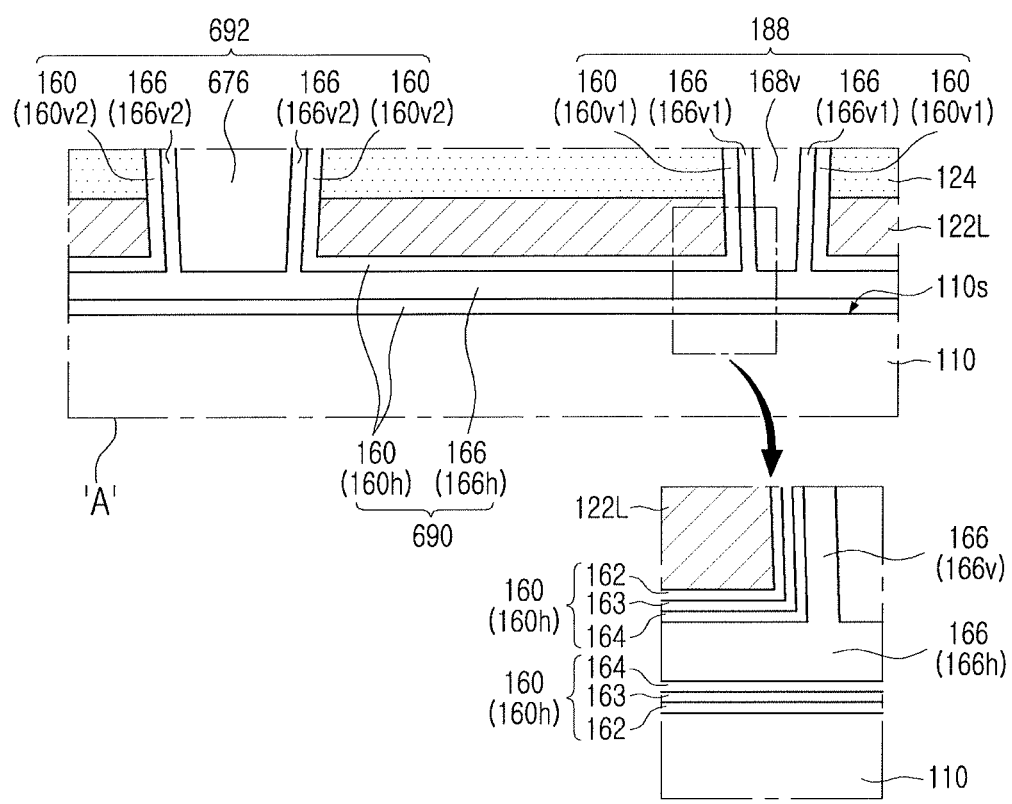
FIG. 26 illustrate a partially enlarged view enlarging the portion of FIG. 25.
Figure 27:
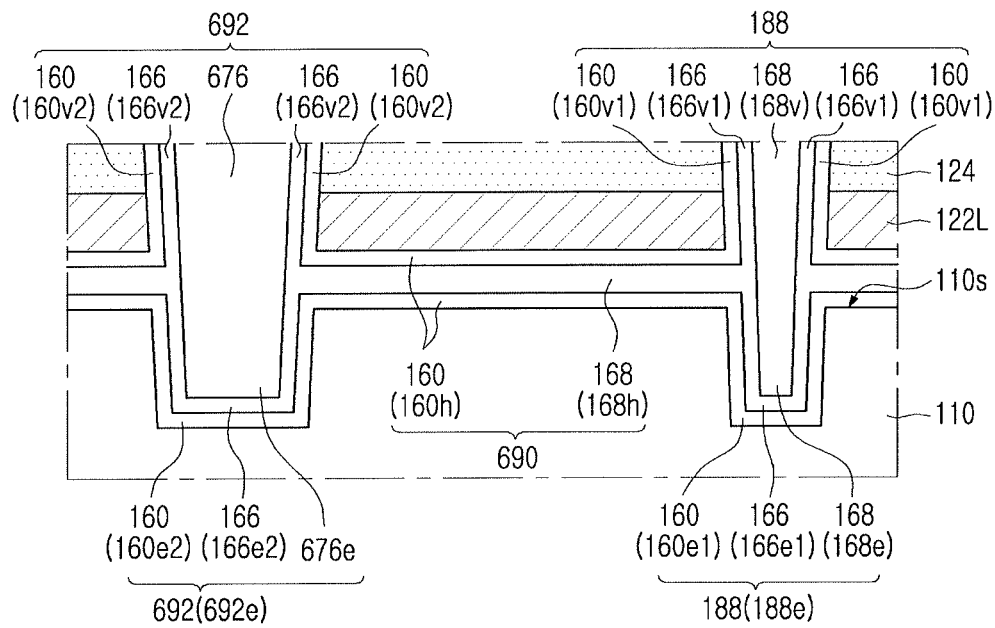
FIGS. 27 and 28 each illustrate a partially enlarged view illustrating a modified example of a three-dimensional semiconductor device according to an example embodiment.
Figure 28:
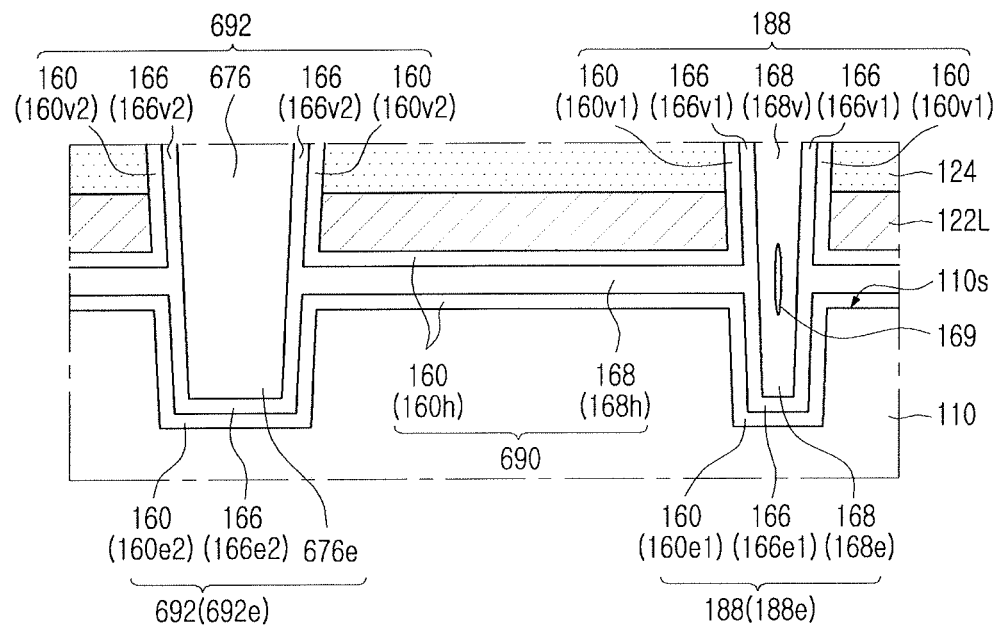
Figure 29:
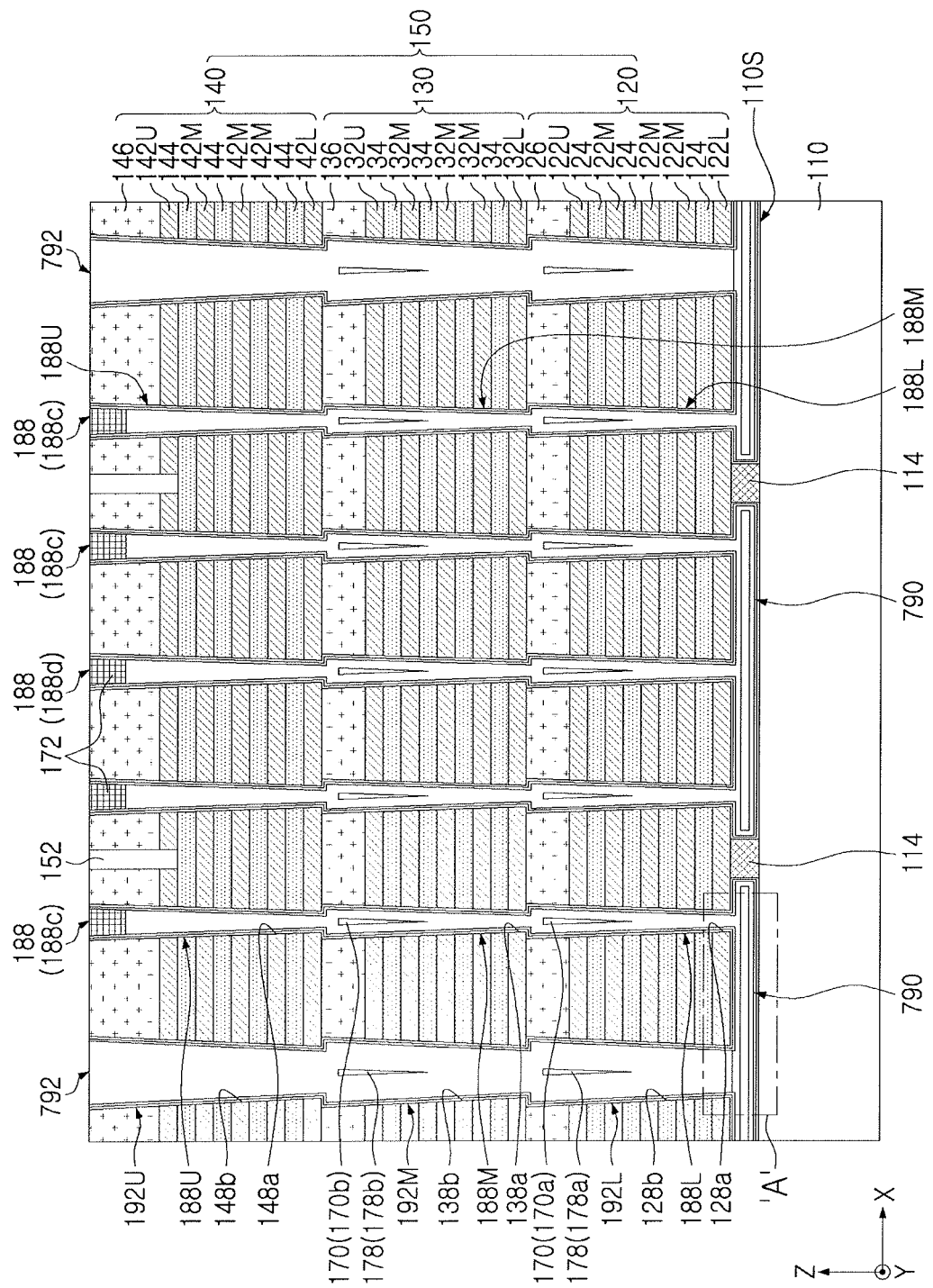
FIG. 29 illustrates a cross-sectional view of a modified example of a three-dimensional semiconductor device according to an example embodiment.
Figure 30:
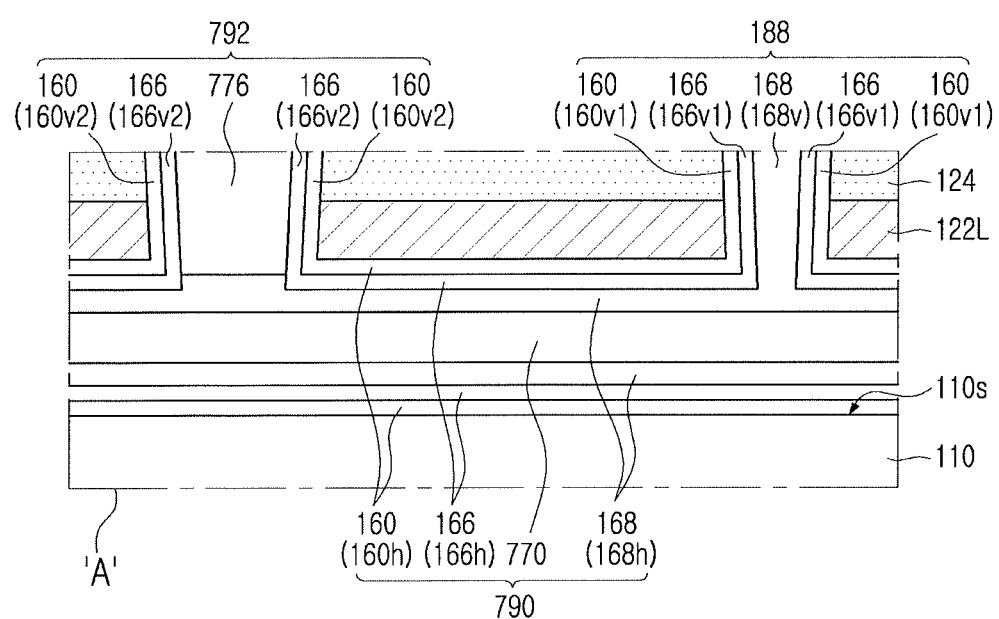
FIG. 30 illustrates a partially enlarged view enlarging the portion of FIG. 29.
Figure 31:
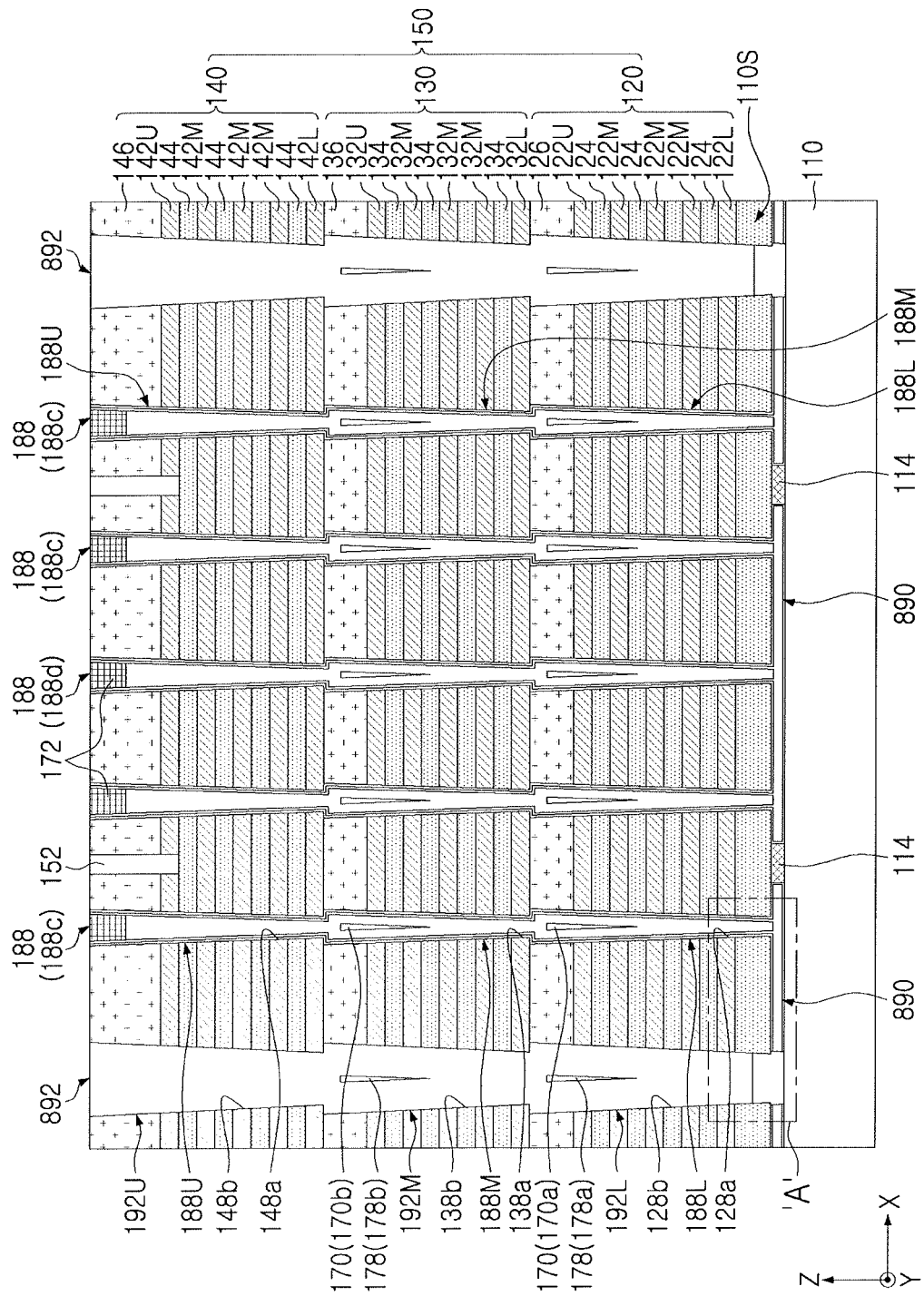
FIG. 31 illustrates a cross-sectional view of a modified example of a three-dimensional semiconductor device according to an example embodiment.
Figure 32:
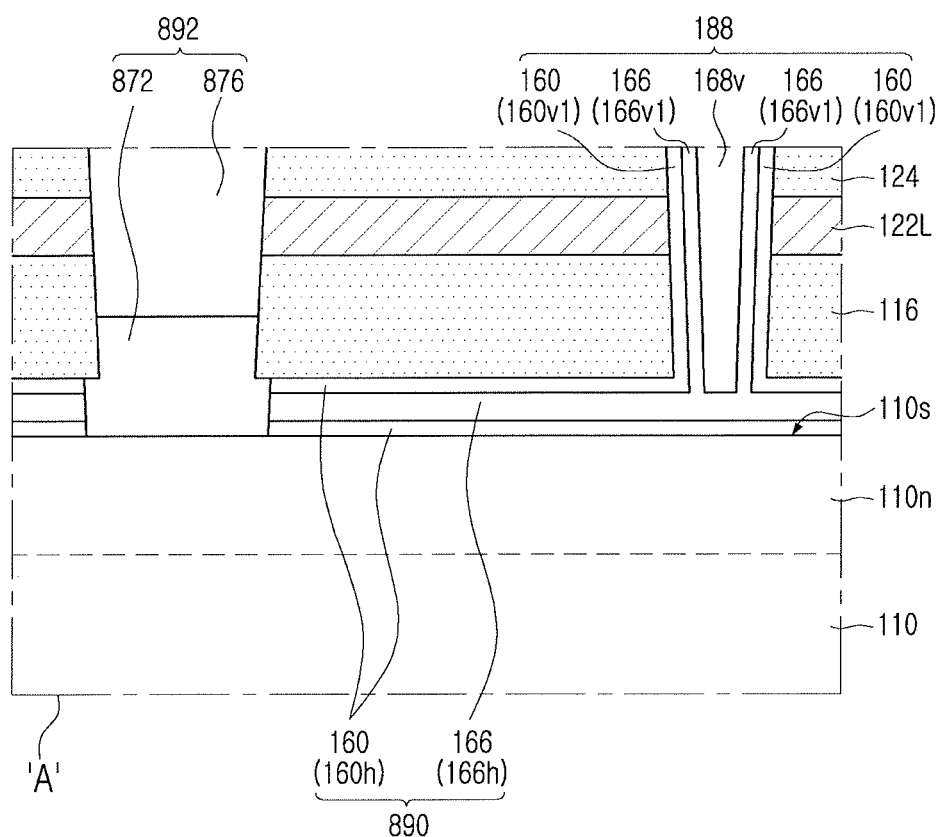
FIG. 32 illustrates a partially enlarged view enlarging the portion of FIG. 29.
Figure 33:
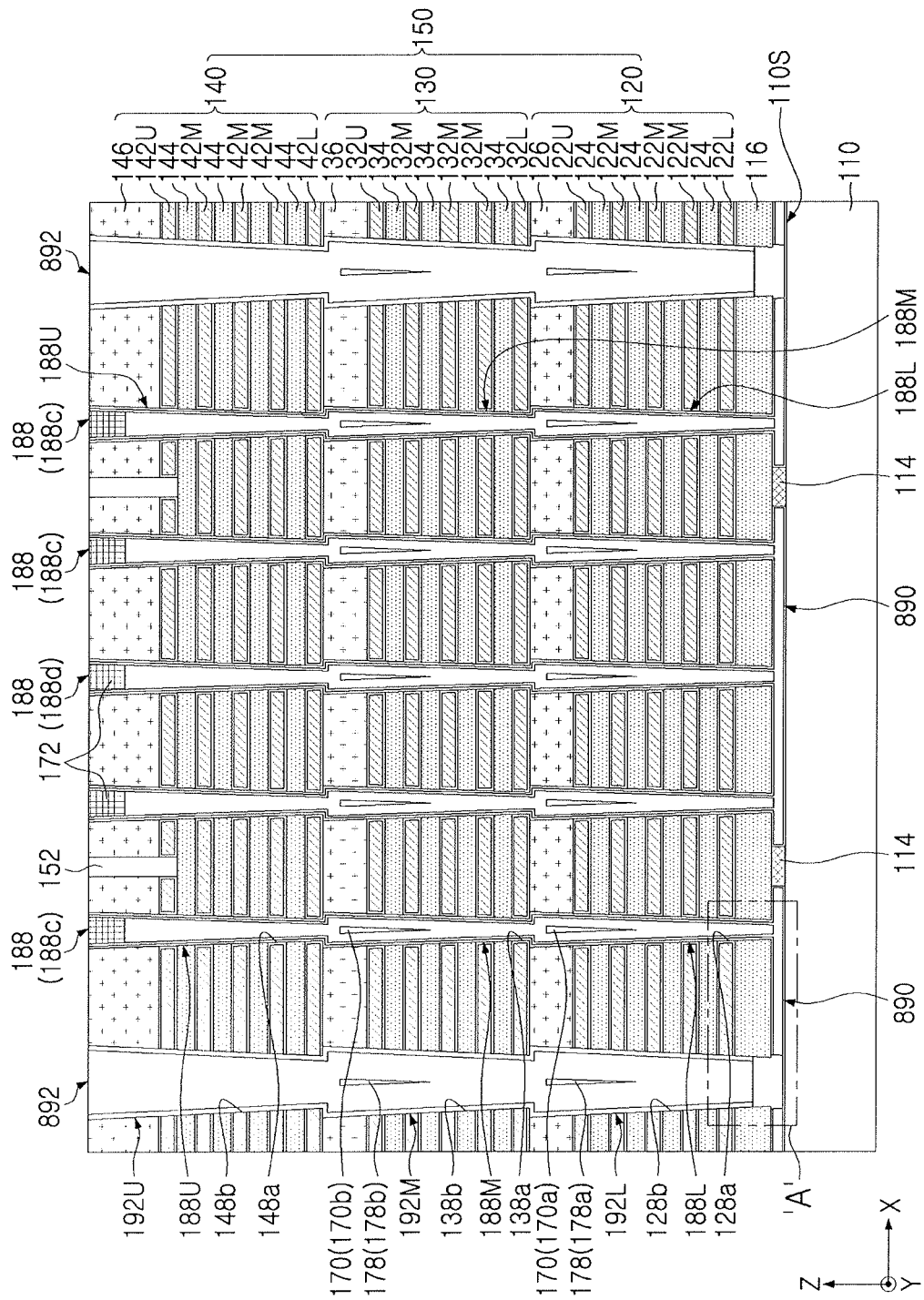
FIG. 33 illustrates a cross-sectional view of a modified example of a three-dimensional semiconductor device according to an example embodiment.
Figure 34:
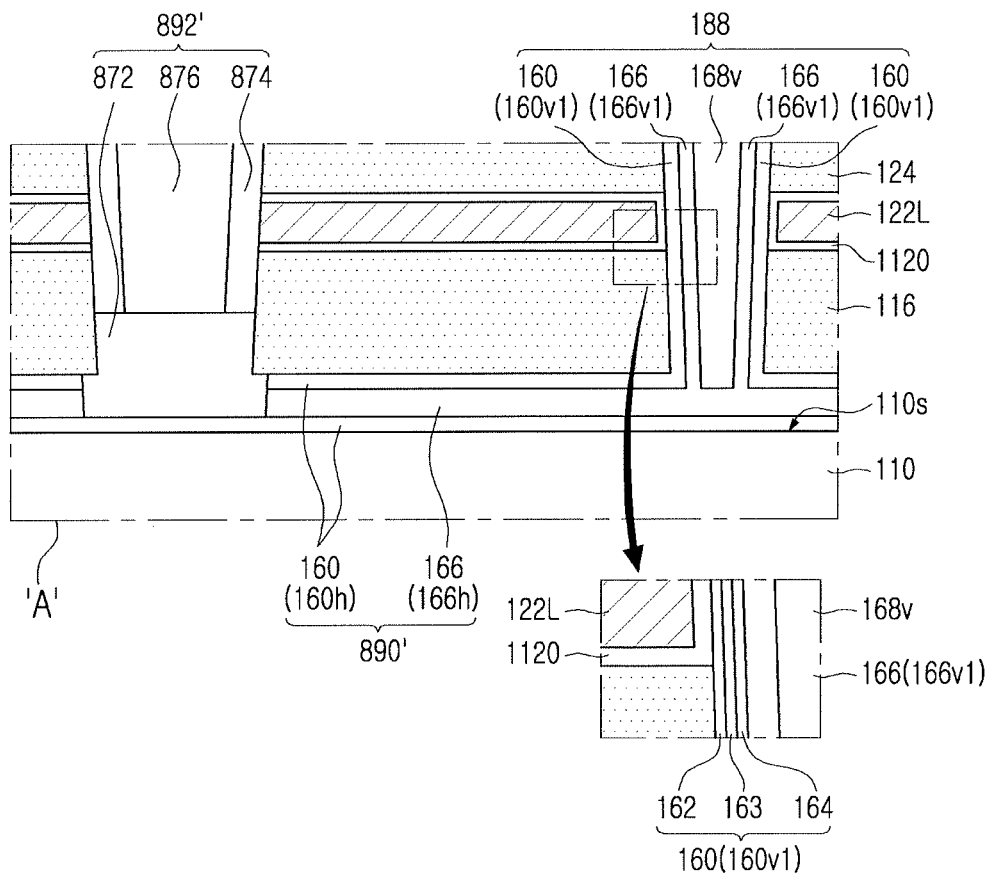
FIG. 34 illustrates a partially enlarged view enlarging the portion of FIG. 33.
Figure 36:
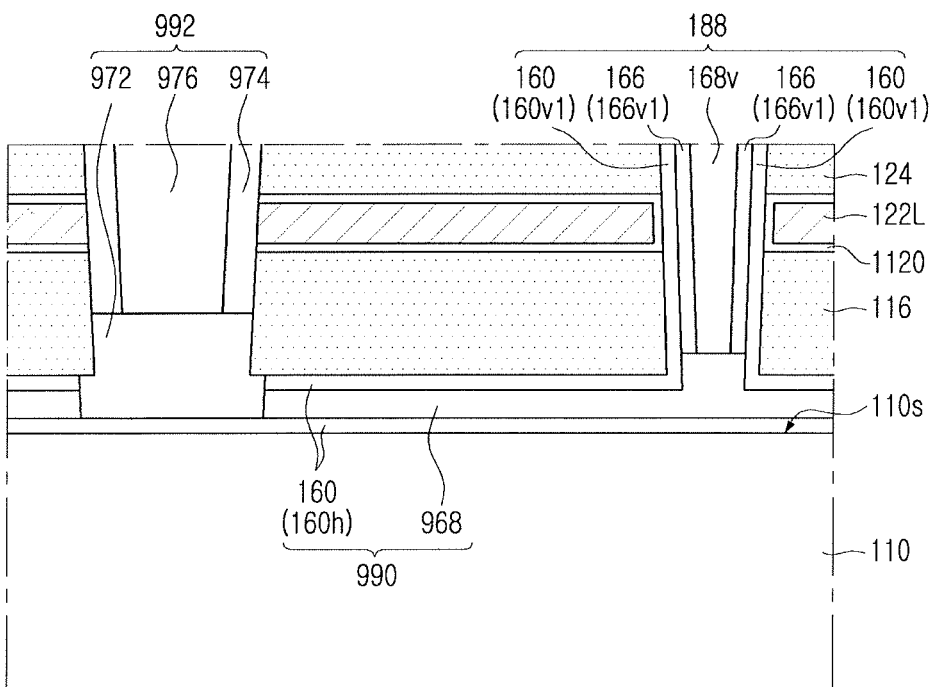
Figure 37:
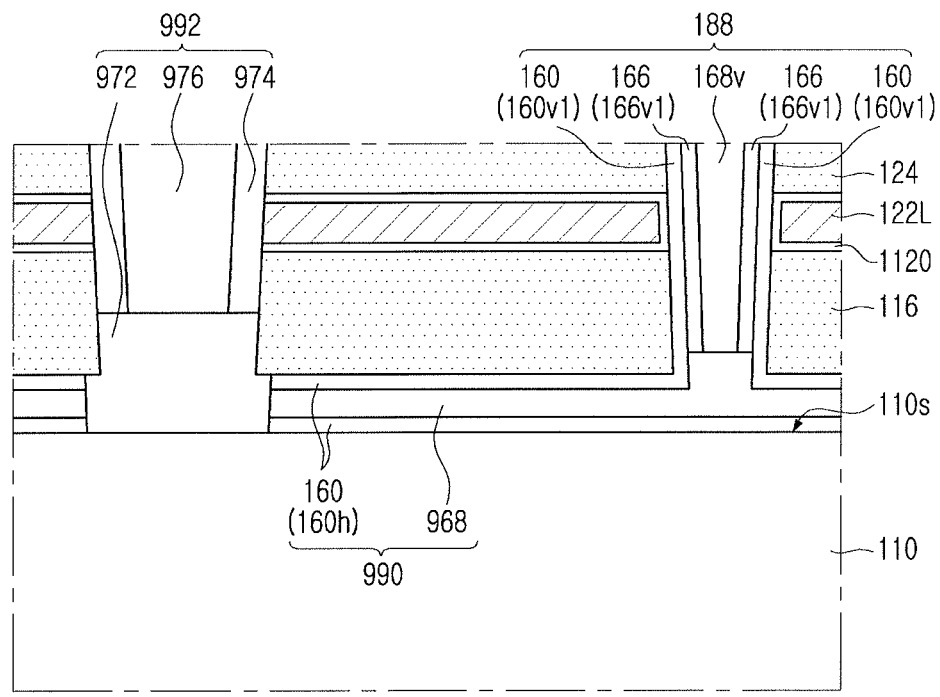
Figure 38:
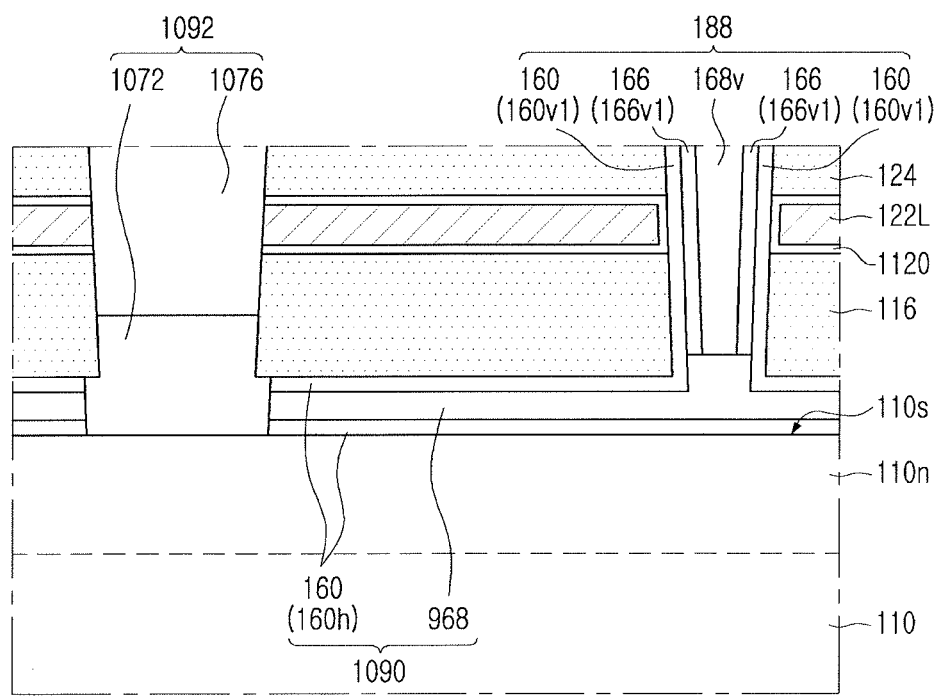
Figure 39:
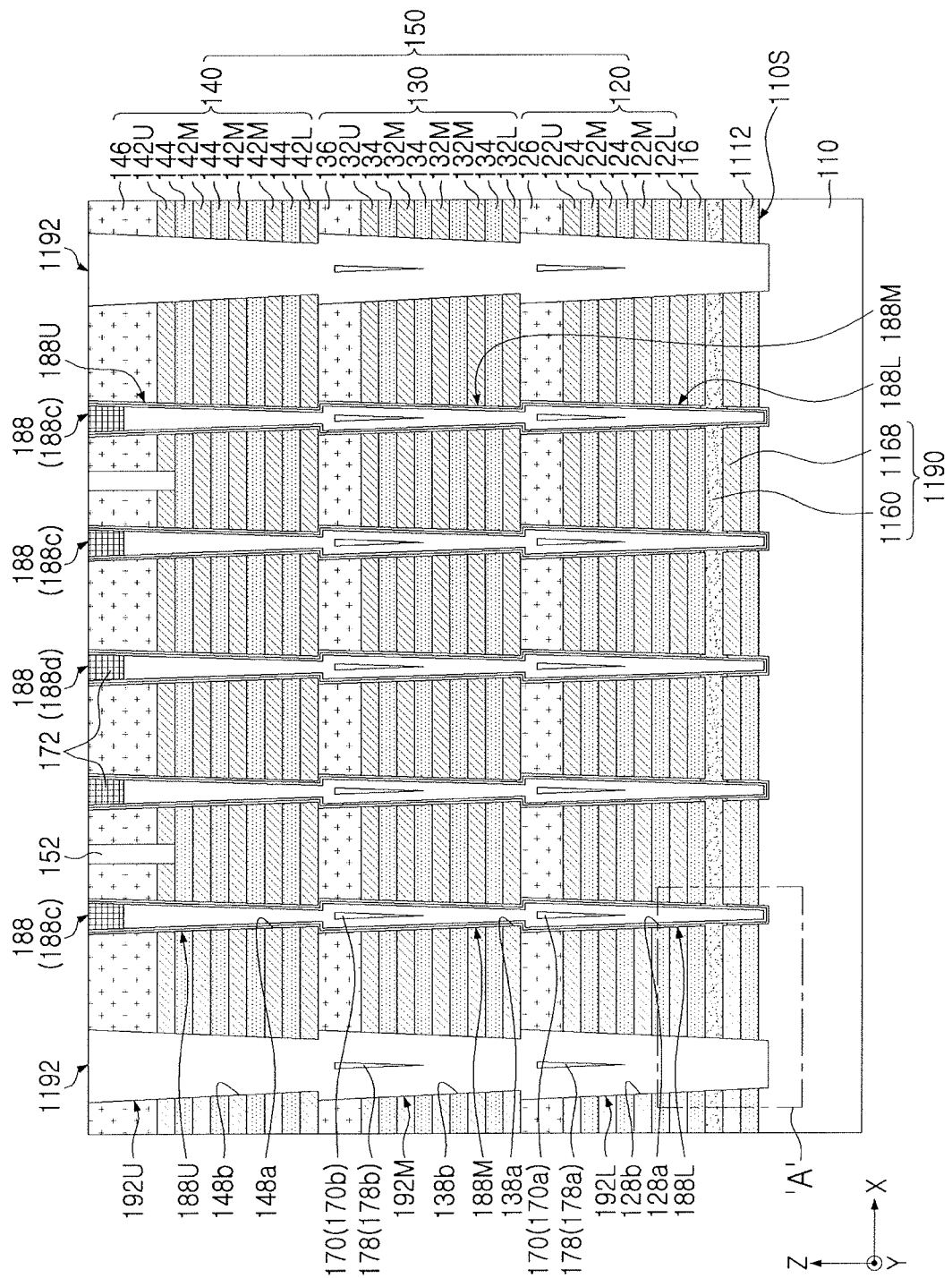
FIGS. 39 and 41 illustrate cross-sectional views of a modified example of a three-dimensional semiconductor device according to an example embodiment.
Figure 40:
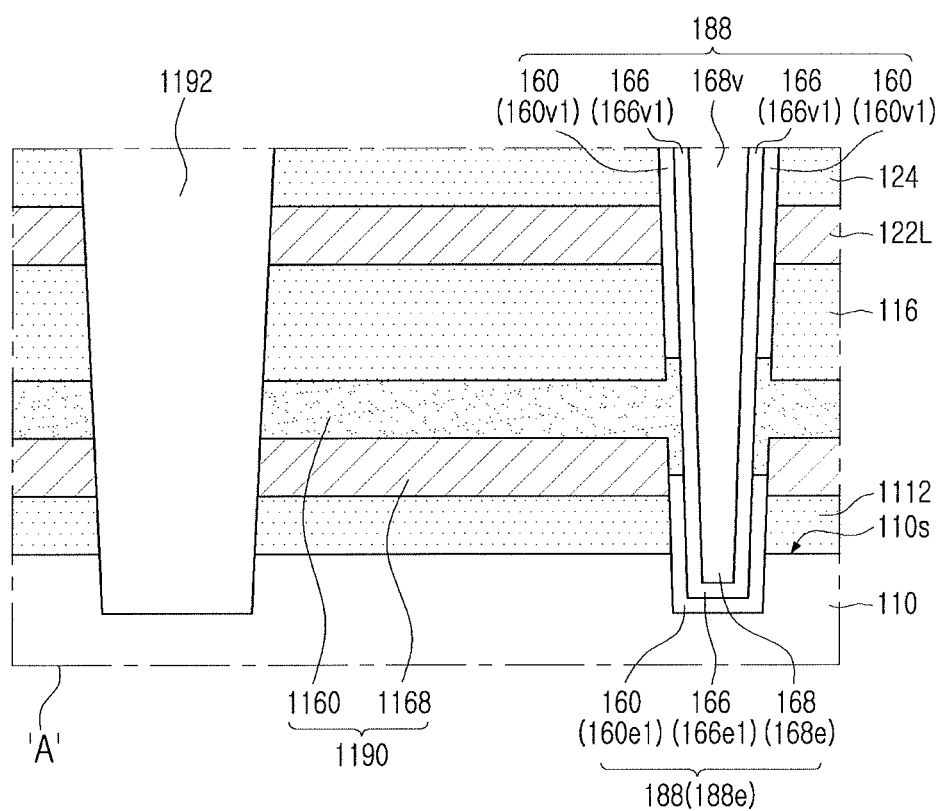
FIG. 40 illustrates a partially enlarged view enlarging the portion of FIG. 38.
Figure 41:
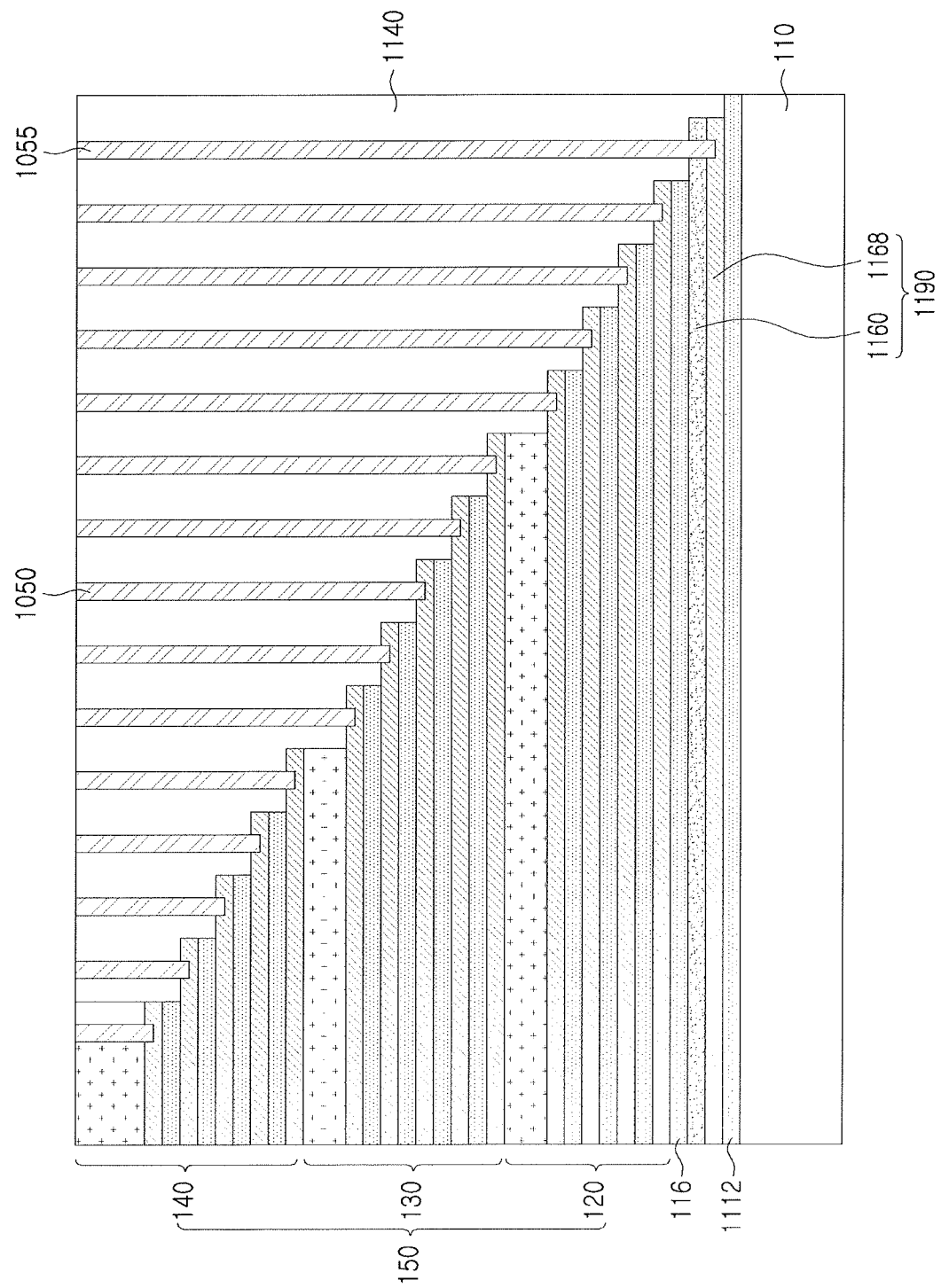

FIG. 6A illustrates a partially enlarged view corresponding to a portion indicated by 'A' of FIG. 4, FIG. 6B illustrates a partially enlarged view corresponding to a portion indicated by 'B' of FIG. 4, FIGS. 7 and 8 illustrate partially enlarged views corresponding to a portion indicated by 'A' of FIG. 4, FIG. 9 illustrates a cross-sectional view of a modified example of the lower structure 110 of FIG. 9, described above, FIGS. 10, 11, 12A, 12B, and 12C illustrate cross-sectional views of modified examples of a three-dimensional semiconductor device according to an example embodiment, FIG. 13 illustrates a cross-sectional view of a modified example of a three-dimensional semiconductor device according to an example embodiment, FIG. 14 illustrates a partially enlarged view of a portion indicated by 'A' of FIG. 13, FIG. 15 illustrates a partially enlarged view illustrating the modified example of FIG. 14, FIG. 16 illustrates a cross-sectional view of a modified example of a three-dimensional semiconductor device according to an example embodiment, FIG. 17 illustrates a partially enlarged view of a portion indicated by 'A' of FIG. 16, each of FIGS. 18 and 19 illustrates a partially enlarged view illustrating of the modified example of FIG. 17, FIG. 20 illustrates a cross-sectional view of a modified example of a three-dimensional semiconductor device according to an example embodiment, FIG. 21 illustrates a partially enlarged view of a portion indicated by 'A' of FIG. 20, each of FIGS. 22 to 24 illustrates a partially enlarged view illustrating the modified example of FIG. 21, FIG. 25 illustrates a cross-sectional view of a modified example of a three-dimensional semiconductor device according to an example embodiment, FIG. 26 illustrates a partially enlarged view of a portion indicated by 'A' of FIG. 25, each of FIGS. 27 and 28 illustrates a partially enlarged view illustrating the modified example of FIG. 26, FIG. 29 illustrates a cross-sectional view of a modified example of a three-dimensional semiconductor device according to an example embodiment, FIG. 30 illustrates a partially enlarged view of a portion indicated by 'A' of FIG. 29, FIG. 31 illustrates a cross-sectional view of a modified example of a three-dimensional semiconductor device according to an example embodiment, FIG. 32 illustrates a partially enlarged view of a portion indicated by 'A', FIG. 33 illustrates a cross-sectional view of a modified example of a three-dimensional semiconductor device according to an example embodiment, FIG. 34 illustrates a partially enlarged view of a portion indicated by 'A' of FIG. 33, each of FIGS. 35 to 38 illustrates a partially enlarged view illustrating the modified example of FIG. 38, FIGS. 39 and 41 illustrate cross-sectional views of a modified example of a three-dimensional semiconductor device according to an example embodiment, FIG. 40 illustrates a partially enlarged view of a portion indicated by 'A' of FIG. 38, each of FIGS. 42 and 43 is partially enlarged view illustrating the modified example of FIG. 40, FIGS. 44A and 44C illustrate cross-sectional views of a modified example of a three-dimensional semiconductor device according to an example embodiment, FIG. 44B illustrates a partially enlarged view of a portion indicated by 'A' of FIG. 44A, FIG. 45 illustrates a cross-sectional view of a modified example of a three-dimensional semiconductor device according to an example embodiment, and FIG. 46 illustrates a partially enlarged view of a portion indicated by 'A' of FIG. 45.

In a modified example, referring to FIGS. 6A and 6B, the separation structures 192 may include a separation core pattern 176 directly in contact with the separation dielectric 160v2, and in which a separation semiconductor layer (166v2 of FIGS. 4, 5A, and 5B) is omitted.

In a modified example, referring to FIG. 7, the vertical structure 188 may include an extended portion 188e, extended from a portion passing through the stacked structure 150 to the lower structure 110. The extended portion 188e of the vertical structure 188 may include an extended vertical core pattern 168e extended from the vertical core pattern 168v and extended to the lower structure 110, as well as a first extended dielectric 160e1 and a first extended semiconductor layer 166e1, extended between the extended vertical core pattern 168e and the lower structure 110 from a portion of the horizontal gate dielectric 160h, adjacent to the lower structure 110, and a portion of the horizontal semiconductor layer 166h. The separation structure 192 may include an extended portion 192e, extended from a portion passing through the stacked structure 150 to the lower structure 110. The extended portion 192e of the separation structures 192 may include an extended separation core pattern 176e extended from the separation core pattern 176, passing through the horizontal structure 190, and extended to the lower structure 110, as well as a second extended dielectric 160e2 and a second extended semiconductor layer 166e2, extended between the extended separation core pattern 176e and the lower structure 110 from a portion of the horizontal gate dielectric 160*h*, adjacent to the lower structure 110, and a portion of the horizontal semiconductor layer 166*h*.

In a modified example, referring to FIG. 8, the vertical structure 188 may include an extended vertical core pattern 168*e* extended from the vertical core pattern 168*v* and extended to the lower structure 110, as well as a first extended dielectric 160*e*1, extended between the extended vertical core pattern 168*e* and the lower structure 110 from a portion of the horizontal gate dielectric 160*h* adjacent to the lower structure 110. The separation structures 192 may include an extended separation core pattern 176*e* extended from the separation core pattern 176, passing through the horizontal structure 190, and extended to the lower structure 110, as well as a second extended dielectric 160*e*2, extended between the extended separation core pattern 176*e* and the lower structure 110 from a portion of the horizontal gate dielectric 160*h*, adjacent to the lower structure 110.

In a modified example, referring to FIG. 9, the lower structure 110 may include a semiconductor substrate 102, a peripheral circuit structure 104 disposed above the semiconductor substrate 102, a lower insulator 106 disposed on the semiconductor substrate 102 and covering the peripheral circuit structure 104, and a base 108 on the lower insulator 106. The base 108 may be formed of a semiconductor material such as polysilicon. On an upper surface 110*s* of the lower structure 110, the stacked structure 150, the vertical structure 188, the separation structure 192, and the horizontal structure 190, as described above, may be provided thereon.

Figure 10:
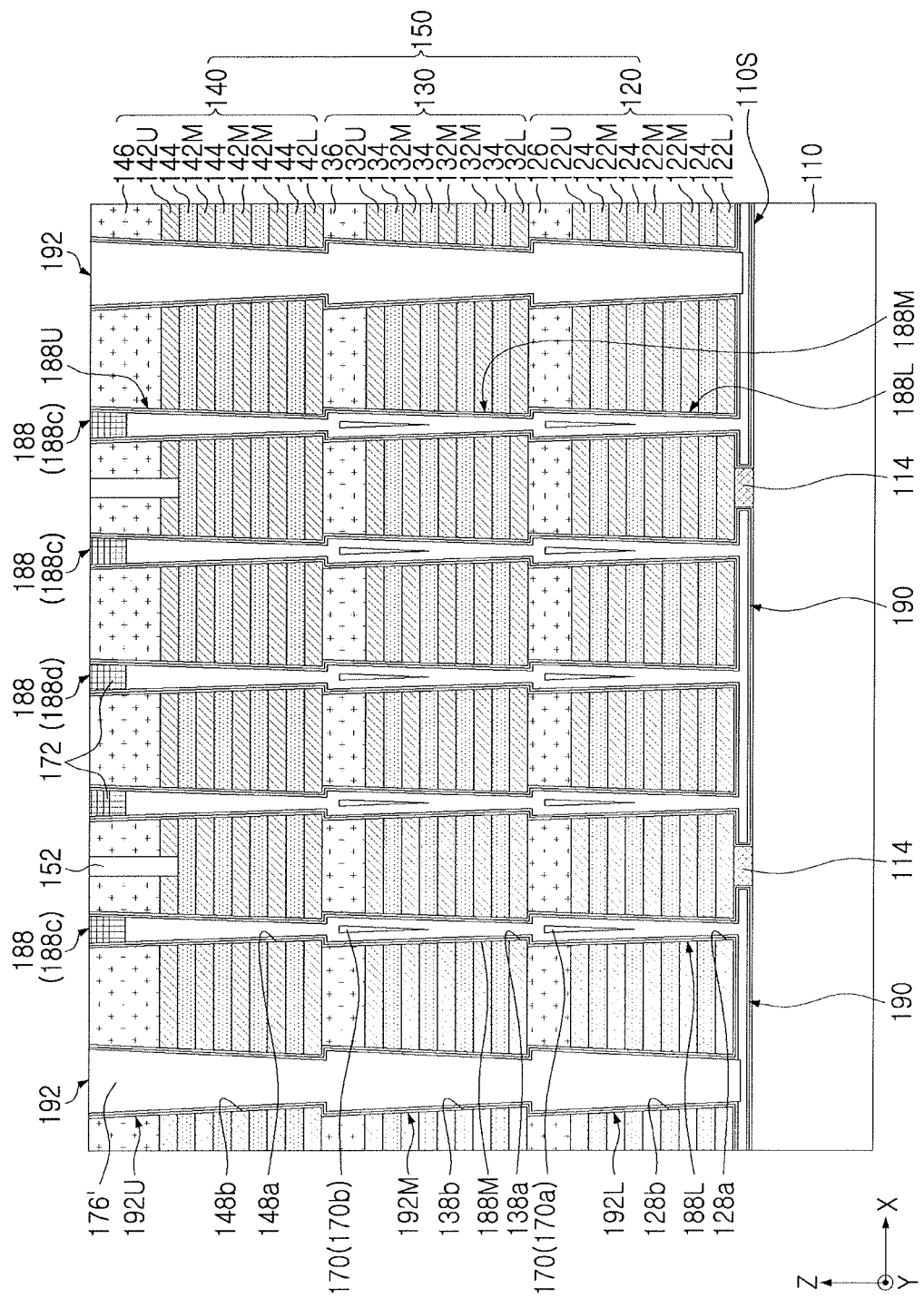
FIG. 10 illustrates a cross-sectional view of a modified example of a three-dimensional semiconductor device according to an example embodiment.

In a modified example, referring to FIG. 10, an separation core pattern 176' of the separation structure 192 may be provided without any void.

Figure 11:
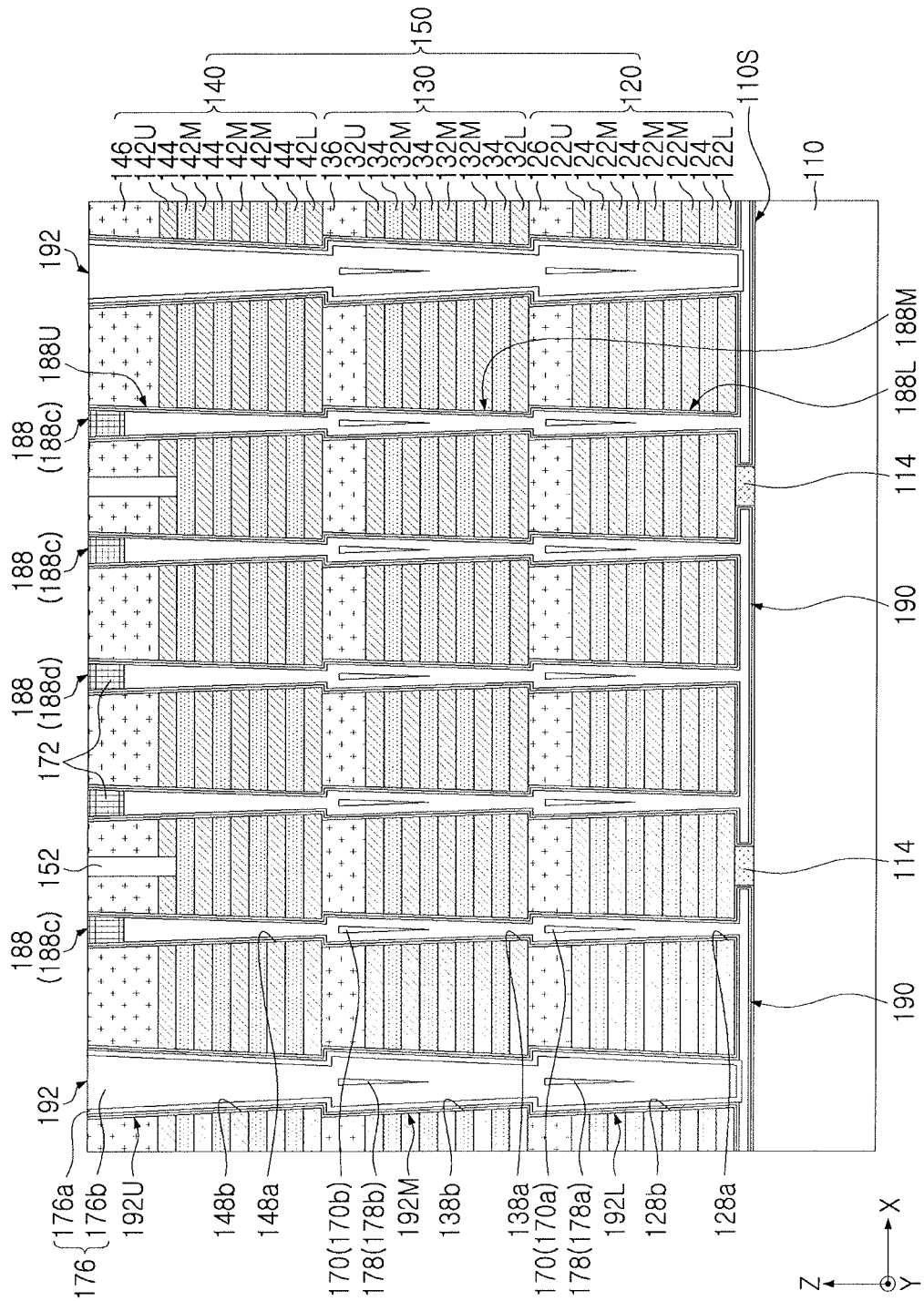
FIG. 11 illustrates a cross-sectional view of a modified example of a three-dimensional semiconductor device according to an example embodiment.

In a modified example, referring to FIG. 11, the separation core pattern 176 of the separation structure 190 may include a first separation core pattern 176*a* and a second separation core pattern 176*b*, having a specific resistivity lower than that of the first separation core pattern 176*a*. The first separation core pattern 176*a* may be formed of doped polysilicon, and the second separation core pattern 176*b* may be formed of tungsten, or the like. The second separation core pattern 176*b* may cover a side surface and a bottom surface, of the first separation core pattern 176*a*. The separation buffer portion 178 of the separation structure 190 may be disposed in the second separation core pattern 176*b*.

Groups 120, 130, and 140 of the stacked structure 150 described above in connection with FIG. 4 may have substantially the same height. Referring to FIG. 12A, a stacked structure 150' may include a lower group 120', an intermediate group 130' on the lower group 120', and an upper group 140' on the intermediate group 130', and a height of the upper group 140' may be greater than a height of the lower group 120' and/or a height of the intermediate group 130'. The height of the lower group 120' may be greater than the height of the intermediate group 130'. The heights of the groups 120', 130', and 140', described above, may be determined by the number of gate electrodes, respectively, forming the groups 120', 130', and 140'. The height of the upper group 140' may be greater than the height of the lower group 120' and/or the height of the intermediate group 130', and the number of gate electrodes 142L, 142M, and 142U of the upper group 140' may be greater than the number of gate electrodes 132L, 132M, and 132U of the intermediate group 130' and the number of gate electrodes 122L, 122M, and 122U of the lower group 120'. In another example, the height of the lower group 120' may be greater than the height of the intermediate group 130', and the number of the gate electrodes 122L, 122M, and 122U of the lower group 120' may be greater than the number of the gate electrodes 132L, 132M, and 132U of the intermediate group 130'.

In a modified example, referring to FIG. 12B, the intermediate group 130 may be omitted, and the upper group 140 may be directly on the lower group 120.

In a modified example, referring to FIG. 12C, a stacked structure 150" may include a plurality of intermediate groups 130 disposed between the lower group 120 and the upper group 140. For example, the intermediate group 130 may include a first intermediate group 130_1 to an n-th intermediate group 130_*n*, stacked in a vertical direction. In an implementation, 'n' may be a number greater than two.

In a modified example, referring to FIGS. 13 and 14, the stacked structure 150 and the vertical structure 188 of FIGS. 4, 5A, and 5B may be provided, and a horizontal structure 290 and separation structures 292 may be disposed in positions corresponding to the horizontal structure 190 and the separation structures 192 of FIGS. 4, 5A, and 5B, respectively. The horizontal structure 290 may include the horizontal gate dielectric 160*h* and the horizontal semiconductor layer 166*h* of FIGS. 4, 5A, and 5B. The horizontal structure 290 may further include a horizontal core pattern 276*h* between a portion of the horizontal semiconductor layer 166*h* located on a lower surface of the stacked structure 150, and a portion of the horizontal semiconductor layer 166*h* located on an upper surface 110*s* of the lower structure 110.

Each of the separation structures 292 may include the separation dielectric 160*v*2 and the separation semiconductor layer 166*v*2 of FIGS. 4, 5A, and 5B, and each of the separation structures 292 may further include a separation core pattern 276*v*. The separation structures 292 may include the separation buffer portion 178 of FIGS. 4, 5A, and 5B, and the separation buffer portion 178 may be disposed in the separation core pattern 276*v*. The separation core pattern 276*v* and the horizontal core pattern 276*h* may be provided as an integral core pattern 276. Thus, the separation core pattern 276*v* and the horizontal core pattern 276*h* may be continuously connected.

The horizontal structure 290 may further include an extended core pattern 276*e* extended from the horizontal core pattern 276*h* in a vertical direction and in contact with the vertical core pattern 168*v*. The horizontal core pattern 276*h* may be in contact with the vertical semiconductor layer 166*v* and the horizontal semiconductor layer 166*h*. The vertical core pattern 168*v* may be formed of, e.g., an insulating material, e.g., silicon oxide, and the separation core pattern 276*v* and the horizontal core pattern 276*h* may be formed of, e.g., a conductive material, e.g., doped polysilicon having N-type conductivity.

In a modified example, referring to FIG. 15, in the horizontal structure 290 having a structure the same as that illustrated in FIG. 14, the horizontal semiconductor layer (166*h* of FIG. 14) and the separation semiconductor layer (166*v*2 of FIG. 14) may be omitted. The horizontal core pattern 276*h* may be in contact with the horizontal gate dielectric 160*h* and the vertical semiconductor layer 166*v*, and the separation core pattern 276*v* may be in contact with the separation dielectric 160*v*2.

In a modified example, referring to FIGS. 16 and 17, the stacked structure 150 and the vertical structure 188 of FIGS. 4, 5A, and 5B, may be provided, and a horizontal structure 390 and separation structures 392 may be disposed in positions corresponding to the horizontal structure 190 and the separation structures 192 of FIGS. 4, 5A, and 5B, respectively.

The horizontal structure 390 may include the horizontal gate dielectric 160h and the horizontal semiconductor layer 166h of FIGS. 4, 5A, and 5B, and may further include a horizontal core pattern 368 between a portion of the horizontal semiconductor layer 166h located on a lower surface of the stacked structure 150, and a portion of the horizontal semiconductor layer 166h located on an upper surface 110s of the lower structure 110. The horizontal structure 390 may further include an extended core pattern 368e extended from the horizontal core pattern 368 in a vertical direction and in contact with the vertical core pattern 168v. The horizontal core pattern 368 may be formed of a semiconductor material or a conductive material, in contact with the vertical core pattern 168v. For example, the horizontal core pattern 368 may be formed of an intrinsic semiconductor material in contact with the vertical core pattern 168v, e.g., an undoped polysilicon material or a conductive doped semiconductor material in contact with the vertical core pattern 168v, e.g., a doped polysilicon material having N-type conductivity.

Each of the separation structures 392 may include the separation dielectric 160v2 and the separation semiconductor layer 166v2 of FIGS. 4, 5A, and 5B, and may further include a separation core pattern 376. The separation core pattern 376 may be formed of, e.g., a conductive material, e.g., metal nitride (e.g., TiN), metal (e.g., W), doped polysilicon (e.g., N-type poly Si), metal silicide, or the like. The separation structures 392 may include the separation buffer portion 178 of FIGS. 4, 5A, and 5B, and the separation buffer portion 178 may be disposed in the separation core pattern 376.

The vertical core pattern 168v, the separation core pattern 376, and the horizontal core pattern 368 may be formed of different materials. The vertical core pattern 168v may be formed of, e.g., an insulating material, e.g., silicon oxide, the horizontal core pattern 276h may be formed of, e.g., a conductive material, e.g., doped polysilicon having N-type conductivity, and the separation core pattern 376 may be formed of, e.g., a conductive material having a specific resistivity lower than that of the horizontal core pattern 276h, e.g., TiN and/or W, or the like.

In a modified example, referring to FIG. 18, relative to the separation structures 392 of FIG. 17, the separation semiconductor layer 166v2 may be omitted, and the separation dielectric 160v2 and the separation core pattern 376 may be in contact with each other.

In a modified example, referring to FIG. 19, relative to the separation structure 392 of FIG. 17, the separation semiconductor layer 166v2 may be omitted, and the separation dielectric 160v2 and the separation core pattern 376 may be in contact with each other. Additionally, relative to the separation structure 392 of FIG. 17, the horizontal semiconductor layer 166h may be omitted, and the horizontal gate dielectric 160h and the horizontal core pattern 368 may be in contact with each other.

In a modified example, referring to FIGS. 20 and 21, the stacked structure 150 and the vertical structure 188 of FIGS. 4, 5A, and 5B, may be provided, and horizontal structure 490 and separation structures 492 may be disposed in positions corresponding to the horizontal structure 190 and the separation structures 192 of FIGS. 4, 5A, and 5B, respectively.

The horizontal structure 490 may include the horizontal gate dielectric 160h and the horizontal semiconductor layer 166h of FIGS. 4, 5A, and 5B. The horizontal structure 490 may further include a first horizontal core pattern 468h and a second horizontal core pattern 476h, disposed between a portion of the horizontal semiconductor layer 166h located on a lower surface of the stacked structure 150, and a portion of the horizontal semiconductor layer 166h located on an upper surface 110s of the lower structure 110. The first horizontal core pattern 468h may include a portion disposed between the second horizontal core pattern 476h and the lower structure 110 and a portion disposed between the second horizontal core pattern 476h and the stacked structure 150. The horizontal structure 490 may further include an extended core pattern 468e extended from the first horizontal core pattern 468h in a vertical direction and in contact with the vertical core pattern 168v.

Each of the separation structures 492 may include the separation dielectric 160v2 and the separation semiconductor layer 166v2 of FIGS. 4, 5A, and 5B, and may further include a first separation core pattern 468v and a second separation core pattern 476v. The separation structures 492 may include the separation buffer portion 178 of FIGS. 4, 5A, and 5B, and the separation buffer portion 178 may be disposed in the separation core pattern 476.

The first horizontal core pattern 468h and the first separation core pattern 468v may be integrally provided to form a first core pattern 468, and the second horizontal core pattern 476h and the second separation core pattern 476v may be integrally provided to form a second core pattern 476. The first core pattern 468 may be formed of, e.g., polysilicon having N-type conductivity, and the second core pattern 476 may be formed of, e.g., a conductive material such as TiN, W, or the like, having a specific resistivity lower than that of the first core pattern 468.

In a modified example, referring to FIG. 22, relative to the horizontal structure 490 and the separation structures 492 of FIG. 21, the horizontal semiconductor layer 166h and the separation semiconductor layer 166v may be omitted, and the first core pattern 468 and the dielectric 160 may be in contact with each other.

In a modified example, referring to FIG. 23, the stacked structure 150 and the vertical structure 188 of FIGS. 4, 5A, and 5B, may be provided, and a horizontal structure 590 and separation structures 592 may be disposed in positions corresponding to the horizontal structure 190 and the separation structures 192 of FIGS. 4, 5A, and 5B, respectively.

The horizontal structure 590 may include the horizontal gate dielectric 160h and the horizontal semiconductor layer 166h of FIGS. 4, 5A, and 5B, and may further include a horizontal core pattern 568h. The horizontal core pattern 568h may be conductive. The horizontal core pattern 568h may be disposed between a first portion of the horizontal semiconductor layer 166h located on a lower surface of the stacked structure 150 and a second portion of the horizontal semiconductor layer 166h located on an upper surface 110s of the lower structure 110. The horizontal structure 590 may further include an extended core pattern 568e extended from the horizontal core pattern 568h in a vertical direction and in contact with the vertical core pattern 168v.

Each of the separation structures 592 may include the separation dielectric 160v2 and the separation semiconductor layer 166v2 of FIGS. 4, 5A, and 5B, and may further include a first separation core pattern 568v and a second separation core pattern 576. The separation structures 592 may include the separation buffer portion 178 of FIGS. 4, 5A, and 5B, and the separation buffer portion 178 may be disposed in the second separation core pattern 576.

The first separation core pattern 568v may be extended from the horizontal core pattern 568h and disposed on a side surface of the second separation core pattern 576. The first separation core pattern 568v and the horizontal core pattern 568h may be integrally provided to form a core pattern 568.

The first separation core pattern 568v and the horizontal core pattern 568h may be formed of, e.g., polysilicon having N-type conductivity, and the second separation core pattern 576 may be formed of, e.g., a conductive material (e.g., TiN, W, or the like) having a resistance lower than that of the first separation core pattern 568v.

Referring to FIG. 24, relative to the horizontal structure 590 and the separation structures 592 of FIG. 23, the horizontal semiconductor layer 166h and the separation semiconductor layer 166v may be omitted, and the core pattern 568 and the dielectric 160 may be in contact with each other.

Referring to FIGS. 25 and 26, the stacked structure 150 and the vertical structure 188 of FIGS. 4, 5A, and 5B, may be provided, and a horizontal structure 690 and separation structures 692 may be disposed in positions corresponding to the horizontal structure 190 and the separation structures 192 of FIGS. 4, 5A, and 5B, respectively.

The horizontal structure 690 may include the horizontal gate dielectric 160h of FIGS. 4, 5A, and 5B, and may include a horizontal semiconductor layer 166h extended from the vertical semiconductor layer 166v1 of the vertical structure 188. The horizontal semiconductor layer 166h may fill a gap between a portion of the horizontal gate dielectric 160h located on a lower surface of the stacked structure 150, and a portion of the horizontal gate dielectric 160h located on an upper surface 110s of the lower structure 110.

Each of the separation structures 692 may include a separation dielectric 160v2 extended from the horizontal gate dielectric 160h in a vertical direction, a separation semiconductor layer 166v2 extended from the horizontal semiconductor layer 166h in the vertical direction, and a separation core pattern 676 having a side surface surrounded by the separation semiconductor layer 166v2. The separation core pattern 676 and the horizontal semiconductor layer 166h may be in contact with each other. The separation core pattern 676 may be formed of, e.g., a conductive material (e.g., TiN, W, or the like) having a resistance lower than that of the separation semiconductor layer 166v2.

In a modified example, referring to FIG. 27, the vertical structure 188 may include an extended portion 188e that is extended from a portion passing through the stacked structure 150 to the lower structure 110. The extended portion 188e of the vertical structure 188 may include an extended vertical core pattern 168e and a first extended vertical semiconductor layer 166e1, extended from the vertical core pattern 168v and the vertical semiconductor layer 166v, respectively, and extended to the lower structure 110, as well as a first extended dielectric 160e1 extended between the first extended vertical semiconductor layer 166e1 and the lower structure 110 from a portion of the horizontal gate dielectric 160h, adjacent to the lower structure 110. The extended vertical core pattern 168e may be extended from the vertical core pattern 168v. Thus, the extended vertical core pattern 168e and the vertical core pattern 168v may be a core pattern 168 that is integrally provided.

The separation structure 692 may include an extended portion 692e that is extended from a portion passing through the stacked structure 150 to the lower structure 110. The extended portion 692e of the separation structures 692 may include an extended separation core pattern 176e extended from the separation core pattern 676 as illustrated in FIG. 26, passing through the horizontal structure 690 as illustrated in FIG. 26, and extended to the lower structure 110, as well as a second extended dielectric 160e2 and a second extended semiconductor layer 166e2, extended between the extended separation core pattern 676e and the lower structure 110 from a portion of the horizontal gate dielectric 160h, adjacent to the lower structure 110, and a portion of the horizontal semiconductor layer 166h.

In a modified example, referring to FIG. 28, relative to the core pattern 168 of FIG. 27, a lower buffer portion 169 may be disposed in a core pattern portion between the extended vertical core pattern 168e and the vertical core pattern 168v. The lower buffer portion 169 may be a void.

In a modified example, referring to FIGS. 29 and 30, the stacked structure 150 and a vertical structure 188 of FIGS. 4, 5A, and 5B, may be provided, and a horizontal structure 790 and separation structures 792 may be disposed in positions corresponding to the horizontal structure 190 and the separation structures 192 of FIGS. 4, 5A, and 5B, respectively.

The horizontal structure 790 may include the horizontal gate dielectric 160h and the horizontal semiconductor layer 166h of FIGS. 4, 5A, and 5B, and may further include a horizontal core pattern 168h and a horizontal buffer portion 770, disposed between a first portion of the horizontal semiconductor layer 166h located on a lower surface of the stacked structure 150 and a second portion of the horizontal semiconductor layer 166h located on an upper surface 110s of the lower structure 110. The horizontal buffer portion 770 may be surrounded by the horizontal core pattern 168h. For example, the horizontal core pattern 168h may include portions spaced apart from each other with the horizontal buffer portion 770 interposed therebetween between the stacked structure 150 and the lower structure 110. For example, the horizontal gate dielectric 160h, the horizontal semiconductor layer 166h, and the horizontal core pattern 168h may be extended from the vertical gate dielectric 160v1, the vertical semiconductor layer 166v1, and the vertical core pattern 168v along a lower surface of the stacked structure 150, a side surface of the supporting pattern 114, and an upper surface 110s of the lower structure 110. Thus, the horizontal buffer portion 770 may be between a portion of the horizontal core pattern 168h, adjacent to an upper surface 110s of the lower structure 110, and a portion of the horizontal core pattern 168h, adjacent to a lower surface of the stacked structure 150.

Each of the separation structures 792 may include the separation dielectric 160v2 and the separation semiconductor layer 166v2 of FIGS. 4, 5A, and 5B, and may further include a separation core pattern 776. The separation structures 792 may include the separation buffer portion 178 of FIGS. 4, 5A, and 5B, and the separation buffer portion 178 may be disposed in the separation core pattern 776. The separation core pattern 776 may be in contact with the horizontal core pattern 168h and may be spaced apart from the horizontal buffer portion 770.

In a modified example, referring to FIGS. 31 and 32, the stacked structure 150 and the vertical structure 188 of FIGS. 4, 5A, and 5B, may be provided, and a lower insulating layer 116 may be on a lower surface of the stacked structure 150. A horizontal structure 890 and separation structures 892 may be disposed in positions corresponding to the horizontal structure 190 and the separation structures 192 of FIGS. 4, 5A, and 5B, respectively. The horizontal structure 890 may be below the lower insulating layer 116, and the separation structures 982 and the vertical structure 188 may pass through the lower insulating layer 116 while passing through the stacked structure 150. The supporting pattern 114 may be between the lower insulating layer 116 and the lower structure 110.

The horizontal structure 890 may include the horizontal gate dielectric 160h, substantially the same as that of FIGS.

4, 5A, and 5B, and may include a horizontal semiconductor layer 166*h* extended from the vertical semiconductor layer 166*v*1 of the vertical structure 188. The horizontal semiconductor layer 166*h* may fill a gap between a portion of the horizontal gate dielectric 160*h* located on a lower surface of the lower insulating layer 116 below the stacked structure 150, and a portion of the horizontal gate dielectric 160*h* located on an upper surface 110*s* of the lower structure 110.

The lower structure 110 may include an impurity region 110*n* having, e.g., N-type conductivity, adjacent to the horizontal structure 890 and the separation structure 892. The impurity region 110*n* may serve as the common source line CSL of FIG. 1.

Each of the separation structures 892 may include a separation core pattern 876 and a separation connecting pattern 872 located below the separation core pattern 876. The lower structure 110 may include a semiconductor substrate, and the separation connecting pattern 872 may be formed of, e.g., a material grown from a semiconductor substrate of the lower structure 110 using an epitaxial process, e.g., silicon. The separation connecting pattern 872 may allow the impurity region 110*n* of the lower structure 110 and the horizontal semiconductor layer 166*h* to be electrically connected to each other. Thus, the vertical semiconductor layer 166*v*1 of the vertical structure 188 may be connected to the region 110*n*, having, e.g., N-type conductivity, of the lower structure 110, through the horizontal semiconductor layer 166*h* and the separation connecting pattern 872.

The separation core pattern 876 may be formed of, e.g., an insulating material, e.g., silicon oxide. The separation structures 892 may include the separation buffer portion 178 of FIGS. 4, 5A, and 5B, and the separation buffer portion 178 may be disposed in the separation core pattern 876.

In a modified example, referring to FIGS. 33 and 34, the stacked structure 150 and the vertical structure 188 of FIGS. 4, 5A, and 5B may be provided, the lower insulating layer 116 of FIGS. 31 and 32 may be provided, and a horizontal structure 890' and separation structures 892' may be disposed in positions corresponding to the horizontal structure 190 and the separation structures 192 of FIGS. 4, 5A, and 5B, respectively.

The stacked structure 150 may further include additional gate dielectrics 1120 extended to side surfaces of the gate electrodes 122L, 122M, 122U, 132L, 132M, 132U, 142L, 142M, and 142U opposing the vertical structure 188 and covering an upper surface and a lower surface of the gate electrodes 122L, 122M, 122U, 132L, 132M, 132U, 142L, 142M, and 142U. In an example embodiment, the additional gate dielectrics 1120 may be high dielectric, e.g., aluminum oxide or the like.

The horizontal structure 890' may include the horizontal gate dielectric 160*h* of FIGS. 4, 5A, and 5B, and may include a horizontal semiconductor layer 166*h* extended from the vertical semiconductor layer 166*v*1 of the vertical structure 188. The horizontal semiconductor layer 166*h* may fill a gap between a portion of the horizontal gate dielectric 160*h* located on a lower surface of the lower insulating layer 116 below the stacked structure 150, and a portion of the horizontal gate dielectric 160*h* located on an upper surface 110*s* of the lower structure 110.

Each of the separation structures 892' may include a separation connecting pattern 872', a separation core pattern 876' disposed on the separation connecting pattern 872', and separation spacers 874 disposed on the separation connecting pattern 872' and covering a side surface of the separation core pattern 876'. The separation connecting pattern 872 may be in contact with the horizontal semiconductor layer 166*h* and may be spaced apart from the lower structure 110. The separation connecting pattern 872 may be formed of, e.g., a material grown from the horizontal semiconductor layer 166*h* using an epitaxial process, e.g., silicon. The separation core pattern 876' may be formed of, e.g., a conductive material (e.g., TiN, W, or the like), and the separation spacers 874 may be formed of, e.g., an insulating material (e.g., $SiO_2$, or the like). The separation structures 892' may include the separation buffer portion 178 of FIGS. 4, 5A, and 5B, and the separation buffer portion 178 may be disposed in the separation core pattern 876'.

Figure 35:
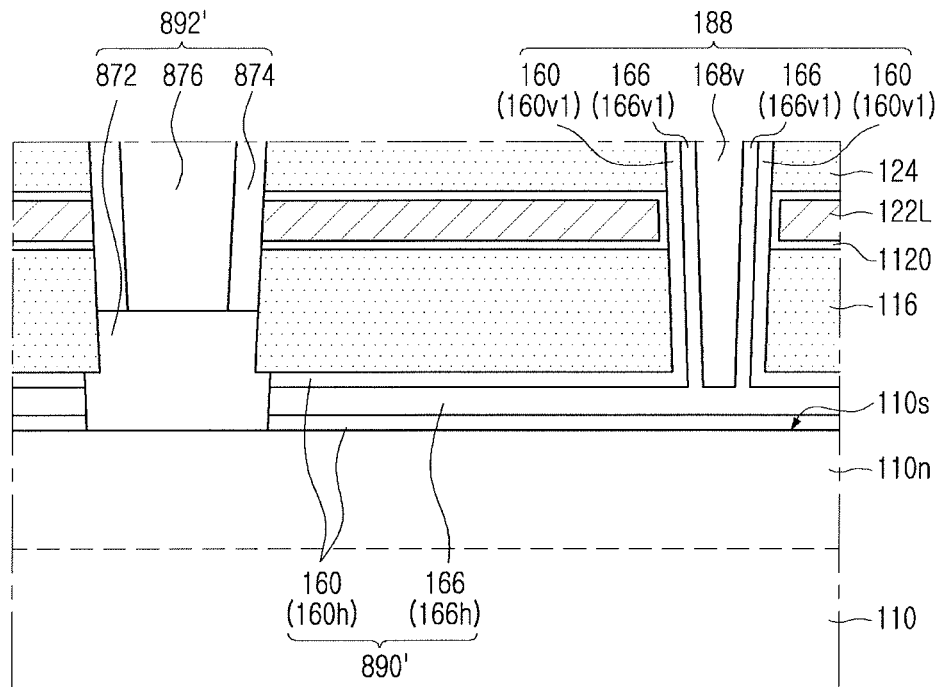
FIGS. 35 to 38 each illustrate a partially enlarged view illustrating a modified example of a three-dimensional semiconductor device according to an example embodiment.

In a modified example, referring to FIG. 35, relative to the separation structure 892' of FIGS. 33 and 34, a separation connecting pattern 872 may be extended downwardly, pass through the horizontal structure 890' of FIGS. 33 and 34, and may be connected to the lower structure 110. The lower structure 110 may include an impurity region 110*n* adjacent to the horizontal structure 890' and the separation structure 892'.

In a modified example, referring to FIG. 36, the stacked structure 150, the additional gate dielectrics 1120, the vertical structure 188, and the lower insulating layer 116 of FIGS. 33 and 34, may be provided, and a horizontal structure 990 and separation structures 992' may be disposed in positions corresponding to the horizontal structure 890' and the separation structures 892', of FIGS. 33 and 34.

The horizontal structure 990 may include the horizontal gate dielectric 160*h* of FIGS. 4, 5A, and 5B, and may further include a horizontal core pattern 968 disposed between a portion of the horizontal gate dielectric 160*h* located on a lower surface of the lower insulating layer 116 below the stacked structure 150, and a portion of the horizontal gate dielectric 160*h* located on an upper surface 110*s* of the lower structure 110. The horizontal core pattern 968 may be formed of, e.g., polysilicon doped with an N-type impurity.

Each of the separation structures 992 may include a separation connecting pattern 972, a separation core pattern 976 disposed on the separation connecting pattern 972, and separation spacers 974 disposed on the separation connecting pattern 972 and covering a side surface of the separation core pattern 976. The separation connecting pattern 972 may be in contact with the horizontal core pattern 968 and may be spaced apart from the lower structure 110. The separation connecting pattern 972 may be formed of, e.g., a material grown from the horizontal core pattern 968 using an epitaxial process, e.g., silicon. The separation core pattern 976 may be formed of, e.g., a conductive material (e.g., TiN, W, or the like), and the separation spacers 974 may be formed of, e.g., an insulating material (e.g., $SiO_2$, or the like). The separation structures 992 may include the separation buffer portion 178 of FIGS. 4, 5A, and 5B, and the separation buffer portion 178 may be disposed in the separation core pattern 976.

In a modified example, referring to FIG. 37, relative to the separation structure 992 of FIG. 36, a separation connecting pattern 972 may be extended downwardly, pass through the horizontal structure 990, and may be in contact with the lower structure 110.

In a modified example, referring to FIG. 38, a horizontal structure 1090, corresponding to the horizontal structure 990 of FIG. 36, may be provided. A separation structure 1092 may be provided in a position corresponding to the separation structure 992 in FIG. 37. The separation structure 1092 may include a separation connecting pattern 1072 having a structure and a material, the same as those of the separation connecting pattern (972 of FIG. 37) in FIG. 37. The separation structure 1092 may further include a separation core pattern 1076 on the separation connecting pattern 1072. The separation core pattern 1076 may be formed of, e.g., an insulating material such as silicon oxide or the like. The lower structure 110 may include an impurity region 110*n*, the same as that of FIG. 35. The impurity region 110*n* may be connected to the separation connecting pattern 1072.

In a modified example, referring to FIGS. 39, 40, and 41, the stacked structure 150 and the vertical structure 188 of FIGS. 4, 5A, and 5B, may be provided, and, between the lower structure 110 and the stacked structure 150, a lowermost insulating layer 1112, a horizontal structure 1190, and a lower insulating layer 116, sequentially stacked on the lower structure 110, may be provided. The vertical structure 188 of FIGS. 4, 5A, and 5B, may sequentially pass through the lowermost insulating layer 1112, the horizontal structure 1190, and the lower insulating layer 116 to be extended to the lower structure 110.

The vertical structure 188 may include the vertical core pattern 168*v*, the vertical buffer portion 170, the vertical semiconductor layer 166*v*1, and the vertical gate dielectric 160*v*1 of FIGS. 4, 5A, and 5B, in a portion passing through the stacked structure 150. The vertical structure 188 may include an extended portion 188*e*, extended from a portion passing through the stacked structure 150 to the lower structure 110. For example, the extended portion 188*e* of the vertical structure 188 may include an extended vertical core pattern 168*e* extended from the vertical core pattern 168*v* and extended to the lower structure 110, a first extended semiconductor layer 166*e*1 extended from the vertical semiconductor layer 166*h* and extended between the extended vertical core pattern 168*e* and the lower structure 110, and a first extended dielectric 160*e*1 covering an outer side surface and a bottom of the first extended semiconductor layer 166*e*1. The first extended semiconductor layer 166*e*1 and the vertical semiconductor layer 166*v*1 are integrally provided, and may thus form the semiconductor layer 166, being continuously connected. The horizontal structure 1190 may space the first extended dielectric 160*e*1 and the vertical gate dielectric 160*v*1 apart from each other, and may be connected to or in contact with the semiconductor layer 166.

The horizontal structure 1190 may include, e.g., two layers or more than two layers. For example, the horizontal structure 1190 may include a lower horizontal pattern 1168 and an upper horizontal pattern 1160. The upper horizontal pattern 1160 may be on the lower horizontal pattern 1168. In another implementation, the upper horizontal pattern 1160 may be below the lower horizontal pattern 1168. The lower horizontal structure 1168 and the upper horizontal structure 1160 may be in contact with each other.

As described above, the horizontal structure 1190 may include a first layer, the lower horizontal pattern 1168, and a second layer, the upper horizontal pattern 1160. In an example embodiment, the horizontal structure 1190 may include two or more layers. An intermediate layer may be interposed between the first layer (the lower horizontal pattern 1168) and the second layer (the upper horizontal pattern 1160), and the lower horizontal pattern 1168 and the upper horizontal pattern 1160 may be spaced apart from each other. The intermediate layer may be, e.g., a doped semiconductor layer, a metal layer, a metal nitride layer, and/or a metal silicide layer.

One of the lower horizontal pattern 1168 and the upper horizontal pattern 1160 may be formed of, e.g., a conductive material, the same as a material of the gate electrodes 122L, 122M, 122U, 132L, 132M, 132U, 142L, 142M, and 142U of the stacked structure 150, and the other may be formed of a material different from a material of the gate electrodes 122L, 122M, 122U, 132L, 132M, 132U, 142L, 142M, and 142U of the stacked structure 150. For example, the lower horizontal pattern 1168 may be formed of, e.g., a conductive material (e.g., TiN, W, or the like), the same as a material of the gate electrodes 122L, 122M, 122U, 132L, 132M, 132U, 142L, 142M, and 142U of the stacked structure 150, and the upper horizontal pattern 1160 may be formed of, e.g., a conductive material (e.g., polysilicon having N-type conductivity). A portion of the upper horizontal pattern 1160 may be extended between the lower horizontal pattern 1168 and the semiconductor layer 166, and between the lower insulating layer 116 and the semiconductor layer 166.

In a portion passing through the stacked structure 150, a separation structure 1192 may be in a position corresponding to the separation structures 192 of FIGS. 4, 5A, and 5B. The separation structure 1192 may sequentially pass through the lowermost insulating layer 116, the horizontal structure 1190, and the lowermost insulating layer 1112 to be extended to the lower structure 110. In an example embodiment, the separation structures 1192 may include, e.g., an insulating material such as silicon oxide or the like. The separation structure 1192 may include the separation buffer portion 178 of FIGS. 4, 5A, and 5B.

The stacked structure 150 may be extended in one direction to form a staircase structure. For example, the gate electrodes 122L, 122M, 122U, 132L, 132M, 132U, 142L, 142M, and 142U and the horizontal structure 1190 may be extended to form a staircase structure having a shape the level of which is lowered from an upper portion to a lower portion. A region in which the gate electrodes 122L, 122M, 122U, 132L, 132M, 132U, 142L, 142M, and 142U are extended to form staircase structures may be covered by the insulating layer 1140. On the staircase structures described above, first contact plugs 1050, electrically connected to the gate electrodes 122L, 122M, 122U, 132L, 132M, 132U, 142L, 142M, and 142U, and a second contact plug 1055, electrically connected to the horizontal structure 1190, may be provided. The second contact plug 1055 may pass through the upper horizontal pattern 1160 and may be in contact with the lower horizontal pattern 1168. The first contact plug 1050 and the second contact plug 1055 may be formed of, e.g., a conductive material.

In a modified example, referring to FIG. 42, the separation structures 1192 of FIG. 40 may be modified as separation structures 1292 that include a separation core pattern 1276 and separation spacers 1272 covering side surfaces of the separation core pattern 1276. The separation core pattern 1276 may be formed of, e.g., a conductive material, and the separation spacers 1272 may be formed of, e.g., an insulating material. The separation core pattern 1276 may be in contact with the lower structure 110. The lowermost insulating layer 1112 of FIG. 40 may be omitted, and the lower horizontal pattern 1168 of the horizontal structure 1190 may be in contact with the lower structure 110. Thus, the vertical semiconductor layer 166*v*1 of the vertical structure 188 may be electrically connected to the separation core pattern 1276 through the horizontal structure 1290 and the lower structure 110.

In a modified example, referring to FIG. 43, the stacked structure 150 of FIGS. 33 and 34 may include additional gate dielectrics 1120. The horizontal structure 1390, which may be in a position corresponding to the horizontal structure 1290 of FIG. 42, may include a lower horizontal pattern 1368, and an upper horizontal pattern 1360 on the lower horizontal structure 1368. The horizontal structure 1390 may further include an additional dielectric 1366 that covers bottom surface and an upper surface of the lower horizontal pattern 1368 and extends between the lower horizontal pattern 1368 and the vertical structure 188. The additional dielectric 1366 may be formed of the same material as the additional gate dielectrics 1120.

In a modified example, referring to FIGS. 44A, 44B, and 44C, the stacked structure 150 and the vertical structure 188 of FIGS. 4, 5A, and 5B may be provided, and the stacked structure 150 may further include additional gate dielectrics 1120 extended to side surfaces of the gate electrodes 122L, 122M, 122U, 132L, 132M, 132U, 142L, 142M, and 142U opposing the vertical structure 188 and covering an upper surface and a lower surface of the gate electrodes 122L, 122M, 122U, 132L, 132M, 132U, 142L, 142M, and 142U.

Between the lower structure 110 and the stacked structure 150, a lowermost insulating layer 1112, a horizontal structure 1490, and a lower insulating layer 116, sequentially stacked on the lower structure 110, may be provided. The vertical structure 188 of FIGS. 4, 5A, and 5B, may include the extended portion 188e of FIG. 40 that sequentially passes through the lowermost insulating layer 1112, the horizontal structure 1490, and the lower insulating layer 116 to be extended to the lower structure 110.

The horizontal structure 1490 may include a lower horizontal pattern 1468, and an upper horizontal pattern 1460 on the lower horizontal pattern 1468. The lower horizontal pattern 1468 and the upper horizontal pattern 1460 may be in contact with each other. The lower horizontal pattern 1468 may be formed of, e.g., a conductive material (e.g., TiN, W, or the like), the same as a material of the gate electrodes 122L, 122M, 122U, 132L, 132M, 132U, 142L, 142M, and 142U of the stacked structure 150, and the upper horizontal pattern 1460 may be formed of, e.g., polysilicon having N-type conductivity. A portion of the upper horizontal pattern 1460 may be extended between the lower horizontal pattern 1468 and the semiconductor layer 166, and between the lower insulating layer 116 and the semiconductor layer 166.

The horizontal structure 1190 may further include an additional dielectric 1466 covering a lower surface of the lower horizontal pattern 1468 and extended between a side surface of the lower horizontal pattern 1468 and the first extended dielectric 160e1. The additional dielectric 1466 may be formed of the same material as the additional gate dielectrics 1120.

The stacked structure 150 may be extended in one direction to form a staircase structure. For example, the gate electrodes 122L, 122M, 122U, 132L, 132M, 132U, 142L, 142M, and 142U and the horizontal structure 1490 may be extended to form a staircase structure having a shape the level of which is lowered from an upper portion to a lower portion. A region in which the gate electrodes 122L, 122M, 122U, 132L, 132M, 132U, 142L, 142M, and 142U are extended to form staircase structures may be covered by the insulating layer 1140. On the staircase structures described above, first contact plugs 1050, electrically connected to the gate electrodes 122L, 122M, 122U, 132L, 132M, 132U, 142L, 142M, and 142U, and a second contact plug 1055, electrically connected to the horizontal structure 1490, may be provided. The second contact plug 1055 may pass through the upper horizontal pattern 1460 and may be in contact with the lower horizontal pattern 1468. The first contact plug 1050 and the second contact plug 1055 may be formed of, e.g., a conductive material.

In a portion passing through the stacked structure 150, a separation structure 1492 may be in a position corresponding to the separation structures 192 of FIGS. 4, 5A, and 5B.

The separation structure 1492 may sequentially pass through the lowermost insulating layer 116, the horizontal structure 1490, and the lowermost insulating layer 1112 to be extended to the lower structure 110. The separation structures 1492 may include, e.g., an insulating material such as silicon oxide or the like. The separation structure 1492 may include the separation buffer portion 178 of FIGS. 4, 5A, and 5B.

In a modified example, referring to FIGS. 45 and 46, the lower structure 110 and the stacked structure 150 of FIGS. 4, 5A, and 5B may be provided, and the stacked structure 150 may be on a lowermost insulating layer 2112 on the lower structure 110. The lowermost insulating layer 2112 may be formed of, e.g., an insulating material such as silicon oxide or the like.

Separation structures 2192 may be provided passing through the stacked structure 150 and the lowermost insulating layer 2112 and extended to the lower structure 110. The separation structures 2192 may have a planar shape, the same as the separation structures 192 of FIG. 3, e.g., in a shape of lines parallel to each other.

In an example embodiment, each of the separation structures 2192 may include a separation core pattern 2176 and an insulating spacer 2172 on a side surface of the separation core pattern 2176. The separation core pattern 2176 may be formed of, e.g., a conductive material (e.g., a metal such as W, a metal nitride such as TiN, a metal-silicide such as TiSi, or N-type polysilicon), or the like. The insulating spacer 2172 may be formed of, e.g., an insulating material such as silicon oxide or the like. Each of the separation structures 2192 may include the separation buffer portions 178 described with reference FIGS. 4 and 5B, and the separation buffer portions 178 may be disposed in the separation core pattern 2176.

In an example embodiment, each of the separation structures 2192 may include the separation buffer portion 178, the same as that described above. The separation buffer portion 178 may be disposed in the separation core pattern 2176, and may be a void as described above.

A vertical structure 2188 may be provided passing through the stacked structure 150 and the lowermost insulating layer 2112 and extended to the lower structure 110. The vertical structure 2188 may be provided as a plurality of vertical structures. The plurality of vertical structures 2188 may include a dummy vertical structure 2188d and a memory cell vertical structure 2188c, corresponding to the dummy vertical structure 188d and the memory cell vertical structure 188c, described above with reference to FIGS. 3 to 5B.

The stacked structure 150 may include additional gate dielectrics 1120 extended to side surfaces of the gate electrodes 122L, 122M, 122U, 132L, 132M, 132U, 142L, 142M, and 142U opposing the vertical structure 2188 and covering an upper surface and a lower surface of the gate electrodes 122L, 122M, 122U, 132L, 132M, 132U, 142L, 142M, and 142U.

The vertical structure 2188 may include a semiconductor pattern 2159, a vertical core pattern 2168 disposed on the semiconductor pattern 2159, a vertical semiconductor layer 2166 surrounding an outer side surface of the vertical core pattern 2168, extended between the vertical core pattern 2168 and the semiconductor pattern 2159, and in contact with the semiconductor pattern 2159, a vertical gate dielectric layer 2160 surrounding an outer side surface of the vertical semiconductor layer 2166, and a pad pattern 172 disposed on the vertical core pattern 2168 and in contact with the vertical semiconductor layer 2166. The vertical core pattern 2168 may be continuously extended from the lower group 120 of the stacked structure 150 to the upper group 140 to be integrally provided. The vertical semiconductor layer 2166 may be continuously extended from the lower group 120 of the stacked structure 150 to the upper group 140 to be integrally provided. The vertical gate dielectric layer 2160 may include the tunnel dielectric (164 of FIG. 5A), the data storage layer (163 of FIG. 5A), and the blocking dielectric (162 of FIG. 5A), the same as those described above.

The lower structure 110 may include a semiconductor substrate, and the semiconductor pattern 2159 may be formed of, e.g., a material grown from a semiconductor substrate of the lower structure 110 using an epitaxial process, e.g., silicon. The semiconductor pattern 2159 may oppose a lowermost gate electrode 122L among the gate electrodes, and may be extended in a downward direction to be extended to the lower structure 110. A lower gate dielectric 1119 may be on a side surface of the semiconductor pattern 2159, opposing the lowermost gate electrode 122L.

The vertical structure 2188 may include a vertical buffer portion 170, the same as that described above. The vertical buffer portion 170 may be disposed in the vertical core pattern 2168 in a position, the same as that described above, and may be a void as described above. The vertical core pattern 2168 may be formed of, e.g., an insulating material such as silicon oxide or the like.

FIGS. 47 to 49 illustrate cross-sectional views of an example of a method of forming a three-dimensional semiconductor device according to an example embodiment.

Referring to FIG. 47, a sacrificial layer 112 and supporting patterns 114 may be formed on a lower structure 110. The supporting patterns 114 may be formed of, e.g., silicon. After the sacrificial layer 112 is formed on the lower structure 110, supporting patterns 114 passing through the lower sacrificial layer 112 may be provided. In another implementation, after supporting patterns 114 are formed on the lower structure 110, the sacrificial layer 112 surrounding side surfaces of the supporting patterns 114 may be provided.

A lower group 120 may be provided in the sacrificial layer 112 and the supporting patterns 114. Forming the lower group 120 may include forming lower gate electrodes 122L, 122M, and 122U as well as lower interlayer insulating layers 124, alternately stacked, and forming a lower capping layer 126 thereafter. In an example embodiment, the lower gate electrodes 122L, 122M, and 122U may be formed of, e.g., a conductive material, e.g., doped polysilicon or doped polysilicon-germanium, the lower interlayer insulating layers 124 may be formed of, e.g., silicon oxide, and the lower capping layer 126 may be formed of, e.g., silicon oxide or silicon nitride.

A through hole 128a and through trenches 128b, passing through the lower group 120 and exposing the sacrificial layer 112, may be provided. Then, a lower sacrificial vertical structure 129a, filling the through hole 128a, and a lower sacrificial separation structure 129b, filling the through trenches 128b, may be provided.

Referring to FIG. 48, an intermediate group 130 may be provided on the lower group 120. Forming the intermediate group 130 may include forming intermediate gate electrodes 132L, 132M, and 132U as well as intermediate interlayer insulating layers 134, alternately stacked, and forming an intermediate capping layer 136 thereafter. Through holes 138a, passing through the intermediate group 130 and exposing the lower sacrificial vertical structure 129a, and through trenches 138b, exposing the lower sacrificial separation structures 129b, may be provided. Then, an intermediate sacrificial vertical structure 139a, filling the through holes 138a, and intermediate sacrificial separation structures 139b, filling the through trenches 138b, may be provided.

An upper group 140 may be provided on the intermediate group 130. Forming the upper group 140 may include forming upper gate electrodes 142L, 142M, and 142U as well as upper interlayer insulating layers 144, alternately stacked, and forming an upper capping layer 146 thereafter. Thus, a stacked structure 150, including the lower, intermediate, and upper groups 120, 130, and 140, may be provided.

Insulating patterns 152, passing through a portion of a gate electrode 142U, among the upper gate electrodes 142L, 142M, and 142U, and the upper capping layer 146, may be provided. Through holes 148a, passing through the upper group 140 and exposing the intermediate sacrificial vertical structure 139a, and through trenches 148b, exposing the intermediate sacrificial separation structures 139b, may be provided. Then, an upper sacrificial vertical structure 149a, filling the through holes 148a, and upper sacrificial separation structures 149b, filling the through trenches 148b, may be provided.

Referring to FIG. 49, the lower, intermediate, and upper sacrificial vertical structures (129a, 139a, and 149a of FIG. 48), as well as the lower, intermediate, and upper sacrificial separation structures (129b, 139b, and 149b of FIG. 48) are removed to expose the sacrificial layer (112 of FIG. 48). Then, the sacrificial layer (112 of FIG. 48) may be removed to form an empty space 154 between the stacked structure 150 and the lower structure 110. The stacked structure 150 may be supported by the supporting patterns 114. Empty space 154 may communicate with the through holes 128a, 138a, and 149a as well as the through trenches 128b, 138b, and 148b, passing through the stacked structure 150. Each of the through trenches 128b, 138b, and 148b may have a width greater than a width of each of the through holes 128a, 138a, and 149a.

Using the structure formed as described above, semiconductor devices of various examples described above may be provided. For example, referring to FIGS. 4, 5A, and 5B, on a lower structure 110, in which the stacked structure 150, the empty space 154, the through holes 128a, 138a, and 149a, as well as the through trenches 128b, 138b, and 148b are provided, a gate dielectric 160, a semiconductor layer 166, and a core pattern 168 may be sequentially provided. In an example embodiment, the gate dielectric 160, the semiconductor layer 166, and the core pattern 168 may fill the through holes 128a, 138a, and 149a as well as the empty space 154, and may partially fill the through trenches 128b, 138b, and 148b. When the core pattern 168 is provided, vertical buffer portions 170 may be provided in the core pattern 168.

Then, after portions of a core pattern, formed in the through trenches 128b, 138b, and 148b, and a core pattern in the through holes 128a, 138a, and 149a, are removed, a pad pattern 172 may be formed on a core pattern 168 that remains in the through holes 128a, 138a, and 149a, and separation core patterns 176 having separation buffer portions 178 may be formed in the through trenches 128b, 138b, and 148b.

FIGS. 50 and 51 illustrate cross-sectional views of a modified example of a method of forming a three-dimensional semiconductor device according to an example embodiment.

Referring to FIG. 50, on the lower structure 110 of FIG. 47, the supporting patterns 114 and the sacrificial layer 112 may be provided. A lower insulating layer 116 may be provided on the supporting patterns 114 and the sacrificial layer 112. Then, by performing operations substantially the same as those of FIGS. 47 and 48, the stacked structure 150, the lower, intermediate, and upper sacrificial vertical structures (129a, 139a, and 149a of FIG. 48), the lower, intermediate, and upper sacrificial separation structures (129b, 139b, and 149b of FIG. 48), as well as the insulating patterns 152 may be provided. The lower sacrificial vertical structure 129a and the lower separation structure 129b may pass through the lower insulating layer 116 and may be in contact with the sacrificial layer 112.

Referring to FIG. 51, by performing operations substantially the same as those of FIG. 49, the lower, intermediate, and upper sacrificial vertical structures (129a, 139a, and 149a of FIG. 50), as well as the lower, intermediate, and upper sacrificial separation structures (129b, 139b, and 149b of FIG. 50) may be removed to expose the sacrificial layer (112 of FIG. 50). Then, the sacrificial layer (112 of FIG. 50) may be removed to form an empty space 154 between the lower insulating layer 116 below the stacked structure 150 and the lower structure 110.

Using the structure formed as described above, semiconductor devices of various examples described above may be provided. For example, referring to FIGS. 31 and 32, on a lower structure 110, in which the stacked structure 150, the lower insulating layer 116, the empty space 154, the through holes 128a, 138a, and 149a, as well as the through trenches 128b, 138b, and 148b are provided, a gate dielectric 160, a semiconductor layer 166, and a core pattern 168 may be sequentially provided. In an example embodiment, the gate dielectric 160, the semiconductor layer 166, and the core pattern 168 may fill the through holes 128a, 138a, and 149a, the gate dielectric 160 and the semiconductor layer 166 may fill the empty space 154, and the gate dielectric 160, the semiconductor layer 166, and the core pattern 168 may partially fill the through trenches 128b, 138b, and 148b. Then, after portions of a core pattern, formed in the through trenches 128b, 138b, and 148b, and a core pattern in the through holes 128a, 138a, and 149a, are removed, a pad pattern 172 is formed on a core pattern 168 which remains in the through holes 128a, 138a, and 149a, and separation core patterns 176 filling the through trenches 128b, 138b, and 148b may be provided. Then, after a portion of a core pattern in the through holes 128a, 138a, and 149a is removed, a pad pattern 172 is provided on a core pattern 168 which remains in the through holes 128a, 138a, and 149a. While the gate dielectric 160, the semiconductor layer 166, and the core pattern 168, which remains in the through trenches 128b, 138b, and 148b, are removed, the lower structure 110 may be exposed. Then, by performing an epitaxial process, the separation connecting pattern 872 of FIG. 32 may be provided, and a separation core pattern 876 may be formed in a remaining portion of the through trenches 128b, 138b, and 148b of the separation connecting pattern 872. Before the separation core pattern 876 is provided, gate electrodes 122L, 122M, 122U, 132L, 132M, 132U, 142L, 142M, and 142U in the stacked structure 150 may be removed to form empty spaces and, in the empty spaces, the additional gate dielectrics 1120, of FIGS. 33 and 34 may be provided. Then, gate electrodes 122L, 122M, 122U, 132L, 132M, 132U, 142L, 142M, and 142U filling the empty spaces may be provided. As described above, the gate electrodes 122L, 122M, 122U, 132L, 132M, 132U, 142L, 142M, and 142U may be formed of, e.g., a conductive material such as TiN, W, or the like.

FIGS. 52 and 53 illustrate cross-sectional views of a modified example of a method of forming a three-dimensional semiconductor device according to an example embodiment.

Referring to FIG. 52, on a lower structure 110, a lowermost insulating layer 1112, a horizontal lower pattern 1168, a sacrificial layer 1114, and a lower insulating layer 116, substantially stacked, may be substantially provided. Then, by performing operations substantially the same as those of FIGS. 47 and 48, the stacked structure 150, the lower, intermediate, and upper sacrificial vertical structures 129a, 139a, and 149a of FIG. 48, the lower, intermediate, and upper sacrificial separation structures 129b, 139b, and 149b of FIG. 48, as well as the insulating patterns 152 may be provided. The lower sacrificial vertical structure 129a and the lower separation structure 129b may pass through the lowermost insulating layer 1112, a horizontal lower pattern 1168, a sacrificial layer 1114, and a lower insulating layer 116 to extend to the lower structure 110.

Referring to FIG. 53, the lower, intermediate, and upper sacrificial vertical structures 129a, 139a, 149a of FIG. 52 in through holes 128a, 138a, and 148a are removed to expose the lower structure 110. A gate dielectric 160 and a semiconductor layer 166, covering inner walls of the through holes 128a, 138a, and 148a, are sequentially provided. A core pattern 168 having vertical buffer portions 170 therein while filling the through holes 128a, 138a, and 148a is provided. After a portion of the core pattern is removed, a pad pattern 172 may be formed on a remaining core pattern 168.

Then, the lower, intermediate, and upper sacrificial separation structures 129b, 139b, and 149b of FIG. 48 in through trenches 128b, 138b, and 148b are removed, thereby exposing the lower structure 110.

Using the structure formed as described above, semiconductor devices of various examples described above may be provided. For example, referring to FIGS. 39 and 40, together with FIG. 53, a gate dielectric layer 166, exposed while the sacrificial layer 1114 is removed, is removed to expose a semiconductor layer 166, and an upper horizontal pattern 1160 of FIGS. 39 and 40 may be formed in a space from which the sacrificial layer 1114 is removed. Then, separation structures 1192 may be formed in through trenches 128b, 138b, and 148b. In a modified example, referring to FIGS. 44A and 44B, together with FIG. 53, gate electrodes 122L, 122M, 122U, 132L, 132M, 132U, 142L, 142M, and 142U as well as the horizontal lower pattern 1168, in the stacked structure 150, are removed to provide empty spaces, the additional gate dielectrics 1120 as illustrated in FIGS. 44A and 44B are formed in the empty spaces, and gate electrodes 122L, 122M, 122U, 132L, 132M, 132U, 142L, 142M, and 142U, as well as a horizontal lower pattern 1168, filling the empty spaces, may be provided again. Then, an additional gate dielectric 1120 and a gate dielectric 160, exposed while the sacrificial layer 1114 is removed, are removed, thereby exposing the horizontal lower pattern 1168 and the semiconductor layer 166. In a space from which the sacrificial layer 1114 is removed, an upper horizontal pattern 1460 as illustrated in FIGS. 44A and 44B may be provided.

The vertical structure 188, which may be formed in the stacked structure 150 including a plurality of groups 120, 130, and 140 as described above, may include the buffer portion 170. The buffer portion 170 may prevent or significantly reduce a defect such as cracking in the vertical semiconductor layer 166v1 in the vertical structure 188. Thus, reliability and durability of the semiconductor device may be improved.

Each of the plurality of groups 120, 130, and 140 as described above may include a plurality of gate electrodes. As the number of the plurality of groups 120, 130, and 140 is increased, the stacking number of gate electrodes may be increased. Thus, a degree of integration of the semiconductor device may be improved.

As described above, embodiments relate to a three-dimensional semiconductor device including stacked gate electrodes. According to example embodiments, a three-dimensional semiconductor device with an improved degree of integration may be provided.

Example embodiments have been disclosed herein, and although specific terms are employed, they are used and are to be interpreted in a generic and descriptive sense only and not for purpose of limitation. In some instances, as would be apparent to one of ordinary skill in the art of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor device, comprising:
    a lower structure;
    a stacked structure on the lower structure;
    a horizontal structure between the lower structure and the stacked structure; and
    a vertical structure passing through the stacked structure and the horizontal structure,
    wherein the stacked structure includes:
    a lower group including lower gate electrodes stacked and spaced apart from each other in a vertical direction, the vertical direction being a direction perpendicular to an upper surface of the lower structure, and
    an upper group including upper gate electrodes stacked and spaced apart from each other in the vertical direction,
    wherein the lower group and the upper group are stacked in the vertical direction;
    wherein the vertical structure includes an insulating pattern, one or more voids in the insulating pattern, a semiconductor layer on at least an outer side surface of the insulating pattern, and a dielectric structure on an outer side surface of the semiconductor layer,
    wherein the dielectric structure includes a first dielectric layer, a second dielectric layer, and a data storage layer between the first dielectric layer and the second dielectric layer,
    wherein the horizontal structure includes a horizontal lower pattern and a horizontal upper pattern on the horizontal lower pattern, and
    wherein one of the horizontal upper pattern and the horizontal lower pattern divides the dielectric structure into a first portion and a second portion, and contacts the semiconductor layer.

2. The three-dimensional semiconductor device as claimed in claim 1, wherein the vertical structure includes a lower vertical region passing through the lower group and an upper vertical region passing through the upper group,
    wherein a lower region of the upper vertical region adjacent to the lower vertical region includes a first sidewall,
    wherein an upper region of the lower vertical region adjacent to the upper vertical region includes a second sidewall, and
    wherein the first sidewall is not aligned with the second sidewall in the vertical direction.

3. The three-dimensional semiconductor device as claimed in claim 1, wherein the vertical structure includes a lower vertical region passing through the lower group and an upper vertical region passing through the upper group, and
    wherein an upper region of the lower vertical region adjacent to the upper vertical region has a width greater than a width of a lower region of the upper vertical region adjacent to the lower vertical region.

4. The three-dimensional semiconductor device as claimed in claim 1, wherein the one of the horizontal upper pattern and the horizontal lower pattern is formed of polysilicon.

5. The three-dimensional semiconductor device as claimed in claim 1, wherein the one of the horizontal upper pattern and the horizontal lower pattern contacts the outer side surface of the semiconductor layer.

6. The three-dimensional semiconductor device as claimed in claim 1, wherein the first portion of the dielectric structure is at a higher level than the second portion of the dielectric structure,
    wherein the semiconductor layer is spaced apart from the lower structure, and
    wherein the second portion of the dielectric structure includes a portion between the semiconductor layer and the lower structure.

7. The three-dimensional semiconductor device as claimed in claim 1, wherein the vertical structure further includes a pad pattern on the insulating pattern and in contact with the semiconductor layer.

8. The three-dimensional semiconductor device as claimed in claim 7, wherein the pad pattern includes polysilicon.

9. The three-dimensional semiconductor device as claimed in claim 1, wherein the lower structure includes a semiconductor substrate, a peripheral circuit structure on the semiconductor substrate, and a base on the peripheral circuit structure, and
    wherein the base includes a polysilicon layer.

10. The three-dimensional semiconductor device as claimed in claim 1, further comprising a separation structure passing through the stacked structure and the horizontal structure,
    wherein at least one of the horizontal upper pattern or the horizontal lower pattern includes a side surface contacting a side surface of the separation structure.

11. The three-dimensional semiconductor device as claimed in claim 10, wherein the separation structure has a line shape in a plan view.

12. A three-dimensional semiconductor device, comprising:
    a lower structure;
    a stacked structure on the lower structure;
    a horizontal structure between the lower structure and the stacked structure; and
    a vertical structure passing through the stacked structure and the horizontal structure, wherein the stacked structure includes:
    a lower group including lower gate electrodes stacked and spaced apart from each other in a vertical direction, the vertical direction being a direction perpendicular to an upper surface of the lower structure, and an upper group including upper gate electrodes stacked and spaced apart from each other in the vertical direction, wherein the lower group and the upper group are stacked in the vertical direction;

wherein the vertical structure includes an insulating pattern, a void in the insulating pattern, a semiconductor layer on at least an outer side surface of the insulating pattern, and a dielectric structure on an outer side surface of the semiconductor layer, wherein a sidewall of the vertical structure includes a bending portion between a lowermost gate electrode among the upper gate electrodes and an uppermost gate electrode among the lower gate electrodes, wherein the void is at a lower level than the lowermost gate electrode among the upper gate electrodes, and wherein the dielectric structure includes a first dielectric layer, a second dielectric layer, and a data storage layer between the first dielectric layer and the second dielectric layer.

13. The three-dimensional semiconductor device as claimed in claim 12, wherein a distance between the lower structure and a center of the void is greater than a distance between the lowermost gate electrode among the upper gate electrodes and the center of the void.

14. The three-dimensional semiconductor device as claimed in claim 12, wherein the horizontal structure includes a horizontal lower pattern and a horizontal upper pattern on the horizontal lower pattern, and wherein one of the horizontal upper pattern and the horizontal lower pattern divides the dielectric structure into a first portion and a second portion, and contacts the semiconductor layer.

15. The three-dimensional semiconductor device as claimed in claim 14, wherein the one of the horizontal upper pattern and the horizontal lower pattern is formed of polysilicon.

16. The three-dimensional semiconductor device as claimed in claim 14, wherein the one of the horizontal upper pattern and the horizontal lower pattern contacts the outer side surface of the semiconductor layer.

17. The three-dimensional semiconductor device as claimed in claim 12, wherein the lower structure includes a semiconductor substrate, a peripheral circuit structure on the semiconductor substrate, and a base on the peripheral circuit structure, and wherein the base includes a polysilicon layer.

18. The three-dimensional semiconductor device as claimed in claim 12, further comprising a separation structure passing through the stacked structure and the horizontal structure, wherein the separation structure includes a side surface contacting a side surface of the separation structure.

19. A three-dimensional semiconductor device, comprising:

a lower structure;

a horizontal structure on the lower structure;

a stacked structure on the horizontal structure, the stacked structure including a plurality of groups stacked in a vertical direction, each of the plurality of groups including gate electrodes stacked and spaced apart from each other in the vertical direction, the vertical direction being a direction perpendicular to an upper surface of the lower structure;

a separation structure passing through the stacked structure and the horizontal structure; and a vertical structure passing through the stacked structure and the horizontal structure, wherein each of the groups includes gate electrodes and interlayer insulating layers, alternately and repeatedly stacked, wherein the vertical structure includes an insulating pattern, one or more first voids in the insulating pattern, a semiconductor layer on at least an outer side surface of the insulating pattern, and a dielectric structure on an outer side surface of the semiconductor layer, wherein the dielectric structure includes a first dielectric layer, a second dielectric layer, and a data storage layer between the first dielectric layer and the second dielectric layer, and wherein at least a portion of the horizontal structure includes a first side surface contacting the semiconductor layer and a second side surface contacting the separation structure.

20. The three-dimensional semiconductor device as claimed in claim 19, wherein the horizontal structure includes a horizontal lower pattern and a horizontal upper pattern on the horizontal lower pattern, wherein one of the horizontal upper pattern and the horizontal lower pattern divides the dielectric structure into a first portion and a second portion, and contacts the semiconductor layer, wherein the one of the horizontal upper pattern and the horizontal lower pattern is formed of polysilicon, and wherein the separation structure includes a core pattern and one or more second voids in the core pattern.

* * * * *